United States Patent
Iwata et al.

(10) Patent No.: US 7,978,515 B2
(45) Date of Patent: Jul. 12, 2011

(54) SEMICONDUCTOR STORAGE DEVICE AND ELECTRONIC EQUIPMENT THEREFOR

(75) Inventors: Hiroshi Iwata, Nara-ken (JP); Yoshiji Ohta, Kasiwara (JP)

(73) Assignee: Sharp Kabushiki Kaisha, Osaka (JP)

( * ) Notice: Subject to any disclaimer, the term of this patent is extended or adjusted under 35 U.S.C. 154(b) by 362 days.

(21) Appl. No.: 12/052,335

(22) Filed: Mar. 20, 2008

(65) Prior Publication Data

US 2008/0247232 A1    Oct. 9, 2008

(30) Foreign Application Priority Data

Mar. 23, 2007  (JP) ................................ 2007-076589
Mar. 27, 2007  (JP) ................................ 2007-080791
Apr. 27, 2007  (JP) ................................ 2007-118323
May 11, 2007  (JP) ................................ 2007-126727

(51) Int. Cl.
    *G11C 11/34* (2006.01)

(52) U.S. Cl. .......... 365/185.05; 365/185.06; 365/185.07

(58) Field of Classification Search ............. 365/185.05, 365/185.06, 185.07
    See application file for complete search history.

(56) References Cited

U.S. PATENT DOCUMENTS

| | | | |
|---|---|---|---|
| 4,807,188 A | 2/1989 | Casagrande | |
| 5,067,111 A | 11/1991 | Asano et al. | |
| 5,400,279 A * | 3/1995 | Momodomi et al. | .... 365/185.17 |
| 5,559,737 A | 9/1996 | Tanaka et al. | |
| 5,848,009 A | 12/1998 | Lee et al. | |
| 6,002,610 A | 12/1999 | Cong et al. | |
| 6,272,044 B2 | 8/2001 | Yamamoto et al. | |
| 6,320,802 B1 | 11/2001 | Ohbayashi et al. | |
| 6,621,734 B2 | 9/2003 | Hamaguchi et al. | |
| 6,912,160 B2 | 6/2005 | Yamada et al. | |
| 7,339,813 B2 | 3/2008 | Hsu | |
| 7,535,259 B2 * | 5/2009 | Osame et al. | ................. 326/104 |
| 2003/0075745 A1 | 4/2003 | Maeda et al. | |
| 2003/0075746 A1 | 4/2003 | Maeda et al. | |

FOREIGN PATENT DOCUMENTS

| | | |
|---|---|---|
| JP | 1-196798 A | 8/1989 |
| JP | 2-66798 A | 3/1990 |
| JP | 2-192099 A | 7/1990 |
| JP | 2-226597 A | 9/1990 |
| JP | 4-67396 A | 3/1992 |
| JP | 5-028781 A | 2/1993 |
| JP | 9-35490 A | 2/1997 |
| JP | 10-125093 A | 5/1998 |
| JP | 11-345496 A | 12/1999 |
| JP | 2000-200496 A | 7/2000 |
| JP | 3098012 B2 | 8/2000 |
| JP | 2001-273783 A | 10/2001 |
| JP | 2002-074979 A | 3/2002 |

(Continued)

*Primary Examiner* — Son T Dinh
*Assistant Examiner* — Nam T Nguyen
(74) *Attorney, Agent, or Firm* — Birch, Stewart, Kolasch & Birch, LLP

(57) ABSTRACT

A semiconductor storage device includes a first memory cell for storing two kinds of states, a second memory cell for storing two kinds of states, and a sense amplifier for detecting a potential difference between voltages equivalent to readout currents of the first and second memory cells, respectively. Either one of information data "0" or data "1", which is stored in combination of the first and second memory cells, is read out by detecting the potential difference equivalent to the readout current difference between the first and second memory cells.

18 Claims, 54 Drawing Sheets

FOREIGN PATENT DOCUMENTS

| JP | 2002-358794 A | 12/2002 |
| JP | 2003-203994 A | 7/2003 |
| JP | 2004-273093 A | 9/2004 |
| JP | 2006-107700 A | 4/2006 |

* cited by examiner

Fig. 31

| p | q | r | p+q+r | I8(0) | I8(1) | I8(0)/I8(1) | I8(0)-I8(1) | W(e-p) |
|---|---|---|---|---|---|---|---|---|
| 1 | 1 | 1 | 3 | 26.66667 | 6.666667 | 4 | 20 | 2.581989 |
| 1 | 1 | 2 | 4 | 20 | 4 | 5 | 16 | 2.472136 |
| 1 | 2 | 1 | 4 | 53.33333 | 13.33333 | 4 | 40 | 3.651484 |
| 2 | 1 | 1 | 4 | 32 | 10 | 3.2 | 22 | 2.494577 |
| 1 | 1 | 3 | 5 | 16 | 2.857143 | 5.6 | 13.14286 | 2.309691 |
| 1 | 3 | 1 | 5 | 80 | 20 | 4 | 60 | 4.472136 |
| 3 | 1 | 1 | 5 | 34.28571 | 12 | 2.857143 | 22.28571 | 2.391299 |
| 1 | 2 | 2 | 5 | 40 | 8 | 5 | 32 | 3.496128 |
| 2 | 1 | 2 | 5 | 26.66667 | 6.666667 | 4 | 20 | 2.581989 |
| 2 | 2 | 1 | 5 | 64 | 20 | 3.2 | 44 | 3.527864 |
| 1 | 1 | 4 | 6 | 13.33333 | 2.222222 | 6 | 11.11111 | 2.160772 |
| 1 | 4 | 1 | 6 | 106.6667 | 26.66667 | 4 | 80 | 5.163978 |
| 4 | 1 | 1 | 6 | 35.55556 | 13.33333 | 2.666667 | 22.22222 | 2.311364 |
| 1 | 2 | 3 | 6 | 32 | 5.714286 | 5.6 | 26.28571 | 3.266397 |
| 1 | 3 | 2 | 6 | 60 | 12 | 5 | 48 | 4.281865 |
| 2 | 1 | 3 | 6 | 22.85714 | 5 | 4.571429 | 17.85714 | 2.544846 |
| 2 | 3 | 1 | 6 | 96 | 30 | 3.2 | 66 | 4.320733 |
| 3 | 1 | 2 | 6 | 30 | 8.571429 | 3.5 | 21.42857 | 2.549525 |
| 3 | 2 | 1 | 6 | 68.57143 | 24 | 2.857143 | 44.57143 | 3.381807 |
| 1 | 1 | 5 | 7 | 11.42857 | 1.818182 | 6.285714 | 9.61039 | 2.032217 |
| 1 | 5 | 1 | 7 | 133.3333 | 33.33333 | 4 | 100 | 5.773503 |
| 5 | 1 | 1 | 7 | 36.36364 | 14.28571 | 2.545455 | 22.07792 | 2.250582 |
| 1 | 2 | 4 | 7 | 26.66667 | 4.444444 | 6 | 22.22222 | 3.055793 |
| 1 | 4 | 2 | 7 | 80 | 16 | 5 | 64 | 4.944272 |
| 2 | 1 | 4 | 7 | 20 | 4 | 5 | 16 | 2.472136 |
| 2 | 4 | 1 | 7 | 128 | 40 | 3.2 | 88 | 4.989153 |
| 4 | 1 | 2 | 7 | 32 | 10 | 3.2 | 22 | 2.494577 |
| 4 | 2 | 1 | 7 | 71.11111 | 26.66667 | 2.666667 | 44.44444 | 3.268763 |
| 1 | 3 | 3 | 7 | 48 | 8.571429 | 5.6 | 39.42857 | 4.000503 |
| 3 | 1 | 3 | 7 | 26.66667 | 6.666667 | 4 | 20 | 2.581989 |
| 3 | 3 | 1 | 7 | 102.8571 | 36 | 2.857143 | 66.85714 | 4.141851 |
| 2 | 2 | 3 | 7 | 45.71429 | 10 | 4.571429 | 35.71429 | 3.598956 |
| 2 | 3 | 2 | 7 | 80 | 20 | 4 | 60 | 4.472136 |
| 3 | 2 | 2 | 7 | 60 | 17.14286 | 3.5 | 42.85714 | 3.605573 |

Fig. 32A

| p | q | r | p+q+r | I8(0) 3201fail | I8(0) 3202fail | I8(1) 3201fail | I8(1) 3202fail | I8(0)/I8(1) | I8(0)−I8(1) | W(e−p) |
|---|---|---|---|---|---|---|---|---|---|---|
| 2 | 2 | 2 | 6 | 40 | 26.66667 | 8 | 5.714286 | 1.333333 | 6.666667 | 0.691842 |
| 2 | 3 | 2 | 7 | 32 | 22.85714 | 5.714286 | 13.33333 | 1.714286 | 9.52381 | 1.129431 |
| 2 | 2 | 3 | 7 | 60 | 53.33333 | 13.33333 | 12 | 1.777778 | 23.33333 | 1.825742 |
| 3 | 2 | 2 | 7 | 53.33333 | 30 | 8.571429 | | 1.25 | 6 | 0.578246 |
| 2 | 4 | 2 | 8 | 26.66667 | 20 | 4.444444 | | | 10 | 1.309858 |
| 2 | 2 | 4 | 8 | 80 | 128 | 16 | | 2 | 40 | 2.619717 |
| 4 | 2 | 2 | 8 | 60 | 32 | 20 | 17.14286 | 1.2 | 5.333333 | 0.492876 |
| 3 | 3 | 2 | 8 | 48 | 45.71429 | 10 | 8.571429 | 2.285714 | 25.71429 | 2.289098 |
| 2 | 3 | 3 | 8 | 45.71429 | 26.66667 | 6.666667 | 10 | 1.555556 | 9.52381 | 1.023584 |
| 3 | 2 | 3 | 8 | 80 | 60 | 17.14286 | 17.14286 | 1.666667 | 24 | 1.745967 |
| 2 | 5 | 2 | 9 | 22.85714 | 17.77778 | 3.636364 | 3.333333 | 2.222222 | 9.777778 | 1.387943 |
| 2 | 2 | 5 | 9 | 100 | 160 | 20 | 26.66667 | 2 | 50 | 2.928932 |
| 5 | 2 | 2 | 9 | 64 | 33.33333 | 20 | 11.11111 | 1.166667 | 4.761905 | 0.428278 |
| 2 | 3 | 4 | 9 | 40 | 72.72727 | 20 | 28.57143 | 1.166667 | 4.761905 | 2.451572 |
| 3 | 2 | 4 | 9 | 40 | 40 | 6.666667 | 8 | 2.666667 | 25 | 2.836022 |
| 4 | 2 | 3 | 9 | 64 | 68.57143 | 11.42857 | 15 | 2.4 | 37.33333 | 1.247496 |
| 2 | 4 | 3 | 9 | 68.57143 | 106.6667 | 6.666667 | 26.66667 | 1.8 | 10.66667 | 2.55863 |
| 4 | 3 | 2 | 9 | 40 | 24 | 8 | 13.33333 | 1.375 | 42 | 0.921463 |
| 3 | 4 | 2 | 9 | 106.6667 | 90 | 25.71429 | 5.454545 | 1.454545 | 9.090909 | 1.675445 |
| 4 | 4 | 2 | 10 | 53.33333 | 29.09091 | 8 | 25.71429 | 1.454545 | 24 | 2.232042 |
| 4 | 2 | 4 | 10 | 68.57143 | 64 | 20 | 13.33333 | 2.074074 | 27.61905 | 1.418011 |
| 2 | 4 | 4 | 10 | 53.33333 | 106.6667 | 20 | 25.71429 | 2.4 | 9.333333 | 3.208484 |
| 2 | 2 | 6 | 10 | 20 | 90 | 15 | 6.666667 | 2 | 60 | 0.378175 |
| 6 | 2 | 2 | 10 | 16 | 35.55556 | 3.076923 | 2.857143 | 1.142857 | 4.285714 | 2.391299 |
| 2 | 6 | 2 | 10 | 120 | 192 | 24 | 33.33333 | 2.857143 | 22.28571 | 3.170769 |
| 2 | 5 | 3 | 10 | 66.66667 | 73.84615 | 22.22222 | 12 | 2.4 | 46.66667 | 1.388102 |
| 3 | 2 | 5 | 10 | 34.28571 | 35.55556 | 5.454545 | 6.666667 | 2 | 10.90909 | 3.208484 |
| 3 | 5 | 2 | 10 | 80 | 91.42857 | 14.28571 | 20 | 2 | 60 | 0.832957 |
| 2 | 3 | 5 | 10 | 35.55556 | 133.3333 | 6.666667 | 4.615385 | 1.384615 | 8.547009 | 1.618429 |
| 5 | 3 | 2 | 10 | 133.3333 | 48 | 33.33333 | 34.28571 | 1.555556 | 23.80952 | 2.830831 |
| 5 | 2 | 3 | 10 | 58.18182 | 120 | 16 | 9.090909 | 2.666667 | 33.33333 | 1.163978 |
| 4 | 2 | 4 | 10 | 96 | 171.4286 | 30 | 22.22222 | 42.85714 | 33.33333 | |
| 2 | 4 | 4 | 10 | 53.33333 | 66.66667 | 8.888889 | 12 | 2.666667 | 16 | |
| 4 | 4 | 2 | 10 | 48 | 26.66667 | 10.90909 | 6.666667 | 1.666667 | 10.66667 | 1.163978 |
| 2 | 7 | 2 | 11 | 17.77778 | 14.54545 | 34.28571 | 30 | 1.8 | 42.66667 | 2.494992 |
| 2 | 2 | 7 | 11 | 140 | 160 | 2.666667 | 2.5 | 2.545455 | 8.831169 | 1.423393 |
| 7 | 2 | 2 | 11 | 68.57143 | 35 | 28 | 40 | 2 | 70 | 3.465559 |
| 2 | 3 | 6 | 11 | 30 | 60 | 24 | 12.72727 | 1.125 | 3.888889 | 0.338346 |
| 2 | 6 | 3 | 11 | 48 | 91.42857 | 4.615385 | 5.714286 | 3 | 20 | 2.314948 |
| 3 | 6 | 2 | 11 | 96 | 114.2857 | 17.14286 | 10 | 2.4 | 56 | 3.473404 |
| 3 | 2 | 6 | 11 | 32 | 20 | 5.714286 | 25 | 2.166667 | 10.76923 | 1.433918 |
| 6 | 3 | 2 | 11 | 160 | 43.63636 | 4 | 9.230769 | 2.166667 | 10.76923 | 1.433918 |
| 3 | 6 | 2 | 11 | 160 | 205.7143 | 40 | 42.85714 | 2.083333 | 78 | 3.762167 |

Fig. 32B

| p | q | r | p+q+r | 18(0) 3200fail | 18(0) 3201fail | 18(0) 3202fail | 18(1) 3200fail | 18(1) 3201fail | 18(1) 3202fail | 18(0)/18(1) | 18(0)-18(1) | W(e-p) |
|---|---|---|---|---|---|---|---|---|---|---|---|---|
| 6 | 2 | 3 | 11 | 61.53846 | 32 | 68.57143 | 18.18182 | 10 | 24 | 1.333333 | 8 | 0.757875 |
| 6 | 3 | 2 | 11 | 100 | 68.57143 | 110.7692 | 33.33333 | 24 | 45 | 1.52381 | 23.57143 | 1.572583 |
| 2 | 4 | 5 | 11 | 45.71429 | 53.33333 | 80 | 7.272727 | 10 | 16 | 2.857143 | 29.71429 | 2.761234 |
| 2 | 5 | 4 | 11 | 66.66667 | 80 | 114.2857 | 11.11111 | 16 | 25 | 2.666667 | 41.66667 | 3.164966 |
| 4 | 2 | 5 | 11 | 43.63636 | 24.61538 | 53.33333 | 9.230769 | 5.714286 | 13.33333 | 1.846154 | 11.28205 | 1.309906 |
| 4 | 5 | 2 | 11 | 150 | 128 | 177.7778 | 42.85714 | 40 | 66.66667 | 1.92 | 61.33333 | 3.148743 |
| 5 | 2 | 4 | 11 | 53.33333 | 28.57143 | 61.53846 | 13.33333 | 7.692308 | 18.18182 | 1.571429 | 10.38961 | 1.081211 |
| 5 | 4 | 2 | 11 | 100 | 100 | 145.4545 | 40 | 33.33333 | 57.14286 | 1.75 | 42.85714 | 2.440711 |
| 3 | 4 | 4 | 11 | 80 | 72 | 106.6667 | 16.36364 | 13.33333 | 26.66667 | 2.7 | 45.33333 | 3.321304 |
| 4 | 4 | 3 | 11 | 72 | 53.33333 | 87.27273 | 16.36364 | 13.33333 | 24 | 2.222222 | 29.33333 | 2.403988 |
| 4 | 3 | 4 | 11 | 106.6667 | 87.27273 | 128 | 26.66667 | 16.36364 | 40 | 2.181818 | 47.27273 | 3.017432 |
| 2 | 4 | 8 | 11 | 16 | 13.33333 | 29.09091 | 2.352941 | 2.222222 | 5 | 2.666667 | 8.333333 | 1.415416 |
| 2 | 8 | 4 | 11 | 160 | 186.6667 | 256 | 32 | 46.66667 | 80 | 2 | 80 | 3.704839 |
| 8 | 2 | 2 | 12 | 64 | 32.94118 | 75.29412 | 25.45455 | 13.33333 | 32 | 1.111111 | 3.555556 | 0.305994 |
| 2 | 3 | 7 | 12 | 26.66667 | 29.09091 | 48 | 4 | 5 | 8.571429 | 3.111111 | 18.09524 | 2.236278 |
| 2 | 7 | 3 | 12 | 112 | 137.1429 | 186.6667 | 20 | 30 | 46.66667 | 2.4 | 65.33333 | 3.751705 |
| 3 | 2 | 7 | 12 | 29.09091 | 18.46154 | 46.66667 | 5 | 3.529412 | 8 | 2.307692 | 10.46154 | 1.468262 |
| 3 | 7 | 2 | 12 | 186.6667 | 180 | 240 | 46.66667 | 51.42857 | 84 | 2.142857 | 96 | 4.251256 |
| 7 | 2 | 3 | 12 | 64 | 48 | 112 | 36 | 25.45455 | 46.66667 | 1.294118 | 7.486631 | 0.694191 |
| 7 | 3 | 2 | 12 | 102.8571 | 71.11111 | 137.1429 | 20 | 10.76923 | 25.45455 | 1.5 | 23.33333 | 1.5353 |
| 2 | 4 | 6 | 12 | 40 | 26.66667 | 57.14286 | 6.153846 | 6.666667 | 15.38462 | 3 | 26.66667 | 2.673072 |
| 2 | 6 | 4 | 12 | 80 | 100 | 181.8182 | 11.42857 | 44.44444 | 71.42857 | 1.866667 | 50 | 3.467046 |
| 4 | 2 | 6 | 12 | 40 | 40 | 65.45455 | 8.571429 | 8.571429 | 13.84615 | 2.888889 | 11.42857 | 1.400297 |
| 4 | 6 | 2 | 12 | 137.1429 | 133.3333 | 180 | 27.27273 | 33.33333 | 51.42857 | 2.592593 | 81.90476 | 4.375634 |
| 6 | 2 | 4 | 12 | 92.30769 | 64 | 102.8571 | 13.33333 | 20 | 30 | 1.777778 | 28 | 2 |
| 6 | 4 | 2 | 12 | 57.14286 | 30 | 213.3333 | 51.42857 | 8 | 36 | 3 | 43.63636 | 3.704839 |
| 2 | 5 | 5 | 12 | 133.3333 | 102.8571 | 147.6923 | 44.44444 | 36 | 60 | 1.714286 | 42.85714 | 2.395884 |
| 5 | 2 | 5 | 12 | 57.14286 | 71.11111 | 100 | 9.090909 | 13.33333 | 20 | 2.857143 | 37.14286 | 3.087154 |
| 5 | 5 | 2 | 12 | 49.23077 | 26.66667 | 57.14286 | 11.42857 | 6.666667 | 15.38462 | 1.733333 | 11.28205 | 1.241655 |
| 3 | 3 | 6 | 12 | 160 | 133.3333 | 181.8182 | 50 | 44.44444 | 71.42857 | 1.866667 | 61.90476 | 3.095463 |
| 3 | 6 | 3 | 12 | 48 | 40 | 65.45455 | 8.571429 | 8 | 13.84615 | 2.888889 | 26.15385 | 2.603513 |
| 6 | 3 | 3 | 12 | 137.1429 | 133.3333 | 180 | 27.27273 | 30 | 51.42857 | 2.592593 | 81.90476 | 4.375634 |
| 3 | 4 | 5 | 12 | 92.30769 | 64 | 102.8571 | 13.33333 | 20 | 30 | 1.777778 | 28 | 2 |
| 3 | 5 | 4 | 12 | 71.11111 | 65.45455 | 96 | 13.84615 | 21.81818 | 33.33333 | 1.714286 | 43.63636 | 3.419405 |
| 4 | 3 | 5 | 12 | 100 | 49.23077 | 133.3333 | 20 | 21.81818 | 33.33333 | 2.88 | 62.66667 | 4.024456 |
| 4 | 5 | 3 | 12 | 65.45455 | 116.3636 | 80 | 13.84615 | 11.42857 | 20 | 2.461538 | 29.23077 | 2.544328 |
| 5 | 3 | 4 | 12 | 133.3333 | 49.23077 | 160 | 33.33333 | 15.38462 | 50 | 2.327273 | 66.36364 | 3.71613 |
| 5 | 4 | 3 | 12 | 80 | 57.14286 | 92.30769 | 20 | 27.27273 | 50 | 2.095238 | 29.87013 | 2.33696 |
| 5 | 4 | 3 | 12 | 116.3636 | 92.30769 | 133.3333 | 32 | 27.27273 | 44.44444 | 2.076923 | 47.86325 | 2.941023 |

Fig. 33A

| p | q | r | p+q+r | 18(0) 3200fail | 18(0) 3201fail | 18(0) 3202fail | 18(1) 3200fail | 18(1) 3201fail | 18(1) 3202fail | 18(0)/18(1) | 18(0)-18(1) | W(e-p) |
|---|---|---|---|---|---|---|---|---|---|---|---|---|
| 2 | 2 | 2 | 6 | 53.33333 | 53.33333 | 45.71429 | 17.14286 | 20 | 16 | 2.285714 | 25.71429 | 2.289098 |
| 2 | 2 | 3 | 7 | 45.71429 | 45.71429 | 40 | 13.33333 | 15 | 11.42857 | 2.666667 | 25 | 2.451572 |
| 2 | 3 | 2 | 7 | | | 68.57143 | 25.71429 | 26.66667 | 24 | 2.571429 | 41.90476 | 3.116809 |
| 3 | 2 | 2 | 7 | 80 | 80 | 53.33333 | 20 | 25.71429 | 20 | 2.074074 | 27.61905 | 2.232042 |
| 2 | 2 | 4 | 8 | 60 | 60 | 40 | 10.90909 | 12 | 8.888889 | 2.962963 | 23.55556 | 2.498746 |
| 2 | 4 | 2 | 8 | 40 | 40 | 35.55556 | 34.28571 | 33.33333 | 32 | 2.666667 | 57.14286 | 3.706428 |
| 4 | 2 | 2 | 8 | 106.6667 | 106.6667 | 91.42857 | 30 | | 22.85714 | 1.939394 | 28.18182 | 2.150475 |
| 2 | 3 | 3 | 8 | 64 | 64 | 58.18182 | 22.22222 | 33.33333 | 30 | 2.666667 | | 3.273831 |
| 3 | 2 | 3 | 8 | 68.57143 | 68.57143 | 60 | 20 | 20 | 17.14286 | | 40 | 2.456067 |
| 3 | 3 | 2 | 8 | 53.33333 | 53.33333 | 48 | 16 | 20 | 15 | 2.4 | | 3.088871 |
| 2 | 2 | 5 | 9 | 90 | 90 | 80 | 30 | 34.28571 | 30 | 2.333333 | 45.71429 | 2.494577 |
| 2 | 5 | 2 | 9 | 35.55556 | 35.55556 | 32 | 9.230769 | 10 | 7.272727 | 3.2 | 22 | 4.143913 |
| 5 | 2 | 2 | 9 | 133.3333 | 133.3333 | 114.2857 | 42.85714 | 40 | 40 | 2.666667 | 71.42857 | 2.071143 |
| 2 | 2 | 4 | 9 | 66.6667 | 66.6667 | 61.53846 | 24 | | 25 | 1.846154 | 28.20513 | 3.257768 |
| 2 | 4 | 3 | 9 | 60 | 60 | 53.33333 | 16.36364 | 33.33333 | 16 | 3.259259 | 36.9697 | 3.780294 |
| 4 | 2 | 3 | 9 | 91.42857 | 91.42857 | 80 | 26.66667 | | 25 | 3 | 53.33333 | 2.560583 |
| 3 | 4 | 2 | 9 | 48 | 48 | 43.63636 | 13.33333 | 16.36364 | 12 | 2.666667 | 27.27273 | 3.781419 |
| 4 | 3 | 2 | 9 | 120 | 120 | 106.6667 | 40 | 42.85714 | 40 | 2.488889 | 63.80952 | 2.403988 |
| 3 | 3 | 3 | 9 | 58.18182 | 58.18182 | 53.33333 | 18.18182 | 24 | 17.77778 | 2.222222 | 29.33333 | 3.017432 |
| 4 | 4 | 3 | 9 | 96 | 96 | 87.27273 | 33.33333 | 40 | 34.28571 | 2.181818 | 47.27273 | 3.321304 |
| 3 | 3 | 3 | 9 | 80 | 80 | 72 | 24 | 26.66667 | 22.5 | 2.7 | 45.33333 | 2.465899 |
| 2 | 2 | 6 | 10 | 32 | 32 | 29.09091 | 8 | 8.571429 | 6.153846 | 3.393939 | 20.51948 | 4.539429 |
| 2 | 6 | 2 | 10 | 160 | 160 | 137.1429 | 51.42857 | 46.66667 | 48 | 2.666667 | 85.71429 | 2 |
| 6 | 2 | 2 | 10 | 68.57143 | 68.57143 | 64 | 25.45455 | 36 | 26.66667 | 1.777778 | 28 | 3.207161 |
| 2 | 3 | 5 | 10 | 53.33333 | 53.33333 | 48 | 13.84615 | 30 | 10.90909 | 3.466667 | 34.15385 | 4.226497 |
| 3 | 5 | 2 | 10 | 114.2857 | 114.2857 | 100 | 33.33333 | 13.33333 | 28.57143 | 3 | 66.66667 | 2.603513 |
| 5 | 3 | 2 | 10 | 43.63636 | 43.63636 | 40 | 11.42857 | 13.84615 | 10 | 2.888889 | 26.15385 | 4.375634 |
| 2 | 5 | 3 | 10 | 150 | 150 | 133.3333 | 50 | 51.42857 | 50 | 2.592593 | 81.90476 | 2.33696 |
| 3 | 2 | 5 | 10 | 61.53846 | 61.53846 | 57.14286 | 20 | 27.27273 | 20 | 2.095238 | 29.87013 | 2.941023 |
| 5 | 2 | 3 | 10 | 100 | 100 | 92.30769 | 36 | 44.44444 | 37.5 | 2.076923 | 47.86325 | 3.761747 |
| 2 | 4 | 4 | 10 | 80 | 80 | 71.11111 | 21.81818 | 20 | 17.77778 | 3.259259 | 49.29293 | 2.544328 |
| 4 | 2 | 4 | 10 | 128 | 128 | 116.3636 | 15.38462 | 50 | 14.54545 | 2.461538 | 29.23077 | 3.71613 |
| 4 | 4 | 2 | 10 | 53.33333 | 53.33333 | 49.23077 | 44.44444 | 27.27273 | 45.71429 | 2.327273 | 66.36364 | 2.425365 |
| 2 | 2 | 7 | 11 | 29.09091 | 29.09091 | 26.66667 | 7.058824 | 20 | 5.333333 | 3.555556 | 19.16667 | 4.903144 |
| 2 | 7 | 2 | 11 | 186.6667 | 186.6667 | 160 | 60 | 7.5 | 56 | 2.666667 | 100 | 1.937651 |
| 7 | 2 | 2 | 11 | 70 | 70 | 65.88235 | 26.66667 | 53.33333 | 28 | 1.72549 | 27.70053 | 3.141681 |
| 2 | 3 | 6 | 11 | 48 | 48 | 43.63636 | 12 | 38.18182 | 9.230769 | 3.636364 | 31.63636 | 4.629896 |
| 3 | 6 | 2 | 11 | 137.1429 | 137.1429 | 120 | 40 | 11.42857 | 34.28571 | 3 | 80 | 2.612335 |
| 6 | 2 | 3 | 11 | 40 | 40 | 36.92308 | 10 | 35 | 12 | 3.076923 | 24.92308 | 4.903144 |
| 3 | 2 | 6 | 11 | 180 | 180 | 160 | 60 | 60 | 60 | 2.666667 | 100 | 4.903144 |

Fig. 33B

| p | q | r | p+q+r | I8(0) 3200fail | I8(0) 3201fail | I8(0) 3202fail | I8(1) 3200fail | I8(1) 3201fail | I8(1) 3202fail | I8(0)/I8(1) | I8(0)−I8(1) | W(e−p) |
|---|---|---|---|---|---|---|---|---|---|---|---|---|
| 6 | 2 | 3 | 11 | 64 | 64 | 60 | 21.53846 | 30 | 21.81818 | 2 | 30 | 2.268741 |
| 6 | 3 | 2 | 11 | 102.8571 | 102.8571 | 96 | 38.18182 | 48 | 40 | 2 | 48 | 2.869756 |
| 2 | 4 | 5 | 11 | 71.11111 | 71.11111 | 64 | 18.46154 | 16.66667 | 14.54545 | 3.466667 | 45.53846 | 3.703311 |
| 2 | 5 | 4 | 11 | 100 | 100 | 88.88889 | 27.27273 | 24 | 22.22222 | 3.259259 | 61.61616 | 4.205761 |
| 4 | 2 | 5 | 11 | 49.23077 | 49.23077 | 45.71429 | 13.33333 | 17.14286 | 12.30769 | 2.666667 | 28.57143 | 2.620841 |
| 4 | 5 | 2 | 11 | 160 | 160 | 145.4545 | 55.55556 | 60 | 57.14286 | 2.424242 | 85.45455 | 4.314487 |
| 5 | 2 | 4 | 11 | 57.14286 | 57.14286 | 53.33333 | 17.14286 | 23.07692 | 16.66667 | 2.311111 | 30.25641 | 2.499123 |
| 5 | 4 | 2 | 11 | 133.3333 | 133.3333 | 123.0769 | 48 | 55.55556 | 50 | 2.215385 | 67.52137 | 3.640444 |
| 3 | 4 | 4 | 11 | 96 | 96 | 87.27273 | 26.66667 | 27.27273 | 24 | 3.2 | 60 | 4.119658 |
| 4 | 3 | 4 | 11 | 80 | 80 | 73.84615 | 23.07692 | 26.66667 | 21.81818 | 2.769231 | 47.17949 | 3.429401 |
| 4 | 4 | 3 | 11 | 116.3636 | 116.3636 | 106.6667 | 36.36364 | 40 | 35.55556 | 2.666667 | 66.66667 | 4.0034 |
| 2 | 2 | 8 | 12 | 26.66667 | 26.66667 | 24.61538 | 6.315789 | 6.666667 | 4.705882 | 3.692308 | 17.94872 | 2.3794 |
| 2 | 8 | 2 | 12 | 213.3333 | 213.3333 | 182.8571 | 68.57143 | 60 | 64 | 2.666667 | 114.2857 | 5.241681 |
| 2 | 3 | 7 | 12 | 71.11111 | 71.11111 | 67.36842 | 27.69231 | 40 | 29.09091 | 1.684211 | 27.36842 | 1.883271 |
| 2 | 7 | 3 | 12 | 43.63636 | 43.63636 | 40 | 10.58824 | 10 | 8 | 3.777778 | 29.41176 | 3.070598 |
| 3 | 2 | 7 | 12 | 160 | 160 | 140 | 46.66667 | 40 | 40 | 3 | 93.33333 | 5.000859 |
| 3 | 7 | 2 | 12 | 36.92308 | 36.92308 | 34.28571 | 8.888889 | 10.58824 | 7.5 | 3.238095 | 23.69748 | 2.601444 |
| 7 | 2 | 3 | 12 | 210 | 210 | 186.6667 | 70 | 70 | 70 | 2.666667 | 116.6667 | 5.296001 |
| 7 | 3 | 2 | 12 | 65.88235 | 65.88235 | 62.22222 | 22.85714 | 32.30769 | 23.33333 | 1.925926 | 29.91453 | 2.204121 |
| 2 | 4 | 6 | 12 | 105 | 105 | 98.82353 | 40 | 50.90909 | 42 | 1.941176 | 47.91444 | 2.805942 |
| 2 | 6 | 4 | 12 | 64 | 64 | 58.18182 | 16 | 14.28571 | 8 | 3.636364 | 47.18182 | 3.627701 |
| 4 | 2 | 6 | 12 | 120 | 120 | 106.6667 | 32.72727 | 28 | 26.66667 | 3.259259 | 73.93939 | 4.60718 |
| 4 | 6 | 2 | 12 | 45.71429 | 45.71429 | 42.66667 | 11.76471 | 15 | 10.66667 | 2.844444 | 27.66667 | 2.658989 |
| 6 | 2 | 4 | 12 | 120 | 120 | 109.0909 | 66.66667 | 70 | 68.57143 | 2.493506 | 104.5455 | 4.844965 |
| 6 | 4 | 2 | 12 | 60 | 60 | 56.47059 | 18.66667 | 20 | 18.46154 | 2.196078 | 30.75563 | 2.443766 |
| 2 | 4 | 6 | 12 | 137.1429 | 137.1429 | 128 | 50.90909 | 60 | 53.33333 | 2.133333 | 68 | 3.567742 |
| 6 | 5 | 2 | 12 | 88.88889 | 88.88889 | 80 | 23.07692 | 20 | 18.18182 | 3.466667 | 56.92308 | 4.140427 |
| 2 | 5 | 5 | 12 | 53.33333 | 53.33333 | 50 | 15 | 20 | 14.28571 | 3.272727 | 30 | 2.598932 |
| 3 | 3 | 6 | 12 | 166.6667 | 166.6667 | 153.8462 | 60 | 66.66667 | 62.5 | 2.307692 | 87.17949 | 4.238508 |
| 3 | 6 | 3 | 12 | 60 | 60 | 55.38462 | 15 | 16 | 12.85714 | 3.461538 | 39.38462 | 3.442084 |
| 6 | 3 | 3 | 12 | 96 | 96 | 144 | 48 | 46.66667 | 45 | 3 | 96 | 5.071797 |
| 3 | 4 | 5 | 12 | 87.27273 | 87.27273 | 80 | 22.85714 | 23.07692 | 20 | 2.25 | 50 | 3.162278 |
| 3 | 5 | 4 | 12 | 145.4545 | 145.4545 | 133.3333 | 45.45455 | 45.45455 | 44.44444 | 3.466667 | 56.92308 | 4.140427 |
| 4 | 3 | 5 | 12 | 73.84615 | 73.84615 | 68.57143 | 20 | 30 | 30 | 3.272727 | 75.75758 | 4.671157 |
| 4 | 5 | 3 | 12 | 85.71429 | 85.71429 | 80 | 25.71429 | 22.85714 | 18.46154 | 3 | 45.71429 | 3.499872 |
| 5 | 3 | 4 | 12 | 145.4545 | 145.4545 | 133.3333 | 48 | 48 | 44.44444 | 2.777778 | 85.33333 | 4.618802 |
| 5 | 4 | 3 | 12 | 85.71429 | 85.71429 | 80 | 30.76923 | 30.76923 | 25 | 2.6 | 49.23077 | 3.39727 |
| 5 | 4 | 3 | 12 | 123.0769 | 123.0769 | 114.2857 | 45.45455 | 45.45455 | 40 | 2.514286 | 68.83117 | 3.948451 |

SEMICONDUCTOR STORAGE DEVICE AND ELECTRONIC EQUIPMENT THEREFOR

CROSS-REFERENCE TO RELATED APPLICATIONS

This nonprovisional application claims priority under 35 U.S.C. §119(a) on Patent Application No. 2007-076589 filed in Japan on 23 Mar. 2007, No. 2007-080791 filed in Japan on 27 Mar. 2007, No. 2007-118323 filed in Japan on 27 Apr. 2007, and No. 2007-126727 filed in Japan on 11 May 2007, the entire contents of which are incorporated herein by reference.

BACKGROUND OF THE INVENTION

The present invention relates to semiconductor storage devices and electronic equipment. More particularly, the invention relates to semiconductor storage devices as well as electronic equipment using the semiconductor storage devices, which include nonvolatile memory cells such as flash memory cells having a function that allows information to be stored therein by utilizing changes in cell currents.

In recent years, nonvolatile semiconductor storage devices such as flash memories and ferroelectric memories have been widely used as semiconductor storage devices for data storage or code (program) storage in portable telephones, digital cameras or the like. It is also under consideration to mount nonvolatile memories on glass substrates such as in liquid crystal panels.

Such nonvolatile memory cells store information by utilizing current differences among storage states. However, the nonvolatile memory cells structurally have large variations in cell characteristics. Specifically, there are differences in write time among respective memory cells or large variations in erase cell current. In particular, memory cells formed on a glass substrate are large in characteristic variations, giving rise to a need for picking up memory cells of extremely poor characteristics as failed products. However, it becomes very inefficient to treat an integrated liquid crystal panel as a failed product as the result of failure generated in only memory sections.

Also, the respective memory cells are affected each other in different proportions by disturbance (disturbance due to accesses to other memory cells), deterioration of endurance (deterioration in rewrite characteristics of memory cells due to increases in the number of times of rewrite), respective retention characteristics (stored-information retaining characteristics due to temperature variations, time variations) and the like. This leads to occurrence of product failures after their coming onto the market.

As a conventional typical method for read operation, there has been a semiconductor storage device wherein a current value or an average current value of reference cells is used as a reference current value, and a cell current value of a memory cell to be read is compared with the reference current value so as to determine information (see JP 2004-273093 A, for example). Specifically, data "0" and data "1" are stored in two reference cells, respectively, and their average current value is used as a reference current value.

However, the conventional semiconductor storage device has not correctly read information stored in memory cells in cases where the cell current is largely varied or where the characteristics of the respective memory cells are changed after the shipping of the products.

BRIEF SUMMARY OF THE INVENTION

A first object of the present invention is to provide a semiconductor storage device which is capable of suppressing the failure rate of the memory sections to a low one even if a high failure rate of respective memory cells is involved or even if the characteristics of respective memory cells are changed after the shipping of products.

A second object of the invention is to provide a semiconductor storage device which is capable of suppressing the failure rate to a low one even if large variations of currents flowing through respective memory cells are involved, even if a high failure rate of respective memory cells is involved or even if the characteristics of respective memory cells are changed after the shipping of products.

A third object of the invention is to provide a semiconductor storage device which is capable of making a high-precision determination as to information stored in memory cells even if large variations of currents flowing through respective memory cells are involved or even if the characteristics of the memory cells are changed after the shipping of products.

In order to achieve the above first object, the present invention provides a semiconductor storage device comprising:
  an integer number n (n>1) of memory cells connected in series to form a memory cell column; and
  an integer number m (m>1) of memory cell columns connected in parallel to form a memory cell group, wherein
  1-bit information is to be stored in the memory cell group.

In this semiconductor storage device, 1-bit data is stored in the memory cell group in which respective memory cells are arrayed in series and in parallel. Therefore, it is possible to suppress the failure rate of the memory sections of the semiconductor storage device to a low one even, as compared with the case where information is stored in one memory cell, if the respective memory cells are high in failure rate or even if the characteristics of the respective memory cells are changed after the shipping of products. Thus, it is possible to increase the yield at the time of shipping, and to maintain accurate information read from memory cells for prolonged time after the shipping of products.

In order to achieve the above first object, the present invention also provides a semiconductor storage device comprising:
  an integer number m (m>1) of memory cells connected in parallel to form a memory cell column; and
  an integer number n (n>1) of memory cell columns connected in series to form a memory cell group, wherein
  1-bit information is to be stored in the memory cell group.

In this semiconductor storage device, as in the case of the above, 1-bit data is stored in the memory cell group in which respective memory cells are arrayed in series and in parallel. Therefore, it is possible to suppress the failure rate of the memory sections of the semiconductor storage device to a low one, as compared with the case where information is stored in one memory cell, even if the respective memory cells are high in failure rate and even if the characteristics of the respective memory cells are changed after the shipping of products. Thus, it is possible to increase the yield at the time of shipping, and to maintain accurate information read from memory cells for prolonged time after the shipping of products.

In one embodiment of the invention, the semiconductor storage device further comprises:
  a transistor having input/output terminals, one end of which is connected to one end of the memory cell group, wherein
  an other end of the memory cell group is connected to a first power supply, and
  an other end of the transistor is connected to a second power supply.

In the semiconductor storage device of this embodiment, 1-bit data stored in the memory cell group can be easily read out with a high yield by using only the one transistor because the semiconductor storage device has the transistor connected to the memory cell group.

In one embodiment of the invention, the semiconductor storage device further comprises:
- a first transistor having input/output terminals, one of which is connected to one end of a first memory cell group; and
- a second transistor having input/output terminals, one of which is connected to one end of a second memory cell group, wherein
- an other end of the first memory cell group and an other end of the second memory cell group are connected to a first power supply,
- an other end of the first transistor and an other end of the second transistor are connected to a second power supply,
- one end of the first transistor is connected to gates of respective memory cells of the second memory cell group and to a gate of the second transistor, and
- one end of the second transistor is connected to gates of respective memory cells of the first memory cell group and to a gate of the first transistor.

In the semiconductor storage device of this embodiment, by virtue of its having the transistor connected to the memory cell group and the inverter connected to the memory cell group, 1-bit data stored in the memory cell group can be easily read out with a high yield by using only the two transistors. Also, without any need for using any timing signal, the data can be outputted only by starting up the power supply.

In one embodiment of the invention, the semiconductor storage device further comprises:
- a transistor having input/output terminals, one of which is connected to one end of the memory cell group; and
- an inverter having an input terminal connected to one end of the memory cell group, wherein
- an other end of the memory cell group is connected to a first power supply,
- an other end of the transistor is connected to a second power supply, and
- an output terminal of the inverter is connected to a gate of the transistor.

In the semiconductor storage device of this embodiment, by virtue of its having the transistor connected to the memory cell group and the inverter connected to the memory cell group, 1-bit data stored in the memory cell group can be easily read out with a high yield by using only the one transistor and the one inverter. Also, without any need for using any timing signal, the data can be outputted only by starting up the power supply.

In one embodiment of the invention, the semiconductor storage device further comprises:
- a first inverter and a second inverter which have output-ends and input-ends connected to form a latch circuit, wherein
- one end of the first memory cell group and one end of the second memory cell group are connected to a first power supply,
- an other end of the first memory cell group is connected to an input end of the first inverter, and
- an other end of the second memory cell group is connected to an input end of the second inverter.

In the semiconductor storage device of this embodiment, by virtue of its having the first inverter and the second inverter that constitute a latch circuit by connection of their outputs and inputs, 1-bit data stored in the two memory cell groups can be easily read out with a high yield by using only the two inverters. Also, without any need for using any timing signal, the data can be outputted only by starting up the power supply.

In one embodiment of the invention, one end of the first memory cell group is connected to a first power supply,
- one end of the second memory cell group is connected to a second power supply, and
- an other end of the first memory cell group and an other end of the second memory cell group are connected to each other.

In the semiconductor storage device of this embodiment, by virtue of its arrangement that the first memory cell group is connected to the first power supply, the second memory cell group is connected to the second power supply and that the first memory cell group and the second memory cell group are connected to each other, 1-bit data stored in the two memory cell groups can be easily read out with a high yield by using only the two kinds of power supplies. Also, without any need for using any timing signal, the data can be outputted only by starting up the power supplies.

In one embodiment of the invention, electronic equipment comprises the semiconductor storage device.

In this electronic equipment, high reliability can be obtained since the electronic equipment has the above-stated semiconductor storage device.

In order to achieve the above first object, the present invention also provides a semiconductor storage device comprising:
- an integer number n (n>1) of memory cells connected in series to form a memory cell column;
- an integer number m (m>1) of memory cell columns connected in parallel; and
- other memory cells connecting intermediate nodes each formed between neighboring memory cells located at a same position measured from one end of the memory cell column in respectively neighboring memory cell columns, wherein
- a memory cell group is formed by all of the memory cells.

In this semiconductor storage device, the memory cell group formed there makes it possible to suppress the failure rate of the memory cell group to a low one, as compared with the case in which information is stored in one memory cell, even if the respective memory cells are high in failure rate and even if the characteristics of the respective memory cells are changed after the shipping of products. Thus, the yield at the time of shipping can be increased, and accurate information read from memory cells can be maintained for prolonged time even after the shipping of products. Also, the failure rates can be lowered in a self-alignment way. This is because when the memory cells connecting the intermediate nodes of the memory cell columns is in a write state, no current flows therethrough, which is an advantageous construction for data 1 (where all the memory cells are in the write state). On the other hand, when the memory cell connecting the intermediate nodes of the memory cell columns is in an erase state, a current flows therethrough, which is an advantageous construction for data 0 (where all the memory cells are in the erase state).

In one embodiment of the invention, each of n and m is an integer two,
- two memory cells are respectively connected in series to form a first memory cell column and a second memory cell column,
- the first memory cell column and the second memory cell column are connected in parallel, an intermediate node in the first memory cell column and an intermediate node in the second memory cell column are connected via an other memory cell, and the memory cell group is formed by all of the memory cells.

In the semiconductor storage device of this embodiment, the memory cell group is formed under setting of both n and m being two. Therefore, the memory cell group, which can decrease the failure rate in the self-alignment way, is formed by five memory cells, so that the circuit can be made small in size.

In one embodiment of the invention, each of n and m is an integer three, three memory cells are respectively connected in series to form a first memory cell column, a second memory cell column and a third memory cell column, the first memory cell column, the second memory cell column and the third memory cell column are connected in parallel sequentially, the other memory cells connect:

between a first intermediate node located at a first position in the first memory cell column and a first intermediate node located at the first position in the second memory cell column, between a second intermediate node located at a second position in the first memory cell column and a second intermediate node located at the second position in the second memory cell column, between the first intermediate node located at the first position in the second memory cell column and a first intermediate node located at a first position in the third memory cell column, and between the second intermediate node located at the second position of the second memory cell column and a second intermediate node located at a second position of the third memory cell column, and a memory cell group is formed by all of the memory cells.

In the semiconductor storage device of this embodiment, the memory cell group is formed under setting of both n and m each being three. Therefore, the memory cell group, which can decrease the failure rate in the self-alignment way, is formed by thirteen memory cells, so that the circuit can be made small in size while the failure rate can be made very low.

In one embodiment of the invention, the semiconductor storage device further comprises:

a transistor having input/output terminals, one of which is connected to one end of the memory cell group; and an inverter having an input terminal connected to one end of the memory cell group, wherein an other end of the memory cell group is connected to a first power supply, an other end of the transistor is connected to a second power supply, and an output terminal of the inverter is connected to a control gate of the transistor.

In the semiconductor storage device of this embodiment, by virtue of its having the transistor connected to the memory cell group and the inverter connected to the memory cell group, 1-bit data stored in the memory cell group can be easily read out with a high yield by using only the one transistor and the one inverter. Also, without any need for using any timing signal, the data can be outputted only by starting up the power supply.

Electronic equipment comprises the above-stated semiconductor storage device.

In this electronic equipment, high reliability can be obtained since the electronic equipment has the above-stated semiconductor storage device.

In order to achieve the above second object, the present invention provides a semiconductor storage device comprising first, second and third memory cell sections, wherein the first, second and third memory cell sections each have one memory cell or a plurality of memory cells connected in parallel, one end of the first memory cell section is connected to a first power supply, an other end of the first memory cell section is connected to one end of the second memory cell section and to one end of the third memory cell section, an other end of the third memory cell section is connected to a second power supply, and a current is read out from an other end of the second memory cell section.

In the semiconductor storage device of the invention, the memory cell block is constituted by three memory cell sections each having at least one memory cell, so as to store data in the memory cell block. Thereby, even if the current difference is small between erase state and write state in the respective memory cells, it is possible to enlarge a difference in current of the current flowing to the other end of the second memory cell section of the memory cell block between erase state (e.g. data 0) and write state (e.g. data 1). Thus, information of the memory cells can accurately be read out.

In one embodiment of the invention, the first to third memory cell sections each have a plurality of memory cells connected in parallel.

In this embodiment, the memory cell block is constituted by three memory cell sections each including at least two memory cells, so as to store data in the memory cell block. Therefore, even if the current difference is small between erase state and write state in the respective memory cells, it is possible to enlarge a current difference of the current flowing to the other end of the second memory cell section of the memory cell block between erase state (e.g. data 0) and write state (e.g. data 1). Thus, in this embodiment, even if a small number of memory cells have any erase fail or write fail, it is possible to accurately read out the information in the memory cell block.

In one embodiment of the invention, a number of memory cells included in the second memory cell section is equal to or larger than a number of memory cells included in the first memory cell section and equal to or larger than a number of memory cells included in the third memory cell section.

In this embodiment, it is possible to increase the degree of separation (readout window) of current value between data 0 and data 1, as compared with cases where the number of memory cells of the second memory cell section is smaller than the number of memory cells of the first or third memory cell section. This readout window contains factors of current differences (on/off current differences) between data 0 and data 1 as well as of current variations. In this embodiment, therefore, the readout margin can be improved to decrease harmful influence of deterioration in characteristics of the memory cells due to retention (deterioration in stored-information retaining characteristics due to temperature variations, time variations and the like).

In one embodiment of the invention, a number of memory cells included in the third memory cell section is equal to or larger than a number of memory cells included in the first memory cell section and equal to or larger than a number of memory cells included in the second memory cell section.

In this embodiment, the current ratio of data 0 to data 1 (on/off current ratio) is increased, as compared with cases where the number of memory cells of the third memory cell section is smaller than the number of memory cells of the first or second memory cell section. Thus, the readout margin can be improved.

In one embodiment of the invention, the other end of the second memory cell section is connected to an input end of the readout circuit.

In this embodiment, a current from the second memory cell section is inputted to the readout circuit. In the memory cell block which is constituted of three memory cell sections each including at least one memory cell, it is possible to enlarge a current difference in the current flowing from the memory cell block between erase state (e.g. data 0) and write state (e.g. data 1), even if the current difference between erase state and write state in the respective memory cells is small. Thus, information in the memory cells can be read out correctly by the readout circuit.

In one embodiment of the invention, the readout circuit is a one-side latch circuit.

In this embodiment, upon start-up of the power supply, data can be automatically read out, no timing is required, and the circuits can be downscaled, because the readout circuit is formed by a one-side latch circuit.

In one embodiment of the invention, the semiconductor storage device further comprises:
- a first transistor connected between the first power supply and one end of the first memory cell section; and
- a second transistor connected between the first power supply and a P-channel transistor of an inverter constituting the one-side latch circuit.

In this embodiment, it is possible to control the start/end of operations of the semiconductor storage device (memory cell block, one-side latch circuit) by on/off control of the first and second transistors. Therefore, it is possible to start the circuit operation of the semiconductor storage device when the power supply is stabilized after start-up of the power supply. Thereby, noise of the power supply can be cut off and any false operations can be prevented. Also, the circuit operation can be stopped after completion of the readout, and therefore, it is possible to minimize the time over which a current continues flowing through the memory cells. Thus, characteristic deteriorations of the memory cells due to read disturb can be prevented.

In one embodiment of the invention, the semiconductor storage device further comprises a transistor for resetting a voltage at each end of the one-side latch circuit.

In this embodiment, any floating node can be eliminated since the input and output of the one-side latch circuit is reset by the reset transistor, so that a more reliable circuit operation can be fulfilled.

In one embodiment of the invention, the readout circuit has a current mirror circuit.

In this embodiment, the read precision can be easily enhanced because a current mirror circuit used in the semiconductor memory is adopted as the readout circuit.

In one embodiment of the invention, the semiconductor storage device further comprises:
- a first memory cell block connected to one of two input ends of the current mirror circuit; and
- a second memory cell block connected to an other of the two input ends of the current mirror circuit, wherein the first and second memory cell blocks each have the first, second and third memory cell sections.

In this embodiment, the readout margin can be increased because the current mirror circuit serving as a readout circuit complementarily reads out data from the first, second memory cell blocks.

In one embodiment of the invention, the readout circuit has a differential amplification circuit.

In this embodiment, the readout precision can be easily enhanced because a differential amplification circuit used in the semiconductor memory is adopted as the readout circuit.

In one embodiment of the invention, the semiconductor storage device further comprises:
- a first memory cell block connected to one of two input ends of the differential amplification circuit; and
- a second memory cell block connected to an other of the two input ends of the differential amplification circuit, wherein the first and second memory cell blocks each have the first, second and third memory cell sections.

In this embodiment, the readout margin can be increased because the differential amplification circuit serving as the readout circuit complementarily reads out data from the first, second memory cell blocks.

In one embodiment of the invention, electronic equipment comprises the above-stated semiconductor storage device.

In this embodiment, the electronic equipment includes the semiconductor storage device with a relatively simple construction, which device can suppress the failure rate of memory sections to a low one. Therefore, the product yield is increased at the time of shipping, and also information of the memory cells is accurately read out for a prolonged time even after the shipping of products. Thus, electronic equipment having high reliability can be obtained.

In order to achieve the above third object, the present invention provides a semiconductor storage device comprising:
- a first memory section for storing two kinds of states by one or more memory cells;
- a second memory section for storing the two kinds of states by one or more memory cells; and
- a sense amplifier for detecting a potential difference between a voltage equivalent to a readout current of the first memory section and a voltage equivalent to a readout current of the second memory section, wherein
  one of the two kinds of states is stored in the first memory section and an other of the two kinds of states is stored in the second memory section,
  either one of information data "0" or data "1", which is stored in combination of the first memory section and the second memory section, is read out by detecting the potential difference between the voltage equivalent to the readout current of the first memory section and the voltage equivalent to the readout current of the second memory section.

In the semiconductor storage device, one of the two kinds of states is stored in the first memory section while the other of the two kinds of states is stored in the second memory section, so that the two kinds of states (data "0" and data "1") are stored in combinations of the first and second memory sections. Then, a potential difference between a voltage equivalent to a readout current of the first memory section and a voltage equivalent to a readout current of the second memory section is detected by the sense amplifier. Thereby, either one of information data "0" or data "1" is read out, which information is stored in a combination of the first memory section and the second memory section. In this way, information stored in combination of the first memory section and the second memory section is read out on the basis of a potential difference between voltages equivalent to readout currents of the first and second memory sections where different states are stored. Therefore, information in the memory cells can be precisely determined, even if the respective memory cells have large variations in cell current and even if the characteristics of the memory cells are changed after the shipping of products.

In one embodiment of the invention, one end of the first memory section is connected to a first power supply, an other end of the first memory section is connected to one end of an input terminal of the sense amplifier, one end of the second memory section is connected to the first power supply, and an other end of the second memory section is connected to the other end of the input terminal of the sense amplifier, the semiconductor storage device further comprising:

a first transistor having one end connected to the other end of the first memory section and an other end connected to a second power supply; and a second transistor having one end connected to the other end of the second memory section and an other end connected to the second power supply.

In this embodiment, the first memory section and the first transistor are connected in series to form a pair thereof, and the second memory section and the second transistor are connected in series to form a pair thereof. By using these pairs, 1-bit data is stored in the memory cells under the condition that one of the first and second memory cell sections is assigned as a write cell while the other is assigned as an erase cell. As a result, as compared with conventional way in which data is read out by a comparison of information stored in one memory cell with a reference value, it is possible to more correctly read out data of memory cells as far as the current distribution of the write cell does not overlap with the current distribution of the erase cell, even if the cell currents are varied or even if the current values are changed due to time variations.

In one embodiment of the invention, one end of the first memory section is connected to a first power supply, an other end of the first memory section is connected to one end of an input terminal of the sense amplifier, one end of the second memory section is connected to the first power supply, and an other end of the second memory section is connected to an other end of the input terminal of the sense amplifier, the semiconductor storage device further comprising:

a third memory section having one end connected to the other end of the first memory section and an other end connected to the second power supply, to store the two kinds of states by using one or more memory cells; and a fourth memory section having one end connected to the other end of the second memory section and an other end connected to the second power supply, to store the two kinds of states by using one or more memory cells, wherein the third memory section stores a state same as that of the second memory section out of the two kinds of states, and the fourth memory section stores a state same as that of the first memory section out of the two kinds of states.

In this embodiment, the first memory section and the third memory section are connected in series to form a pair thereof, and the second memory section and the fourth memory section are connected in series to form a pair thereof. By using these pairs, 1-bit data is stored in the memory cells under the condition that one of the first and third memory sections is assigned as a write cell while the other is assigned as an erase cell, and one of the second and fourth memory sections is assigned as an erase cell while the other is assigned as a write cell. As a result, as compared with conventional way in which data read is done by a comparison of information stored in one memory cell with a reference value, it is possible to more correctly read out data of memory cells as far as the current distribution of write cells does not overlap with the current distribution of erase cells, even if the cell currents are varied or even if the current values are changed due to time variations.

In one embodiment of the invention, a memory cell group, in which an integer number n (n>2) of memory cells are connected in series, is used as the memory section.

In this embodiment, the readout margin for data of the memory cells is increased because of reduction of variations in the storage state in which cell currents of the memory cells are less.

In one embodiment of the invention, a memory cell group, in which an integer number n (n>2) of memory cells are connected in parallel, is used as the memory section.

In this embodiment, the readout margin for data of the memory cells is increased because of reduction of variations in the storage state in which cell currents of the memory cells are more.

In one embodiment of the invention, the memory section has a memory cell column in which an integer number n (n>2) of memory cells are connected in series, and an integer number m (m>2) of the memory cell columns are connected in parallel.

In the embodiment, the readout margin for data of the memory cells can be increased because of variation reductions both in the storage state in which cell currents of the memory cells are less and in the storage state in which cell currents of the memory cells are more, although more effectively in the storage state in which cell currents of the memory cells are less, in particular.

In one embodiment of the invention, the memory section has a memory cell column in which an integer number m (m≧2) of memory cells are connected in parallel, and an integer number n (n≧2) of the memory cell columns are connected in series.

In this embodiment, the readout margin for data of the memory cells can be increased because of variation reductions both in the storage state in which cell currents of the memory cells are less and in the storage state in which cell currents of the memory cells are more, although effectively in the storage state in which cell currents of the memory cells are more, in particular.

In one embodiment of the invention, the memory section has an integer number m (m≧2) sets of first to m-th memory cell columns in each of which an integer number n (n≧2) of memory cells are connected in series, the numbers of the memory cells in the first to m-th memory cell columns are equal to or different from each other, the first to m-th memory cell columns are connected in parallel, and at least two of intermediate nodes respectively in different memory cell columns among the first to m-th memory cell columns are connected via at least one of a memory cell and an interconnect line for intermediate node connection.

In this embodiment, the readout margin for data of the memory cells can be increased because of variation reductions both in the storage state in which cell currents of the memory cells are less and in the storage state in which cell currents of the memory cells are more.

In one embodiment of the invention, the memory section has an integer number m (m≧2) sets of first to m-th memory cell columns in each of which an integer number n (n≧2) of memory cells are connected in series, the numbers of the memory cells in the first to m-th memory cell columns are equal to each other, each of the first to m-th memory cell columns has first to (n−1)-th intermediate nodes in order from one end of the memory cell columns, and an integer number (n−1)×(m−1) of memory cells for intermediate node connection are included to connect j-th (j=1 to n−1) intermediate node in i-th (i=1 to m−1) memory cell column to j-th intermediate node in (i+1)-th memory cell column.

In this embodiment, the readout margin for data of the memory cells can be increased because of variation reductions both in the storage state in which cell currents of the memory cells are less and in the storage state in which cell currents of the memory cells are more.

Electronic equipment comprises the above-stated semiconductor storage device.

The electronic equipment includes the above-stated semiconductor storage device with a relatively simple construction, which device can increase the product yield at the time of shipping of products even if variations of the respective memory cells are large, and which device also can accurately read out information in the memory cell for prolonged time after the shipping. Thus, electronic equipment having high reliability can be obtained.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 31 shows a list table of current values flowing through memory cell blocks when varying the number of memory cells that each of the memory cell groups has in the fifteenth embodiment of the invention;

FIG. 32A shows a first half of a list table of current values flowing through memory cell blocks when varying the number of memory cells in the case of including one erase-fail memory cell in the fifteenth embodiment of the invention;

FIG. 32B shows a second half of the list table of current values flowing through memory cell blocks when varying the number of memory cells in the case of including one erase-fail memory cell in the fifteenth embodiment of the invention;

FIG. 33A shows a first half of a list table of current values flowing through memory cell blocks when varying the number of memory cells in the case of including one write-fail memory cell in the fifteenth embodiment of the invention;

FIG. 33B shows a second half of the list table of current values flowing through memory cell blocks when varying the number of memory cells in the case of including one write-fail memory cell in the fifteenth embodiment of the invention;

DETAILED DESCRIPTION OF THE INVENTION

Hereinbelow, the present invention will be described in detail by way of embodiments thereof illustrated in the accompanying drawings.

First Embodiment

Figure 1:
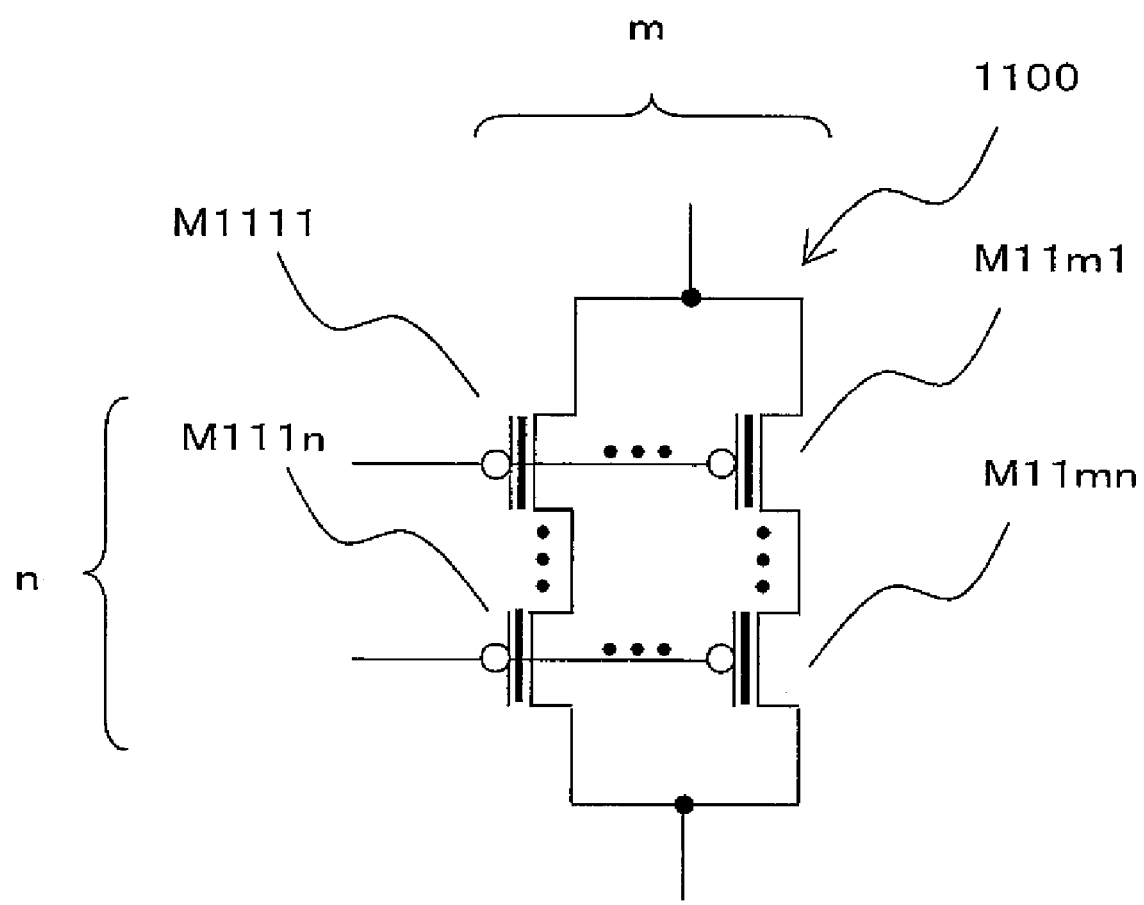
FIG. 1 shows a semiconductor storage device according to a first embodiment of the present invention.

FIG. 1 shows a semiconductor storage device according to a first embodiment of the invention. In this semiconductor storage device, n pieces of memory cells (M1111, M1112, ..., M111n) are connected in series to form a memory cell column (wherein n is an integer and n>1), and m pieces of memory cell columns (M1111, M1121, ..., M11m1, ..., M111n, M112n, ..., M11mn) are connected in parallel to form a memory cell group 1100 (where m is an integer and m>1). One-bit information is to be stored in the memory cell group 1100.

Assuming that each of the memory cells is initially in an erase state where current flows therethrough (hereinafter, a memory cell in the erase state is referred to as an "erase cell"), and this state is defined as data 0. By a write operation, a memory cell is put into a write state where no current flows therethrough (hereinafter, a memory cell in the write state is referred to as a "write cell"), and this state is defined as data 1. In addition, the current states and the definition of data 0/1 are not considered to be limited to the above.

Given an erase failure rate "e" (including a probability of initially being out of the erase state) and a write failure rate "p" of the memory cells, a failure rate "$\epsilon 0$" for storage of 1 bit in one memory cell can be expressed by the following Equation (1):

$$\epsilon 0 = 1 - (1-e) \cdot (1-p) \tag{1}$$

Therefore, if e=p=1%, then it follows that $\epsilon 0$=1.99%.

Accordingly, when all the data of n×m memory cells are set to 0 in the construction of the present invention shown in FIG. 1, an erase failure rate "$\epsilon 1e$" as a memory cell group is expressed by the following Equation (2):

$$\epsilon 1e = (1-(1-e)^n)^m \tag{2}$$

When all the data are set to 1, a write failure rate "$\epsilon 1p$" as a memory cell group is expressed by the following Equation (3):

$$\epsilon 1p = 1 - (1-p^n)^m \tag{3}$$

If e=p=1% and n=m=2 (4 memory cells), then $\epsilon 1e \# 0.0396\%$ and $\epsilon 1p \approx 0.0200\%$, showing that the failure rates become at least about 1/50 in comparison with those of storage into one memory cell. Further, if e=p=1% and n=m=3 (9 memory cells), then $\epsilon 1e \approx 0.00262\%$ and $\epsilon 1p \approx 0.000300\%$, showing that the failure rates can be reduced to at least about 1/760 in comparison with those of storage into one memory cell.

According to the semiconductor storage device constructed as described above, 1-bit data is stored in the memory cell group where respective memory cells are arrayed in series and in parallel. Therefore, even if the respective memory cells are high in failure rate or even if the characteristics of the respective memory cells are changed after the shipping of products, it is possible to suppress the failure rate of the memory sections of the semiconductor storage device to a low one, as compared with the case where information is stored in one memory cell. It is also possible to increase the yield at the time of shipping. Further, it is possible to maintain accurate information read from memory cells for prolonged time after the shipping of products, as compared with the case where information is stored in one memory cell.

Second Embodiment

Figure 2:
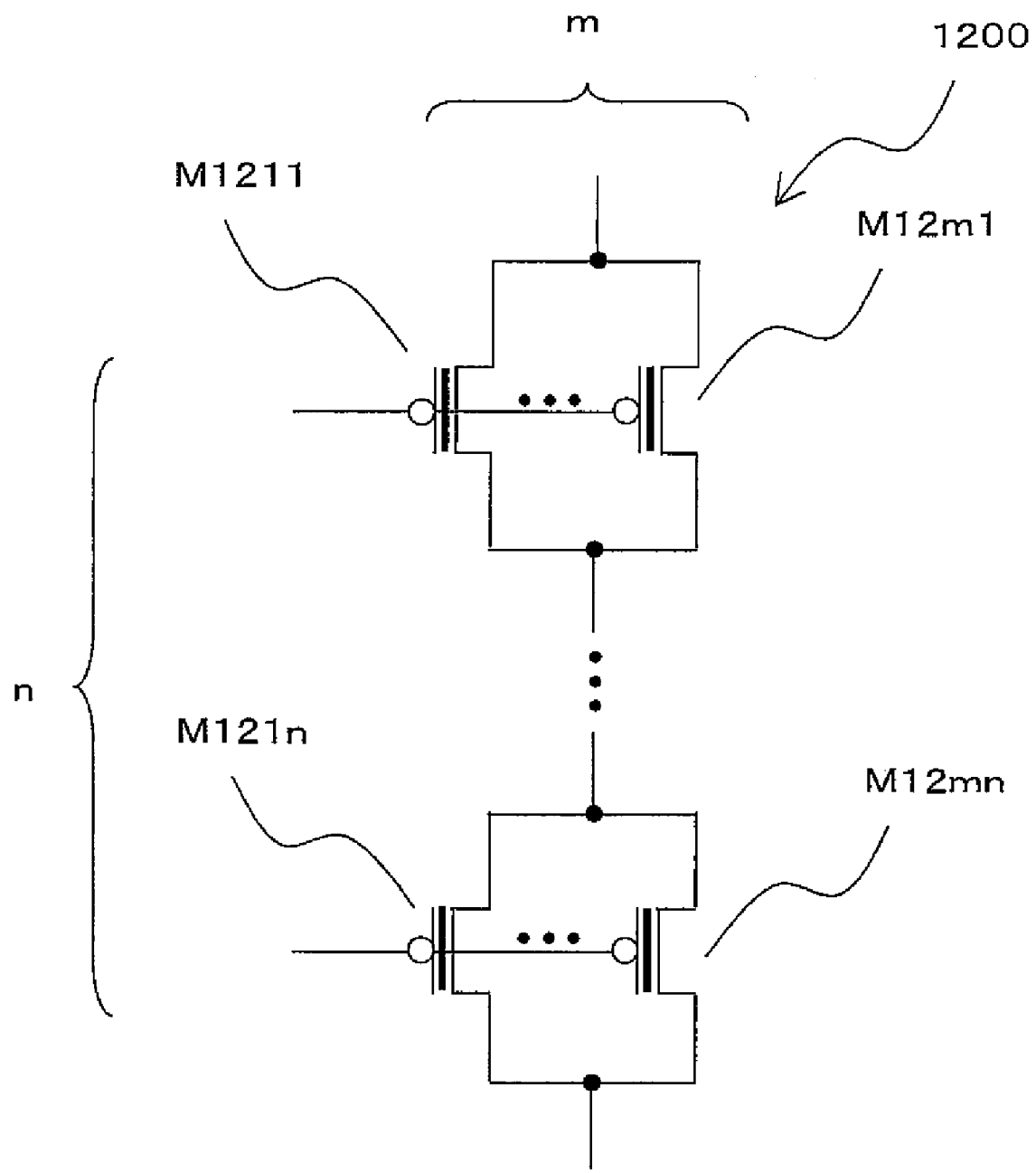
FIG. 2 shows a semiconductor storage device according to a second embodiment of the invention.

FIG. 2 shows a semiconductor storage device according to a second embodiment of the invention. In this semiconductor storage device, m pieces (where m is an integer and m>1) of memory cells M1211, M1221, ... M12m1 are connected in parallel so as to form a memory cell column. N pieces (where n is an integer and n>1) of memory cell columns are connected in series (memory cell columns M1211, ... M121n, ..., M12m1, ... M12mn) to form a memory cell group 1200. In this memory cell group 1200, 1-bit information is to be stored.

When all data of n×m memory cells are set to 0, an erase failure rate "$\epsilon 2e$" as a memory cell group is expressed by the following Equation (4):

$$\epsilon 2e = (1-(1-e)^m)^n \tag{4}$$

When all the data are set to 1, a write failure rate "$\epsilon 2p$" as a memory cell group is expressed by the following Equation (5):

$$\epsilon 2p = 1 - (1-p^m)^n \tag{5}$$

If e=p=1% and n=m=2 (i.e. 4 memory cells), then $\epsilon 2e \approx 0.0200\%$ and $\epsilon 2p \approx 0.0396\%$. As the result, the failure rates become at least about 1/50 in comparison with those of storage into one memory cell. Further, if e=p=1% and n=m=3 (i.e. 9 memory cells), then $\epsilon 2e \approx 0.000300\%$ and $\epsilon 2p \approx 0.00262\%$. As the result, the failure rates can be reduced to at least about 1/60 in comparison with those of storage into one memory cell.

According to the semiconductor storage device constructed as described above, 1-bit data is stored in the memory cell group where respective memory cells are arrayed in series and in parallel. Therefore, even if the respective memory cells are high in failure rate or even if the characteristics of the respective memory cells are changed after the shipping of products, it is possible to suppress the failure rate of the memory sections of the semiconductor storage device to a low one, as compared with the case where information is stored in one memory cell. It is also possible to increase the yield at the time of shipping, and also to maintain accurate information read from memory cells for prolonged time after the shipping of products.

In the first and second embodiments, against write failures, it is effective to connect the memory cells. Against erase failures, it is effective to connect the memory cells in parallel. Therefore, the memory cells should be so set that n>m in the cases of p>e, and that n<m in the cases of p<e, where a write failure rate is "p" and an erase failure rate is "e" as stated above. As can be seen from the above, it is appropriate to apply the first embodiment in the cases of n=m and p>e, and the second embodiment in the cases of n=m and p<e.

Third Embodiment

Figure 3:
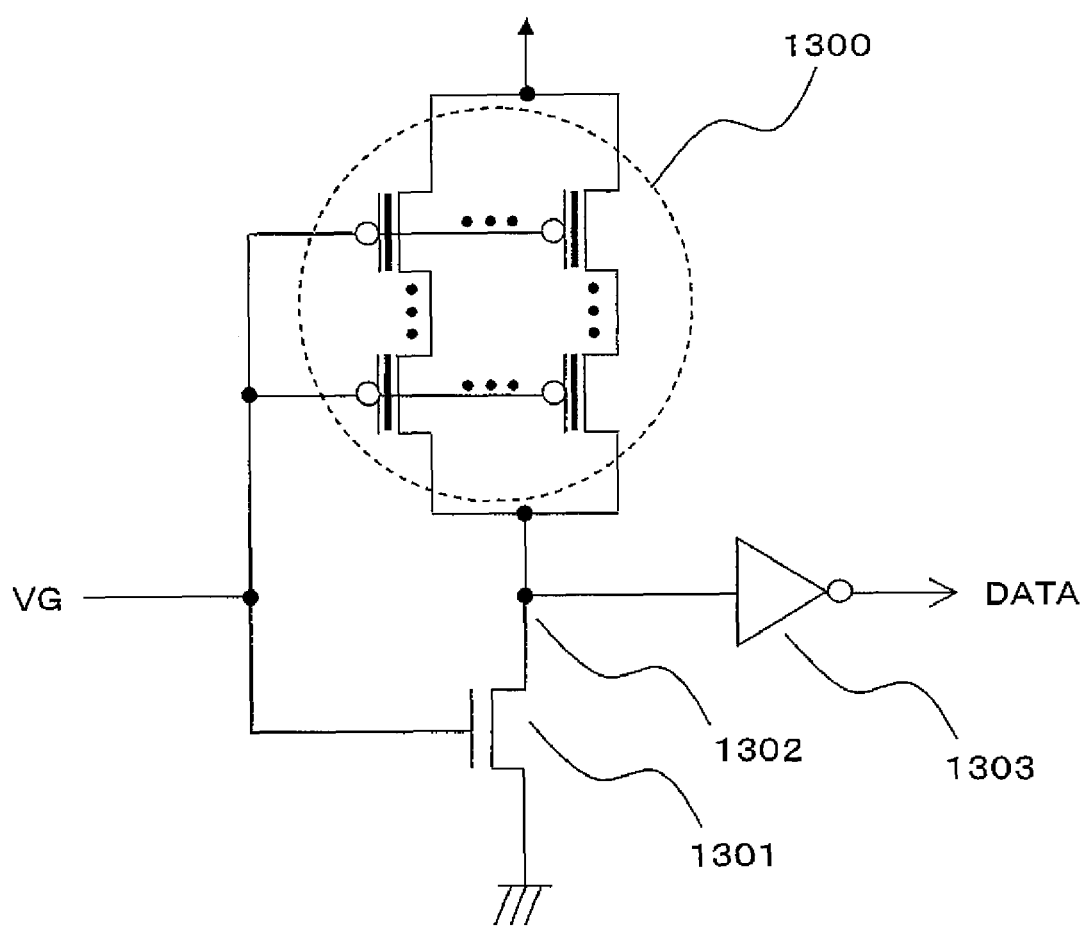
FIG. 3 shows a semiconductor storage device according to a third embodiment of the invention.

FIG. 3 shows a semiconductor storage device according to a third embodiment of the invention. In this semiconductor storage device, a memory cell group 1300 of the first embodiment type and an ordinary transistor 1301 are connected in series to form an inverter.

Here, the memory cells are the P-channel type, and therefore the transistor combined therewith is set to N-channel type. However, if the memory cells are N-channel type, then the transistor combined therewith is set to P-channel type. In a different way, the memory cells and the transistor may be set to a same channel type, where their gate signals are isolated from each other to use inverted signals as the respective gate signals, though the circuit thereof becomes somewhat complicated.

Here, the memory cell group shown in the first embodiment (FIG. 1) is used. However, the memory cell group shown in the second embodiment (FIG. 2) may also be used.

In order to read out information of the memory cells, a gate signal VG is firstly set to High. Thereby, the transistor 1301 is turned on while the memory cell group is turned off, so that a node 1302 turns into Low. Thereafter, the gate signal VG is set Low, and thereby the transistor 1301 is turned off. The memory cells of the memory cell group 1300 are turned on in the case of erase cells (data 0), so that the node 1302 turns into High. Accordingly, an output DATA via an ordinary inverter 1303 turns into Low (data 0). The memory cells of the memory cell group 1300 are kept turned off in the case of write cells (data 1), where the node 1302 holds the state of Low. As the result, the output DATA via the ordinary inverter 1303 remains High (data 1). In this way, 1-bit data stored in the memory cell group is accurately read out with a high yield (=1−$\epsilon$1e or 1−$\epsilon$p) stated in the first embodiment.

In brief, this semiconductor storage device has the memory cell group 1300 and the transistor 1301, wherein one end of the memory cell group 1300 is connected to one of input/output terminals of the transistor 1301, wherein the other end of the memory cell group 1300 is connected to a first power supply, and wherein the other of input/output terminals of the transistor 1301 is connected to a ground (as an example of second power supply).

Since the semiconductor storage device has the transistor 1301 connected to the memory cell group 1300, 1-bit data stored in the memory cell group 1300 can be easily read out with a high yield by using only one transistor 1301.

Fourth Embodiment

Figure 4:
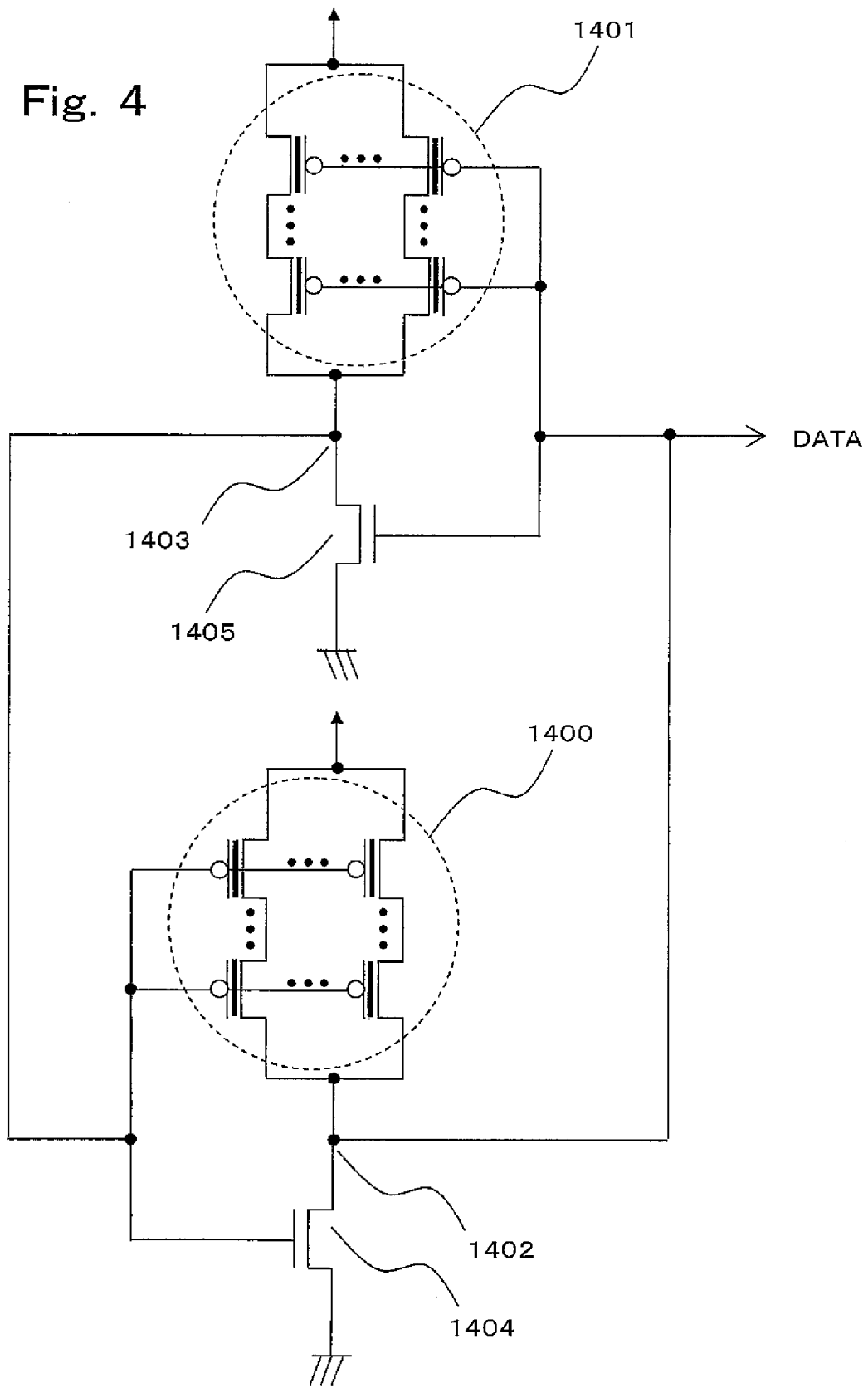
FIG. 4 shows a semiconductor storage device according to a fourth embodiment of the invention.

FIG. 4 shows a semiconductor storage device according to a fourth embodiment of the invention. In the semiconductor storage device, a latch circuit is formed by connecting two inverters, each of which is formed by connecting the memory cell group of the third embodiment (FIG. 3) to an ordinary transistor in series.

Here, the memory cells are set to P-channel type, and the transistor combined therewith is set to N-channel type. However, if the memory cells are set to N-channel type, then the transistor combined therewith is set to P-channel type. In a different way, the memory cells and the transistor may be set to the same channel type, where their gate signals are isolated from each other to use inverted signals as the respective gate signals, though the circuit thereof becomes somewhat complicated.

Here, the memory cell group of the first embodiment (FIG. 1) is used. However, the memory cell group of the second embodiment (FIG. 2) may be used.

As to information to be stored in memory cells, 1-bit information is stored in two memory cell groups 1400, 1401. To store data 1, the first memory cell group 1400 is assigned as erase cells, while the second memory cell group 1401 is assigned as write cells. Upon start-up of power supply, no current flows through the second memory cell group 1401, so that a node 1403 turns into Low and a node 1402 turns into High. This causes an output DATA to turn into High (data 1).

To store data 0, on the other hand, the first memory cell group 1400 is assigned as write cells, while the second memory cell group 1401 is assigned as erase cells. Upon start-up of power supply, no current flows through the first memory cell group 1400, so that the node 1402 turns into Low and the node 1403 turns into High. This causes the output DATA to turn into Low (data 0).

This method has an advantage that data is outputted only by starting up the power supply without any need for using such a gate signal as described in the third embodiment.

In brief, the semiconductor storage device has a first transistor 1404 and a second transistor 1405, wherein one of input/output terminals of the first transistor 1404 is connected to one end of the first memory cell group 1400, and wherein one of input/output terminals of the second transistor 1405 is connected to one end of the second memory cell group 1401. Both the other end of the first memory cell group 1400 and the other end of the second memory cell group 1401 are connected to a first power supply. Both the other end of the first transistor 1404 and the other end of the second transistor 1405 are connected to a ground (as an example of second power supply). The one end of the first transistor 1404 is connected to the gates of the respective memory cells of the second memory cell group 1401 as well as the gate of the second transistor 1405. The one end of the second transistor 1405 is connected to the gates of the respective memory cells of the first memory cell group 1400 as well as the gate of the first transistor 1404.

As stated above, the semiconductor storage device has the first transistor 1404 connected to the first memory cell group 1400 and the second transistor 1405 connected to the second memory cell group 1401. This makes it possible to easily read out 1-bit data stored in the two memory cell groups 1400, 1401 with a high yield by using the two transistors 1404, 1405 only. Also, data can be outputted only by starting up the power supply, without using any timing signal.

Fifth Embodiment

Figure 5:
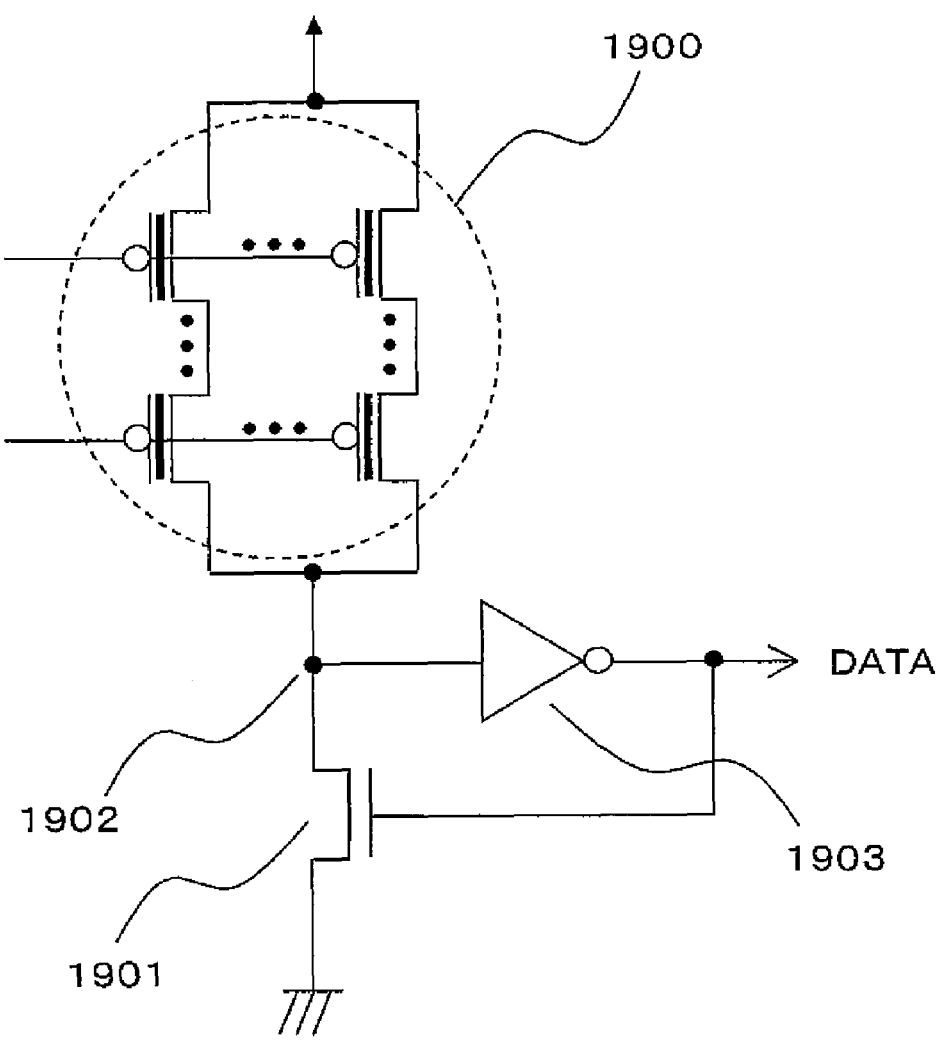
FIG. 5 shows a semiconductor storage device according to a fifth embodiment of the invention.

FIG. 5 shows a semiconductor storage device according to a fifth embodiment of the invention. In the semiconductor storage device, a memory cell group 1900 is connected to a node 1902 of a one-side latch circuit. The one-side latch circuit is made up of an ordinary transistor 1901 and an inverter 1903.

Here, the memory cell group of the first embodiment (FIG. 1) is used. However, the memory cell group of the second embodiment (FIG. 2) may also be used.

In this semiconductor storage device, upon start-up of the power supply, information in the memory cells is automatically read out to be outputted as a DATA signal. How this operation goes on is explained with reference to FIGS. 6 and 7.

Figure 6:
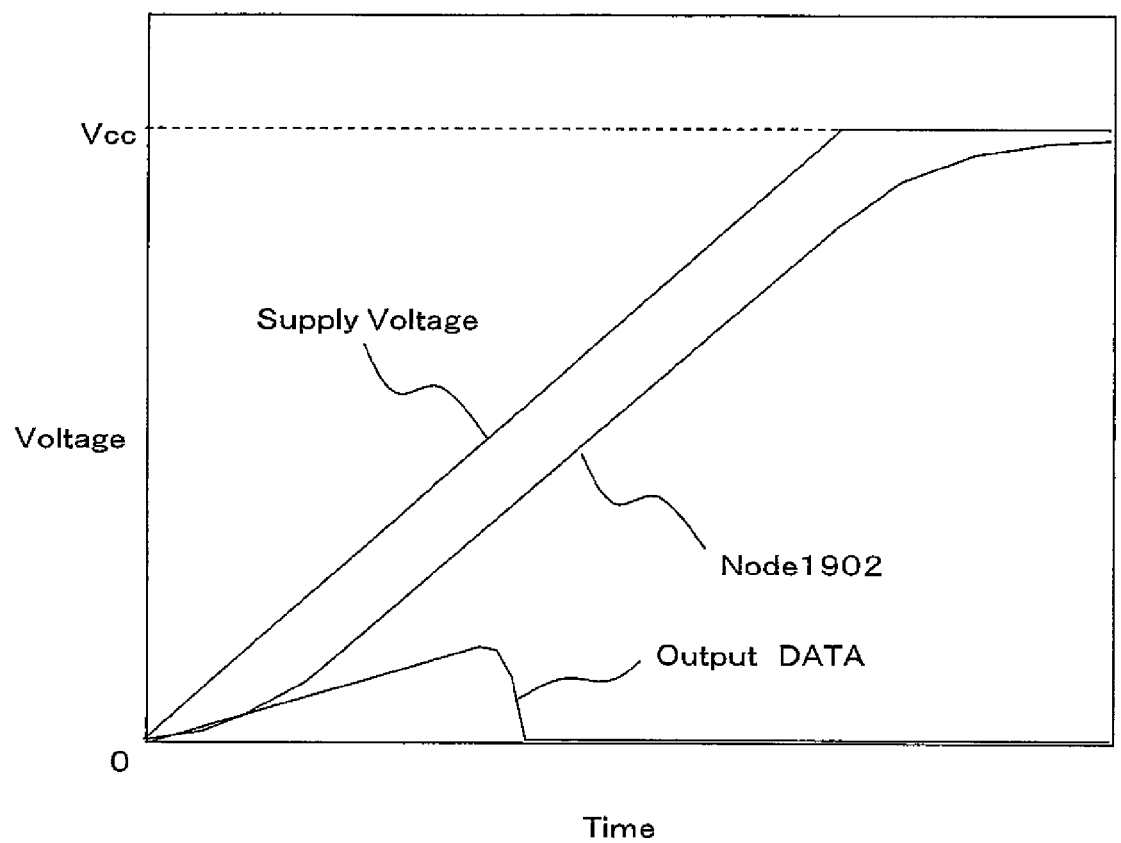
FIG. 6 is a view for explaining an operation of the semiconductor storage device when memory cells are in an erase state.

In the case where data of the memory cell group 1900 is 0 for example, when the power supply is started up, a current flows through the memory cells. Consequently, as shown in FIG. 6, the voltage of the node 1902 increases with increasing supply voltage, and soon the output DATA of the inverter 1903 turns into Low, so that data 0 is read out.

Figure 7:
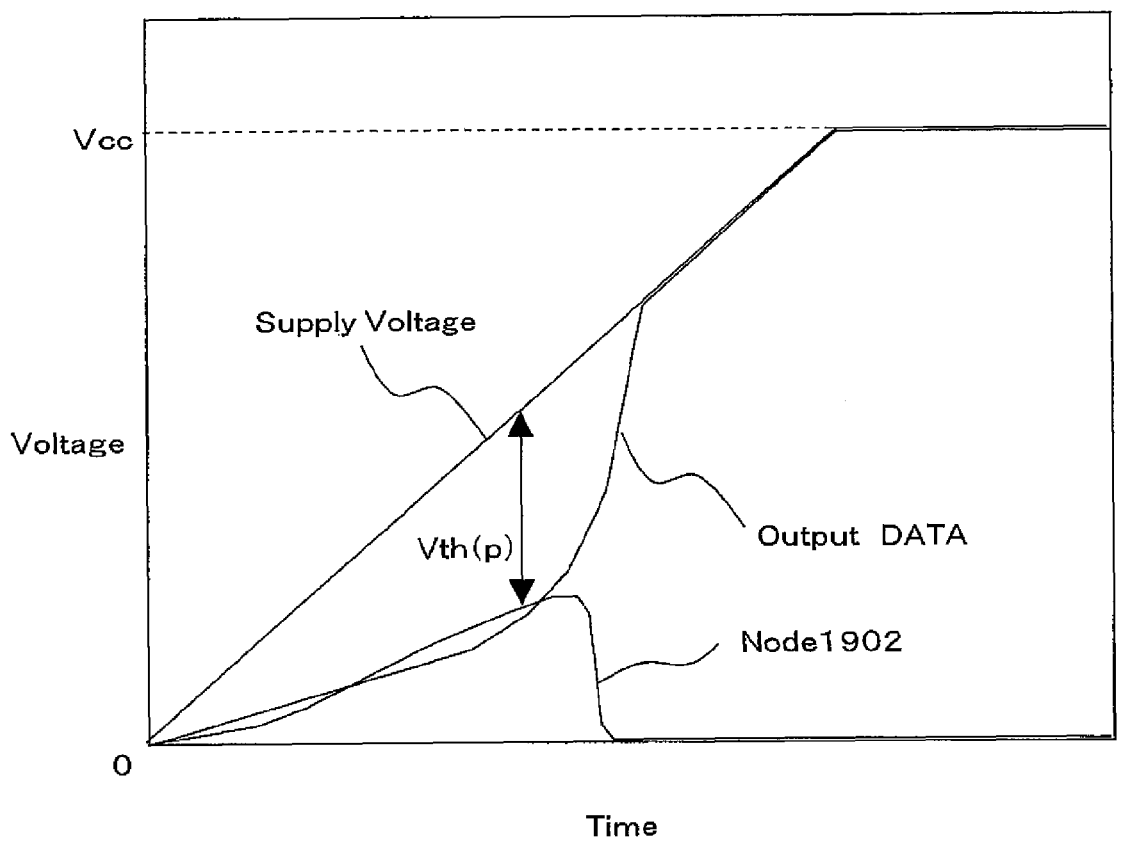
FIG. 7 is a view for explaining an operation of the semiconductor storage device when the memory cells are in a write state.

On the other hand, in the case where the data of the memory cell group 1900 is 1, even when the power supply is started up, no current flows through the memory cells. Consequently, as shown in FIG. 7, voltage of the node 1902 does not increase so much (the voltage thereof slightly increases due to coupling of parasitic capacitance and the like, as shown in the figure). Then, when difference between the supply voltage and the voltage of the node 1902 increases over a threshold value Vth(p) of the P-type transistor constituting the inverter, the output DATA of the inverter 1903 turns into High, so that data 1 is read out. In this way, 1-bit data stored in the memory cell group is accurately read out with the high yield ($=1-\epsilon 1e$ or $1-\epsilon 1p$) stated in the first embodiment.

In brief, this semiconductor storage device has the transistor 1901 and the inverter 1903, wherein one of input/output terminals of the transistor 1901 is connected to one end of the memory cell group 1900, and wherein an input terminal of the inverter 1903 is connected to the one end of the memory cell group 1900. The other end of the memory cell group 1900 is connected to a first power supply. The other of input/output terminals of the transistor 1901 is connected to a ground (as an example of second power supply). The output terminal of the inverter 1903 is connected to the gate of the transistor 1901.

As stated above, the semiconductor storage device has the transistor 1901 connected to the memory cell group 1900 and the inverter 1903 connected to the memory cell group 1900. This makes it possible to easily read out 1-bit data stored in the memory cell group 1900 with a high yield by using the one transistor 1901 and the one inverter 1903 only. Also, data can be outputted only by starting up the power supply, without using any timing signal.

Sixth Embodiment

Figure 8:
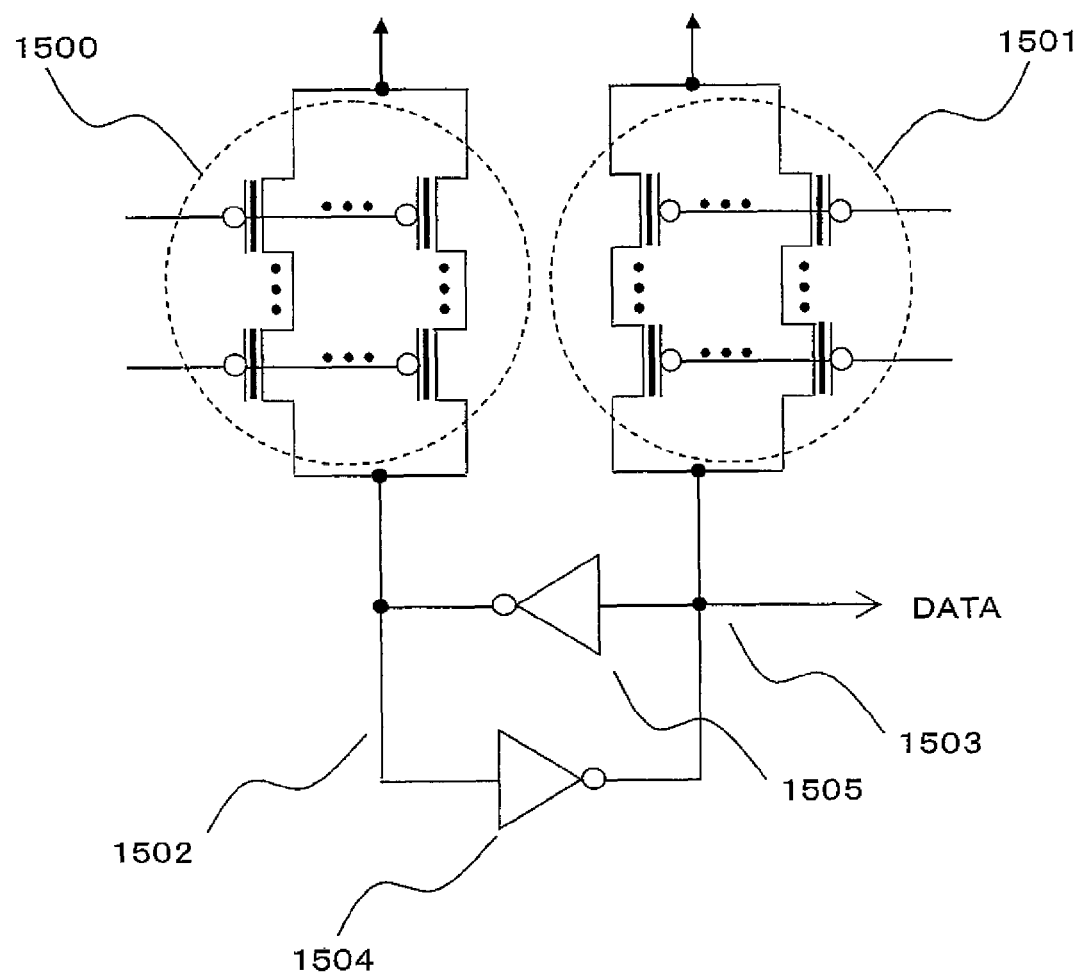
FIG. 8 shows a semiconductor storage device according to a sixth embodiment of the invention.

FIG. 8 shows a semiconductor storage device according to a sixth embodiment of the invention. In this semiconductor storage device, two memory cell groups 1500, 1501 are connected to an ordinary latch circuit.

Here, the memory cells are set to P-channel type, and the transistor combined therewith is set to N-channel type. However, if the memory cells are N-channel type, then the transistor combined therewith is set to P-channel type. In a different way, the memory cells and the transistor may be set to the same channel type, where their gate signals are isolated from each other to use inverted signals as the respective gate signals, though the circuit thereof becomes somewhat complicated.

Here, the memory cell group shown in the first embodiment (FIG. 1) is used. However, the memory cell group shown in the second embodiment (FIG. 2) may also be used.

As to information to be stored in memory cells, 1-bit information is stored in the two memory cell groups 1500, 1501. To store data 1, the first memory cell group 1500 is assigned as write cells, while the second memory cell group 1501 is assigned as erase cells. Upon start-up of power supply, a current flows through the second memory cell group 1501, so that the node 1503 turns into High and the node 1502 turns into Low. This causes the output DATA to turn into High (data 1).

To store data 0, on the other hand, the first memory cell group 1500 is assigned as erase cells, while the second memory cell group 1501 is assigned as write cells. Upon start-up of power supply, a current flows through the first memory cell group 1500, so that the node 1502 turns into High and the node 1503 turns into Low. This causes the output DATA to turn into Low (data 0).

This method has an advantage that the data can be outputted only by starting up the power supply without any need for using such gate signals as described in the third embodiment.

In brief, this semiconductor storage device has a first inverter 1504 and a second inverter 1505, which constitute a latch circuit by connection of their outputs and inputs. Both one end of the first memory cell group 1500 and one end of the second memory cell group 1501 are connected to a first power supply. The other end of the first memory cell group 1500 is connected to the input side of the first inverter 1504. The other end of the second memory cell group 1501 is connected to the input side of the second inverter 1505.

As stated above, the semiconductor storage device has the first inverter 1504 and the second inverter 1505, which constitute a latch circuit by connection of their outputs and inputs. This makes it possible to easily read out 1-bit data stored in the two memory cell groups 1500, 1501 with a high yield by using the two inverters 1504, 1505 only. Also, without any need for using any timing signal, the data can be outputted only by starting up the power supply.

Seventh Embodiment

Figure 9:
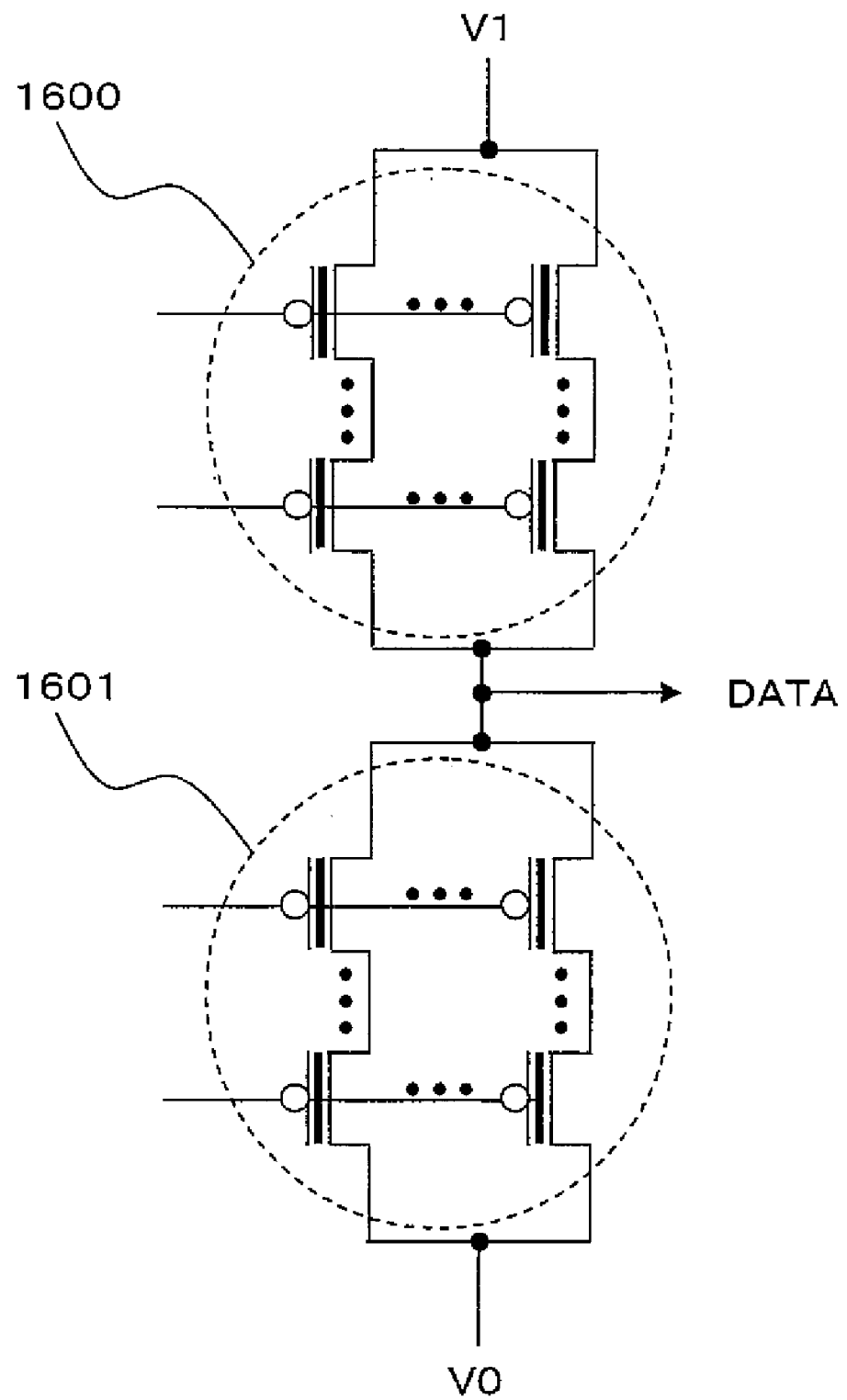
FIG. 9 shows a semiconductor storage device according to a seventh embodiment of the invention.

FIG. 9 shows a semiconductor storage device according to a seventh embodiment of the invention. Two memory cell groups 1600, 1601 are connected to separate power supplies V1, V0, respectively. The output DATA of memory cell groups 1600, 1601 are connected in common. In this embodiment, the memory cell group shown in the first embodiment (FIG. 1) is used. However, the memory cell group shown in the second embodiment (FIG. 2) may also be used.

As to information to be stored in memory cells, 1-bit information is stored by the two memory cell groups 1600, 1601. To store data 1, the first memory cell group 1600 is assigned as erase cells, while the second memory cell group 1601 is assigned as write cells. Upon start-up of the power supplies V1, V0, a current flows through the first memory cell group 1600. This causes the output DATA to be V1 (data 1).

To store data 0, on the other hand, the first memory cell group 1600 is assigned as write cells, while the second memory cell group 1601 is assigned as erase cells. Upon start-up of the power supplies V1, V0, a current flows through the second memory cell group 1601. This causes the output DATA to be V0 (data 0).

This method has an advantage that data are outputted only by starting up the power supplies without any need for using such gate signals as described in the third embodiment.

Since 1 bit is stored in two memory cell groups, a yield $\epsilon4$ can be expressed by the following Equation (6) in the cases of the fourth, sixth and seventh embodiments, and by the following Equation (7) in the case of the second embodiment.

$$\epsilon4=1-(1-(1-(1-e)^n)^m)\cdot(1-p^n)^m \quad (6)$$

$$\epsilon1=1-(1-(1-(1-p)^m)^n)\cdot(1-e^m)^n \quad (7)$$

In either case, if e=p=1% and n=m=2 (4 memory cells), then $\epsilon4\approx0.0596\%$, showing that the failure rate becomes at least about 1/33, in comparison with that of storage into one memory cell. Further, if e=p=1% and n=m=3 (9 memory cells), then $\epsilon4\approx0.00292\%$, showing that the failure rate can be reduced to about 1/680 in comparison with that of storage into one memory cell.

In brief, in this semiconductor storage device, one end of the first memory cell group 1600 is connected to the first power supply V1, and one end of the second memory cell group 1601 is connected to the second power supply V0. The other ends of the first memory cell group 1600 and the other end of the second memory cell group 1601 are connected to each other.

This makes it possible to easily read out 1-bit data stored in the two memory cell groups 1600, 1601 with a high yield by using the two kinds of power supplies V1, V0 only. Also, data are outputted only by starting up the power supplies without any need for using any timing signal.

Eighth Embodiment

Figure 10:
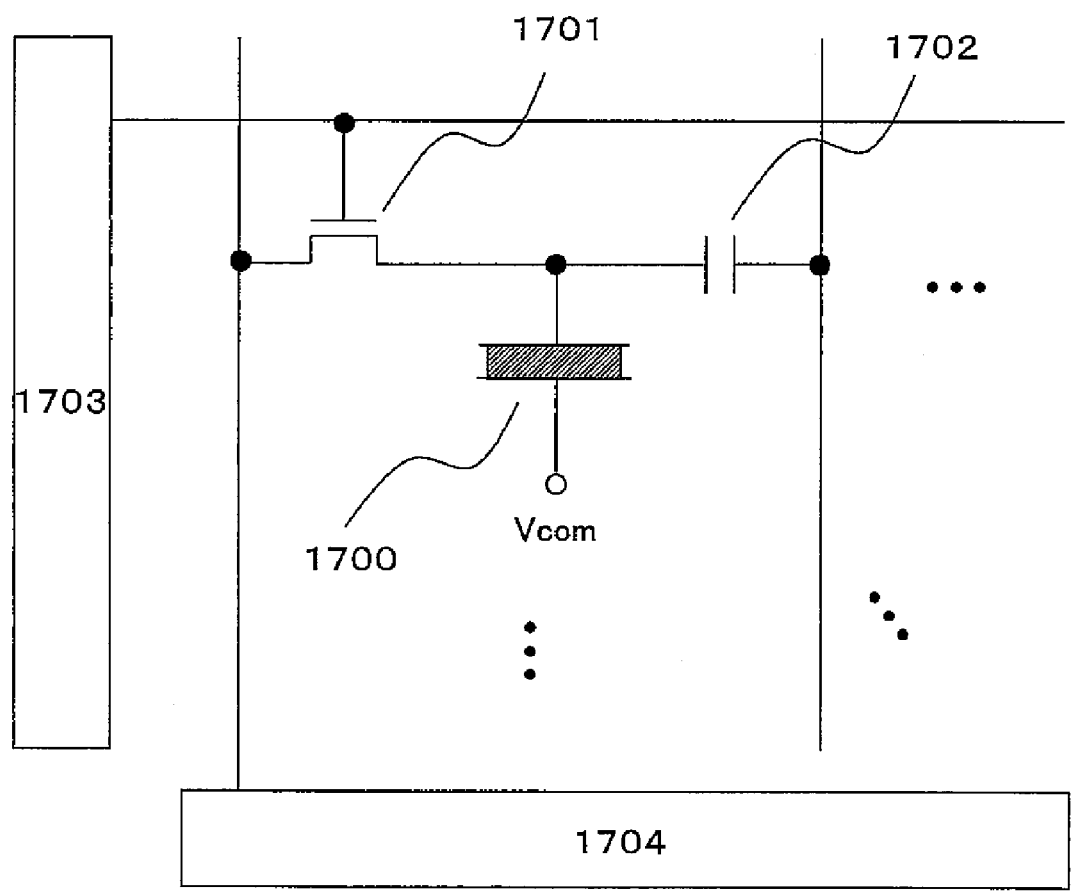
FIG. 10 shows a block diagram of a liquid crystal panel served as electronic equipment according to an eighth embodiment of the invention.
Figure 11:
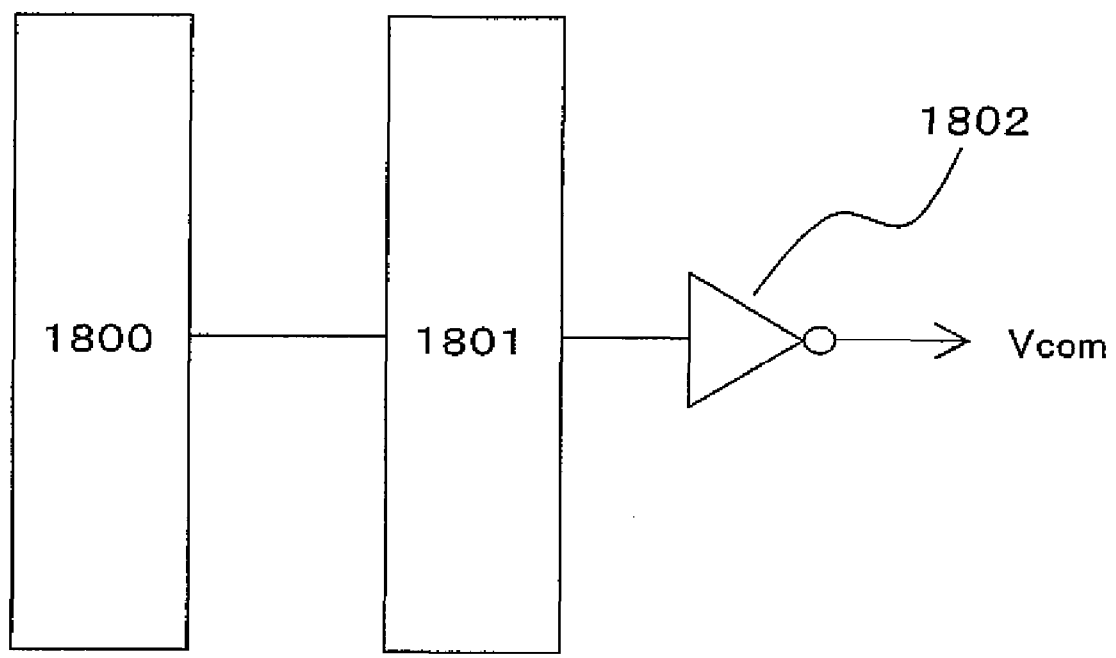
FIG. 11 shows a block diagram of a Vcom voltage generator section used in the liquid crystal panel.

FIG. 10 shows a block diagram of a liquid crystal panel served as electronic equipment according to an eighth embodiment of the invention. FIG. 11 shows a block diagram of a Vcom voltage generator section used for the liquid crystal panel. The liquid crystal panel includes a nonvolatile memory as a semiconductor storage device of the invention. Digital data for Vcom adjustment is stored in the nonvolatile memory.

As shown in FIG. 10, the liquid crystal panel has a liquid crystal pixel 1700, a TFT (Thin Film Transistor) 1701 and an additional capacitance 1702, which are arranged in an array form. The liquid crystal panel also has a gate driver 1703 for driving the gate of the TFT 1701, and a source driver 1704 connected to the source of the TFT 1701.

When the TFT 1701 selected by the gate driver 1703 turns on, data is temporarily stored in the additional capacitance 1702 from the source driver 1704 via the TFT 1701. To prevent deterioration of the liquid crystal pixel 1700, data of a high voltage VH are given in a first half (positive field) of 1 frame, while data of a low voltage VL are given in a second half (negative field) of 1 frame. To prevent screen flicker, a voltage of (VH+VL)/2, as a reference voltage, is given to Vcom. However, Vcom needs to be set for each of liquid crystal panels because there is manufacturing variation in the parasitic capacitance between gate and source of the TFT.

As shown in FIG. 11, therefore, the Vcom voltage generator section allows an adjustment value to be stored in a memory section 1800 as a nonvolatile memory. Then the adjustment value is outputted as Vcom via a D/A converter (digital/analog converter) 1801 and a Vcom driver 1802. The memory section 1800 is required to be highly reliable so as to retain the Vcom adjustment value for a long period.

In this embodiment, the nonvolatile memory adopts a technique of storing 1-bit data in the memory cell group where respective memory cells are arrayed in series or in parallel. Therefore, even if the respective memory cells are high in failure rate or even if the characteristics of the respective memory cells are changed after the shipping of products, it is possible to suppress the failure rate of the memory section 1800 into a low one and to increase the yield at the time of shipping. Also, it is possible to maintain accurate information read from memory cells for prolonged time after the shipping of products.

Thus, high reliability can be obtained for electronic equipment provided with any one of the semiconductor storage devices according to the first to seventh embodiments. In addition, the semiconductor storage device can be applied to every type of electronic equipment including digital cameras and portable telephones, digital audio recorders and music recording/reproducing equipment, and the like without being limited to liquid crystal panels.

Ninth Embodiment

Figure 12:
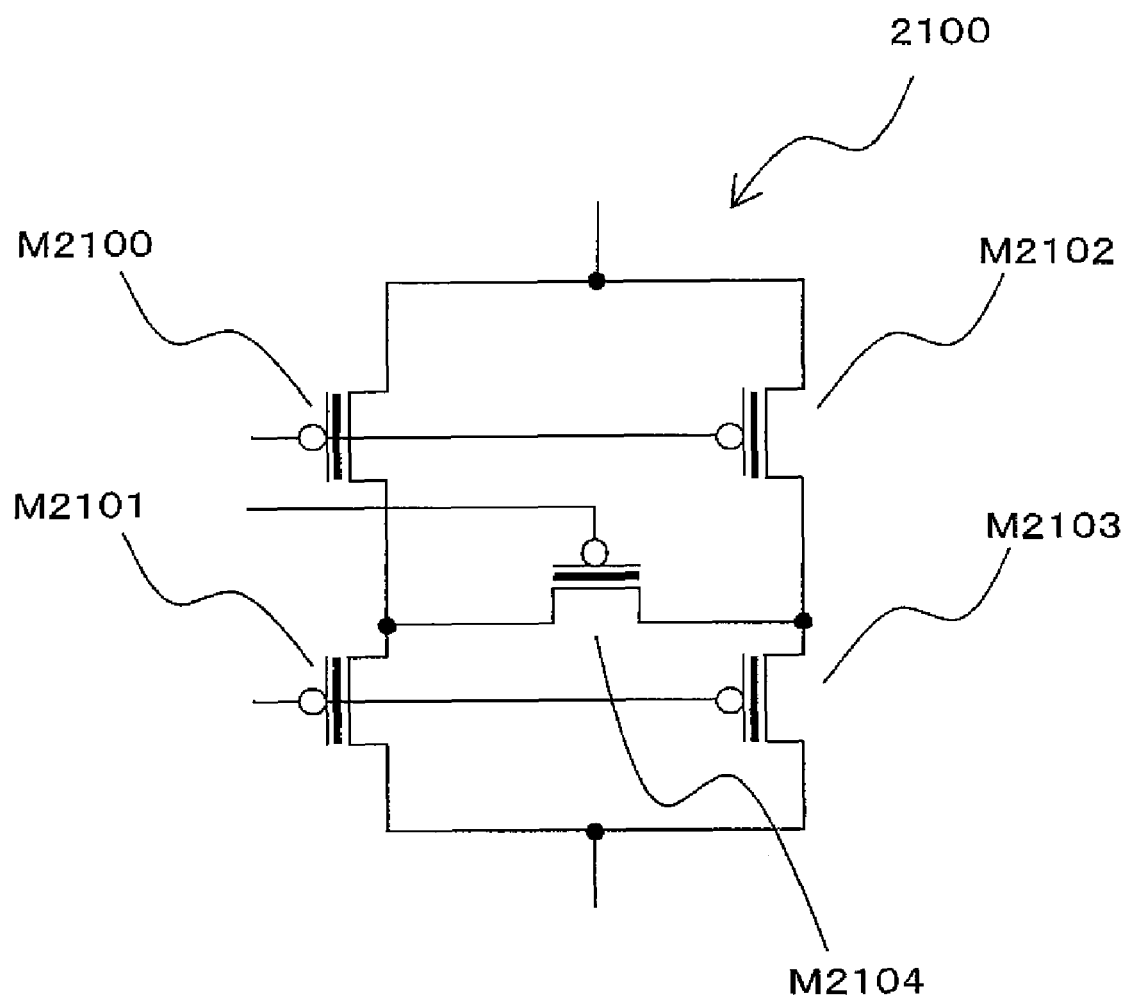
FIG. 12 shows a semiconductor storage device according to a ninth embodiment of the invention.

FIG. 12 shows a semiconductor storage device according to a ninth embodiment of the invention. In this semiconductor storage device, two memory cells M2100 and M2101 are connected in series to form a first memory cell column (memory cells M2100, M2101), while two memory cells M2102 and M2103 are connected in series to form a second memory cell column (memory cells M2102, M2103). The first memory cell column and the second memory cell column are connected in parallel to each other.

An intermediate node is formed between the two memory cells M2100, M2101 within the first memory cell column. An intermediate node is also formed between the two memory cells M2102, M2103 within the second memory cell column.

The intermediate node of the first memory cell column and the intermediate node of the second memory cell column are connected to each other via another memory cell M2104, so that a memory cell group 2100 is formed by all of the memory cells M2100 to M2104. One-bit information is to be stored in this memory cell group 2100.

As with the first embodiment, assuming that a memory cell is initially in the erase state where a current flows therethrough, and this state is defined as data 0. By a write operation, a memory cell is put into a write state where no current flows therethrough, and this state is defined as data 1.

Assuming that an erase failure rate (including a probability of initially being out of the erase state) is "e" and that a write failure rate of the memory cells is "p", a failure rate 80 for storage of 1 bit in one memory cell can be expressed by the following Equation (8):

$$\epsilon0=1-(1-e)\cdot(1-p) \quad (8)$$

Therefore, if e=p=1%, then it follows that $\epsilon0=1.99\%$.

Accordingly, when all the data of five memory cells are set to 0 by using the construction of the invention shown in FIG. 12, an erase failure rate "$\epsilon1e$" as a memory cell group is expressed by the following Equation (9):

$$\epsilon1e=(1-e)(1-(1-e)2)2+e(1-(1-e2)2) \quad (9)$$

and when all the data are set to 1, a write failure rate "$\epsilon1p$" as a memory cell group is expressed by the following Equation (10):

$$\epsilon1p=p(1-(1-p)2)2+(1-p)(1-(1-p2)2) \quad (10)$$

If e=p=1%, then $\epsilon 1e=\epsilon 1p=0.0202\%$, showing that the failure rates become at least about 1/100 in comparison with those of storage into one memory cell.

Figure 13:
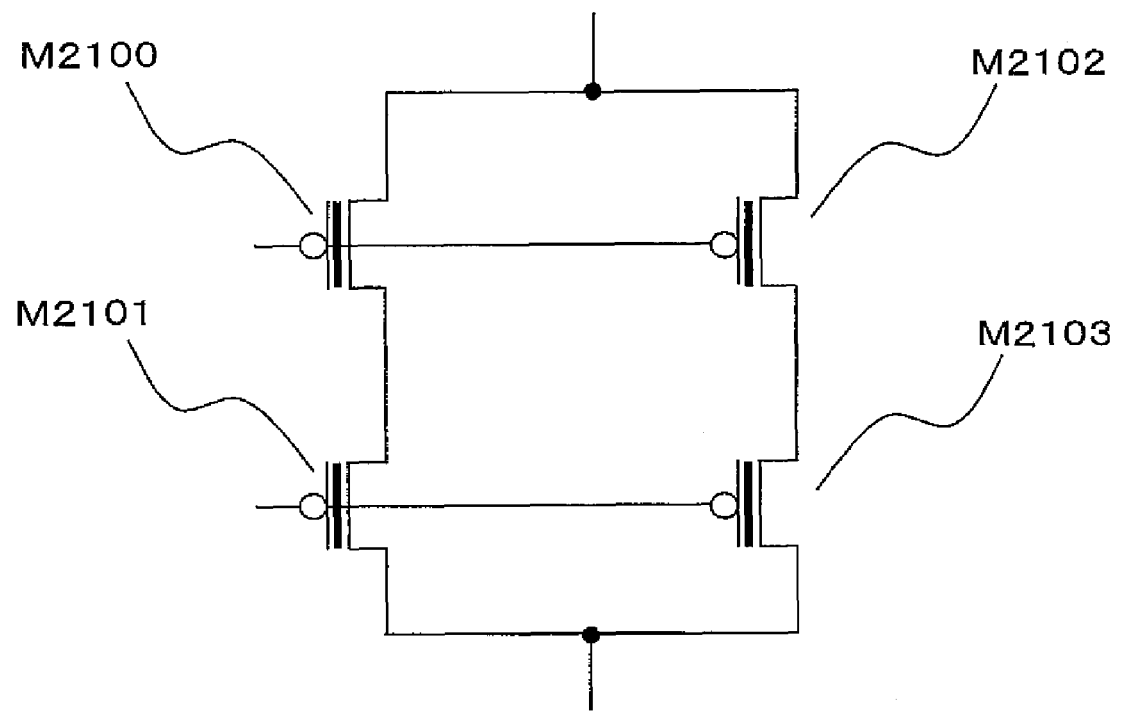
FIG. 13 shows a semiconductor storage device which has disadvantage in erase failure.

On the other hand, when the memory cell group has not the memory cell M2104 of FIG. 12 as shown in FIG. 13, an erase failure rate "$\epsilon 2e$" and a write failure rate "$\epsilon 2p$" are as expressed by the following Equations (11) and (12), respectively:

$$\epsilon 2e=(1-(1-e)2)2 \qquad (11)$$

$$\epsilon 2p=1-(1-p2)2 \qquad (12)$$

Therefore, if e=p=1%, then $\epsilon 2e\approx 0.0396\%$ and $\epsilon 2p\approx 0.0200\%$, showing that the failure rates for data 0 become about two times higher.

Figure 14:
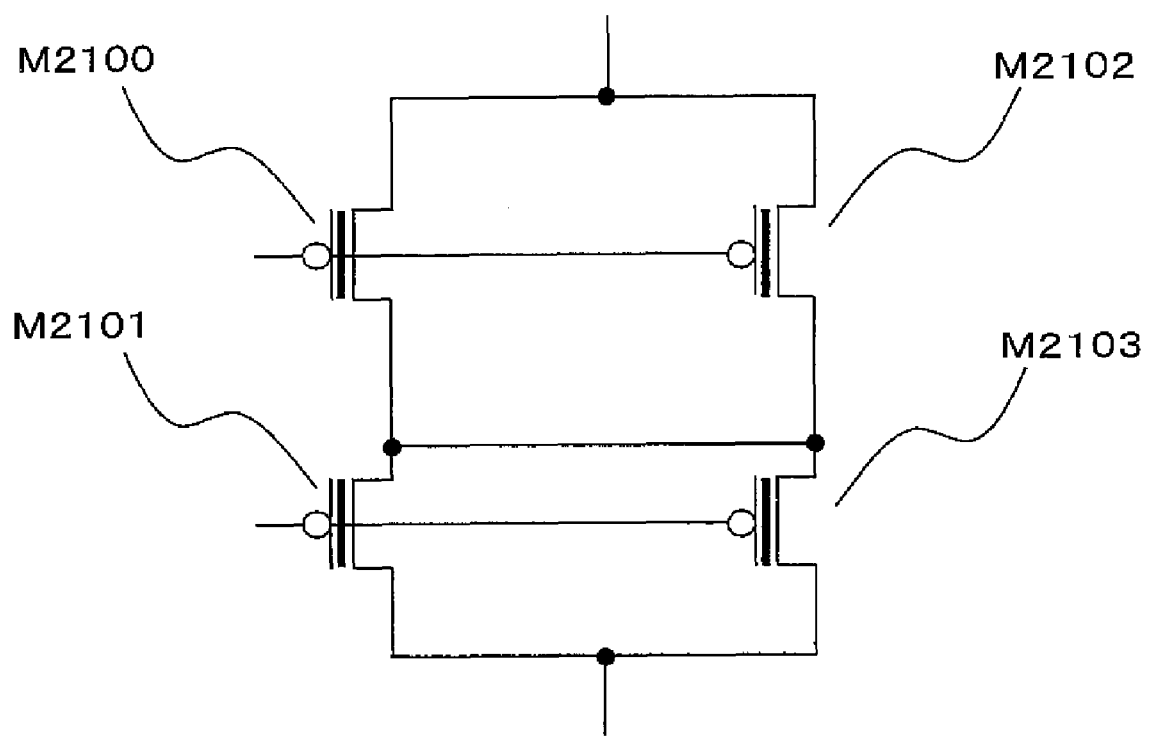
FIG. 14 shows a semiconductor storage device which has disadvantage in write failure.

Further, when the memory cell group has not the memory cell M2104 of FIG. 12 and instead is short-circuited as shown in FIG. 14, an erase failure rate "$\epsilon 3e$" and a write failure rate "$\epsilon 3p$" are as expressed by the following Equations (13) and (14), respectively:

$$\epsilon 3e=1-(1-e2)2 \qquad (13)$$

$$\epsilon 3p=(1-(1-p)2)2 \qquad (14)$$

Therefore, if e=p=1%, then $\epsilon 2e\approx 0.0200\%$ and $e2p\approx 0.0396\%$, showing that the failure rates for data 1 become about two times higher.

In the case of using the construction of the invention shown in FIG. 12, when the memory cell M2104 is in the write state, no current flows therethrough, resulting in an equivalent circuit to the circuit shown in FIG. 13. Therefore, the construction is turned into an advantageous one for data 1 (where all the memory cells are in the write state). When the memory cell M2104 is in an erase state, a current flows therethrough, resulting in an equivalent circuit to the circuit shown in FIG. 14. Therefore, the construction is turned into an advantageous one for data 0 (where all the memory cells are in the erase state). Thus, the failure rates can be lowered in a self-alignment way. Also, the memory cell group 2100, which allows the failure rates to be lowered in the self-alignment way, can be formed by five memory cells M2100-M2104, so that the circuit can be made small in size.

Tenth Embodiment

Figure 15:
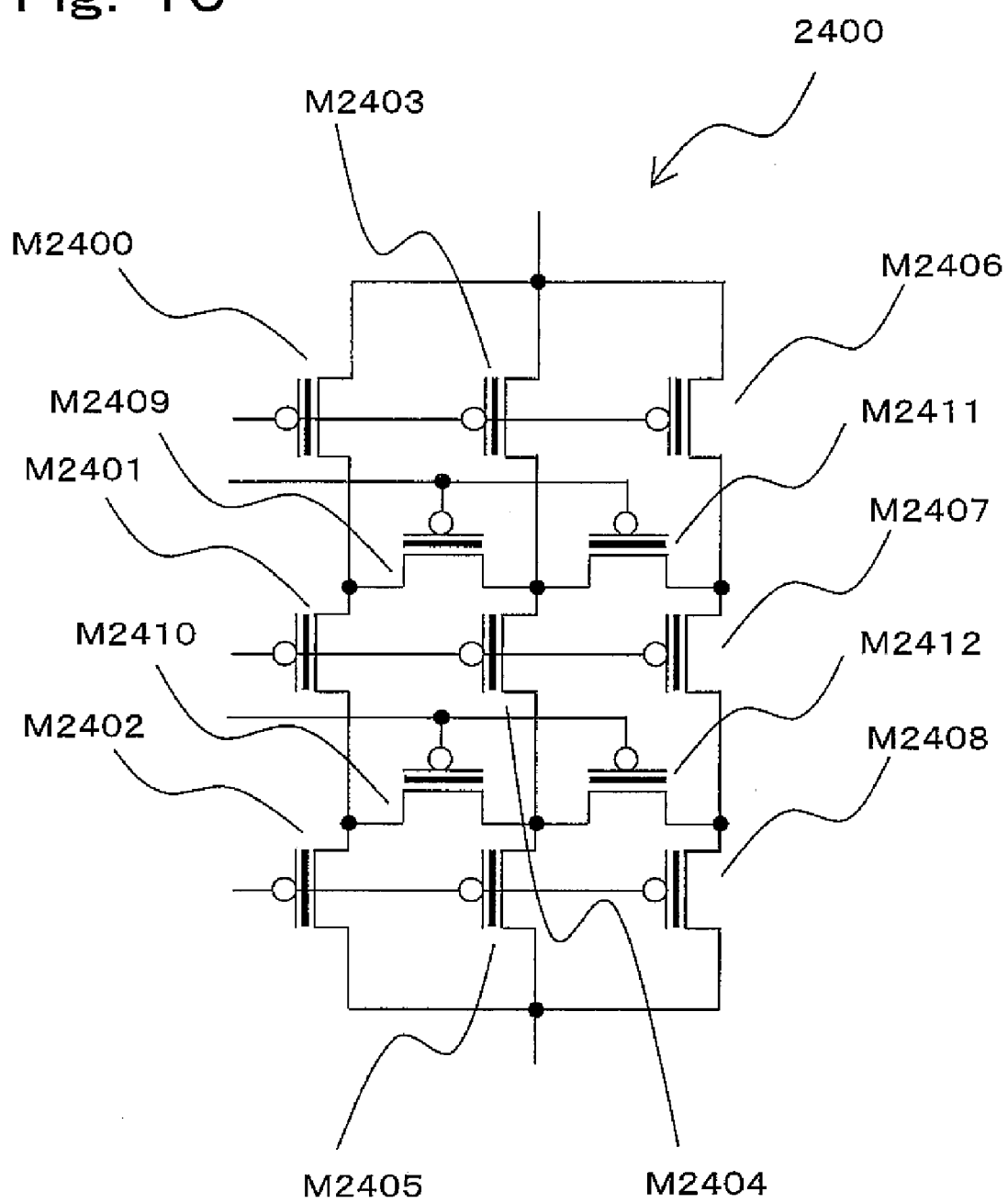
FIG. 15 shows a semiconductor storage device according to a tenth embodiment of the invention.

FIG. 15 shows a semiconductor storage device according to a tenth embodiment of the invention. In this semiconductor storage device, three respective memory cells M2400 to M2402, M2403 to M2405, M2406 to M2408 are connected in series to form a first memory cell column (memory cells M2400 to M2402), a second memory cell column (memory cells M2403 to M2405) and a third memory cell column (memory cells M2406 to M2408), where the first memory cell column, the second memory cell column and the third memory cell column are connected sequentially in parallel.

Referring to the first memory cell column, a first intermediate node is formed between a first memory cell M2400 and a second memory cell M2401, as counted in one direction. A second intermediate node is formed between the second memory cell M2401 and a third memory cell M2402, as counted in the one direction.

Referring to the second memory cell column, a first intermediate node is formed between a first memory cell M2403 and a second memory cell M2404, as counted in the one direction. A second intermediate node is formed between the second memory cell M2404 and a third memory cell M2405, as counted in the one direction.

Referring to the third memory cell column, a first intermediate node is formed between a first memory cell M2406 and a second memory cell M2407, as counted in the one direction, and a second intermediate node is formed between the second memory cell M2407 and a third memory cell M2408, as counted in the one direction.

The first intermediate node of the first memory cell column and the first intermediate node of the second memory cell column are connected to each other via another memory cell M2409. The second intermediate node of the first memory cell column and the second intermediate node of the second memory cell column are connected to each other via another memory cell M2410.

The first intermediate node of the second memory cell column and the first intermediate node of the third memory cell column are connected to each other via another memory cell M2411. The second intermediate node of the second memory cell column and the second intermediate node of the third memory cell column are connected to each other via another memory cell M2412.

A memory cell group 2400 is formed by all the memory cells M2400 to M2412. One-bit information is to be stored in this memory cell group 2400.

As with the first and ninth embodiments, assuming that a memory cell is initially in the erase state where a current flows therethrough, and this state is defined as data 0. By a write operation, a memory cell is put into a write state where no current flows therethrough, and this state is defined as data 1.

When all the data of the thirteen memory cells are set to 0 by using the construction of the invention shown in FIG. 15, an erase failure rate "$\epsilon 4e$" as a memory cell group is expressed by the following Equation (15):

$$\epsilon 4e=(1-e)(1-(1-e)2)2+e(1-(1-e2)2) \qquad (15)$$

and when all the data are set to 1, a write failure rate "$\epsilon 4p$" as a memory cell group is expressed by the following Equation (16):

$$\epsilon 4p=p(1-(1-p)2)2+(1-p)(1-(1-p2)2) \qquad (16)$$

If e=p=1%, then $\epsilon 4e=\epsilon 4p\approx 0.00031\%$, showing that the failure rates become at least about 1/6400 in comparison with those of storage into one memory cell.

Figure 16:
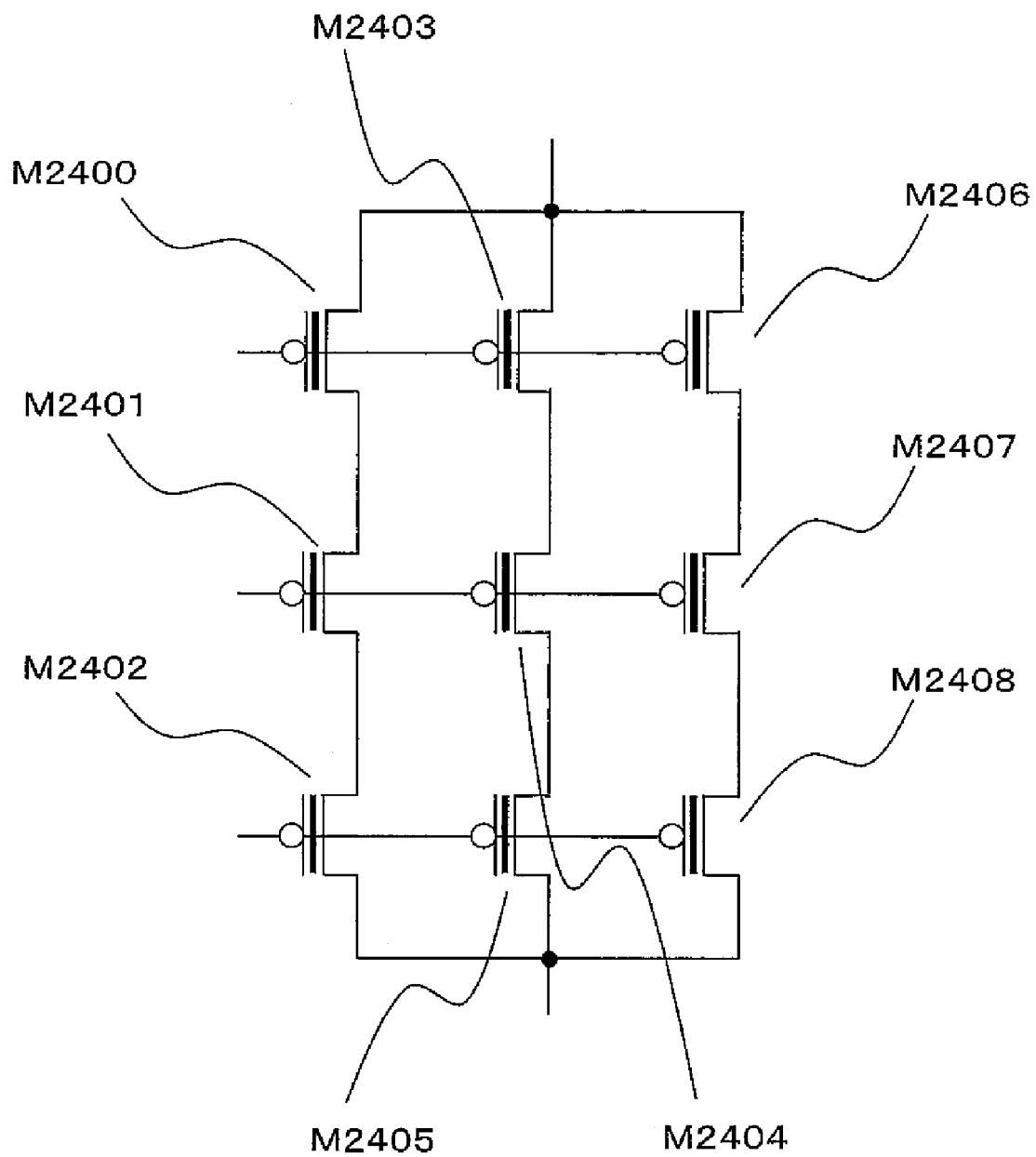
FIG. 16 shows a semiconductor storage device which has disadvantage in erase failure.

On the other hand, without the memory cells M2409 to M2412 of FIG. 15 as shown in FIG. 16, an erase failure rate "$\epsilon 5e$" and a write failure rate "$\epsilon 5p$" are as expressed by the following Equations (17) and (18), respectively:

$$\epsilon 5e=(1-(1-e)3)3 \qquad (17)$$

$$\epsilon 5p=1-(1-p3)3 \qquad (18)$$

Therefore, if e=p=1%, then $\epsilon 5e\approx 0.00262\%$ and $\delta 5p\approx 0.00030\%$, showing that the failure rates for data 0 become about nine times higher.

Figure 17:
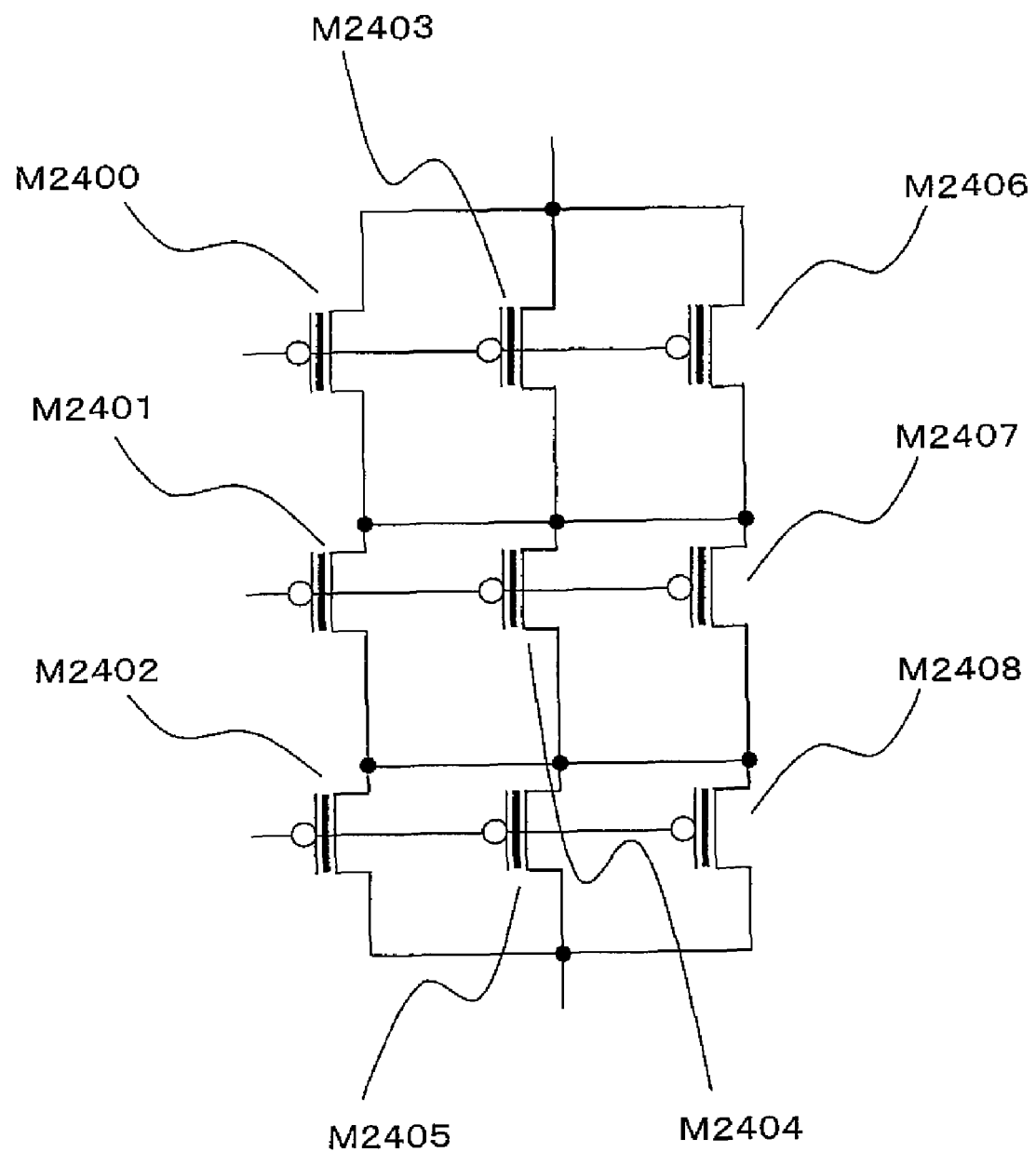
FIG. 17 shows a semiconductor storage device which has disadvantage in write failure.

Further, without the memory cells M2409 to M2412 of FIG. 15 and with the parts short-circuited as shown in FIG. 17, an erase failure rate "$\epsilon 6e$" and a write failure rate "$\epsilon 6p$" are as expressed by the following Equations (19) and (20), respectively:

$$\epsilon 6e=1-(1-e3)3 \qquad (19)$$

$$\epsilon 6p=(1-(1-p)3)3 \qquad (20)$$

Therefore, if e=p=1%, then $\epsilon 2e\approx 0.00030\%$ and $\epsilon 2p\approx 0.00262\%$, showing that the failure rates for data 1 become about nine times higher.

In the case of using the construction of the invention shown in FIG. 15, when the memory cells M2409 to M2412 are in a write state, no current flows therethrough, resulting in an equivalent circuit to the circuit shown in FIG. 16. Therefore, the construction is turned into advantageous one for data 1 (where all the memory cells are in the write state). When the memory cells M2409 to M2412 are in an erase state, a current flows therethrough, resulting in an equivalent circuit to the circuit shown in FIG. 17. Therefore, the construction is turned into advantageous one for data 0 (where all the memory cells are in the erase state). Thus, the failure rates can be lowered in the self-alignment way. Also, the memory cell group 2400, which allows the failure rates to be lowered in the self-alignment way, can be formed by thirteen memory cells M2409 to M2412, so that the circuit can be made relatively smaller in size and that the failure rates can be made very low.

Eleventh Embodiment

Figure 18:
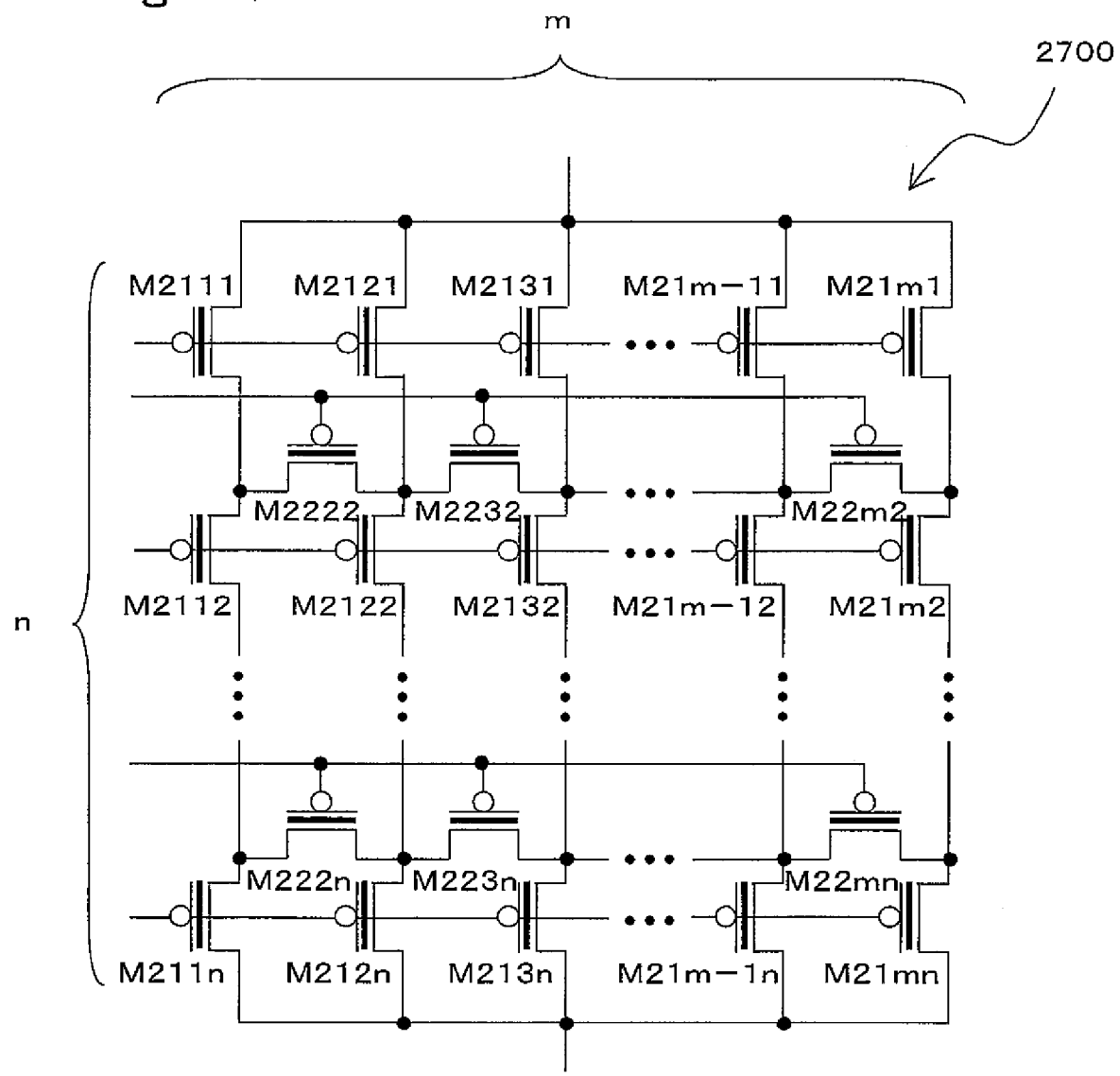
FIG. 18 shows a semiconductor storage device according to an eleventh embodiment of the invention.

FIG. 18 shows a semiconductor storage device according to an eleventh embodiment of the invention. In this semiconductor storage device, n pieces of memory cells (where n is an integer and n>1) are connected in series to form a memory cell column, and m pieces of memory cell columns (where m is an integer and m>1) are connected in parallel (memory cells M2111 to M211n, . . . , M21m1 to M21mn).

Referring to the memory cell columns lain next to each other, intermediate nodes, which are formed between the neighboring memory cells of the neighboring memory cell columns, are connected to each other via other memory cells M2222 to M222n, . . . , M22m2 to M22mn, respectively in such a way that the neighboring intermediate nodes located at same positions viewed from one side of the memory cell columns are connected to each other. The number of the other memory cells M2222 to M22mn is (n−1)×(m−1) in total.

That is to say, in mutually neighboring memory cell columns, an intermediate node of one memory cell column and its neighboring intermediate node of the other memory cell column are located at the same-numbered position as counted from one side of the memory cell columns.

A memory cell group 2700 is formed by all the memory cells M2111 to M21mn, M2222 to M22mn. One-bit information is to be stored in the memory cell group 2700.

In the eleventh embodiment also, low failure rates can be achieved, regardless of whether data is 0 or 1, as with the ninth embodiment and the tenth embodiment.

Twelfth Embodiment

Figure 19:
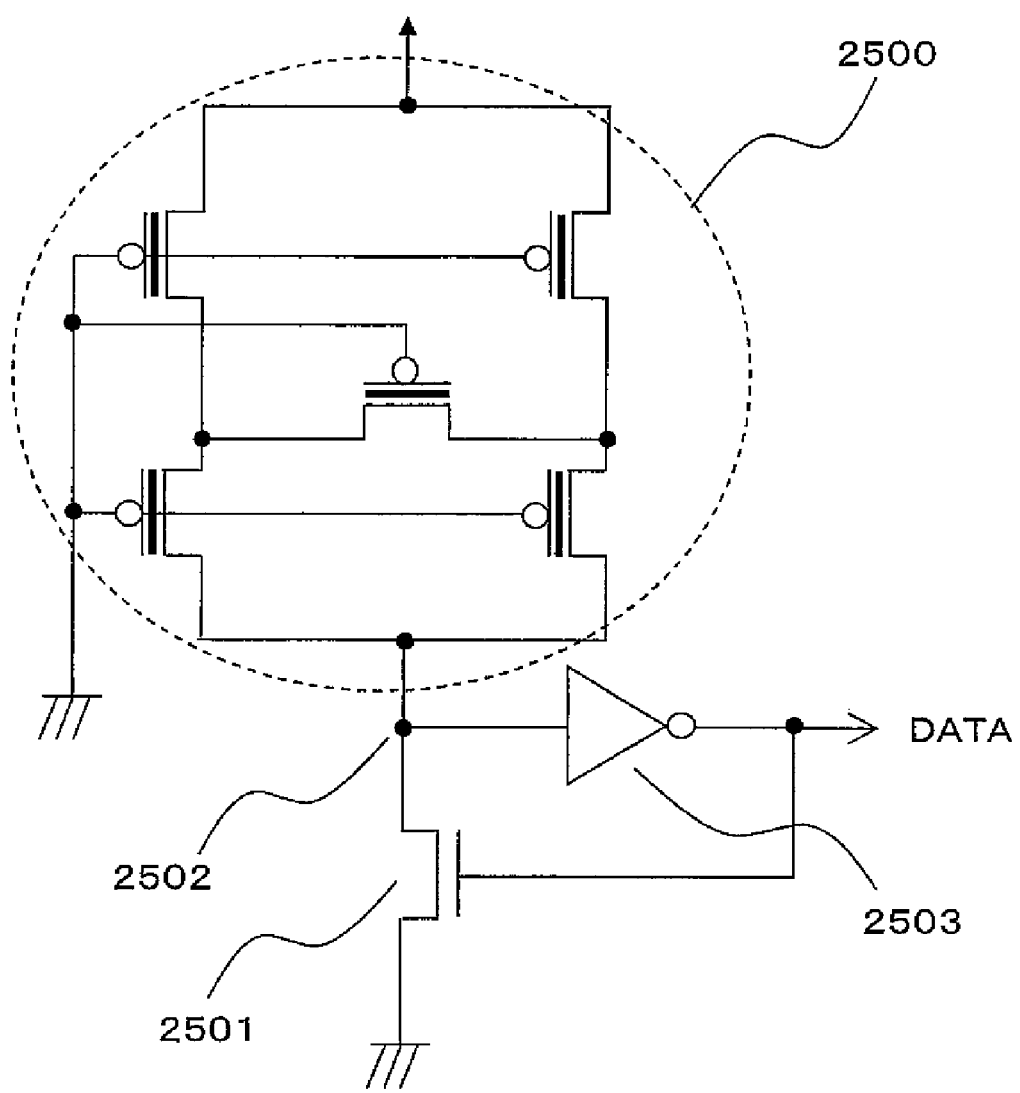
FIG. 19 shows a semiconductor storage device according to a twelfth embodiment of the invention.

FIG. 19 shows a semiconductor storage device according to a twelfth embodiment of the invention. In this semiconductor storage device, a memory cell group 2500 is connected to a node 2502 of a one-side latch circuit. The one-side latch circuit is made up of an ordinary transistor 2501 and an inverter 2503.

In this embodiment, the memory cell group shown in the ninth embodiment (FIG. 12) is used. However, the memory cell group shown in the tenth embodiment (FIG. 15) or the memory cell group shown in the eleventh embodiment (FIG. 18) may also be used.

In the present invention, information within the memory cells is automatically read out upon start-up of the power supply, and outputted as a DATA signal. How this operation goes on is explained with reference to FIGS. 20 and 21.

Figure 20:
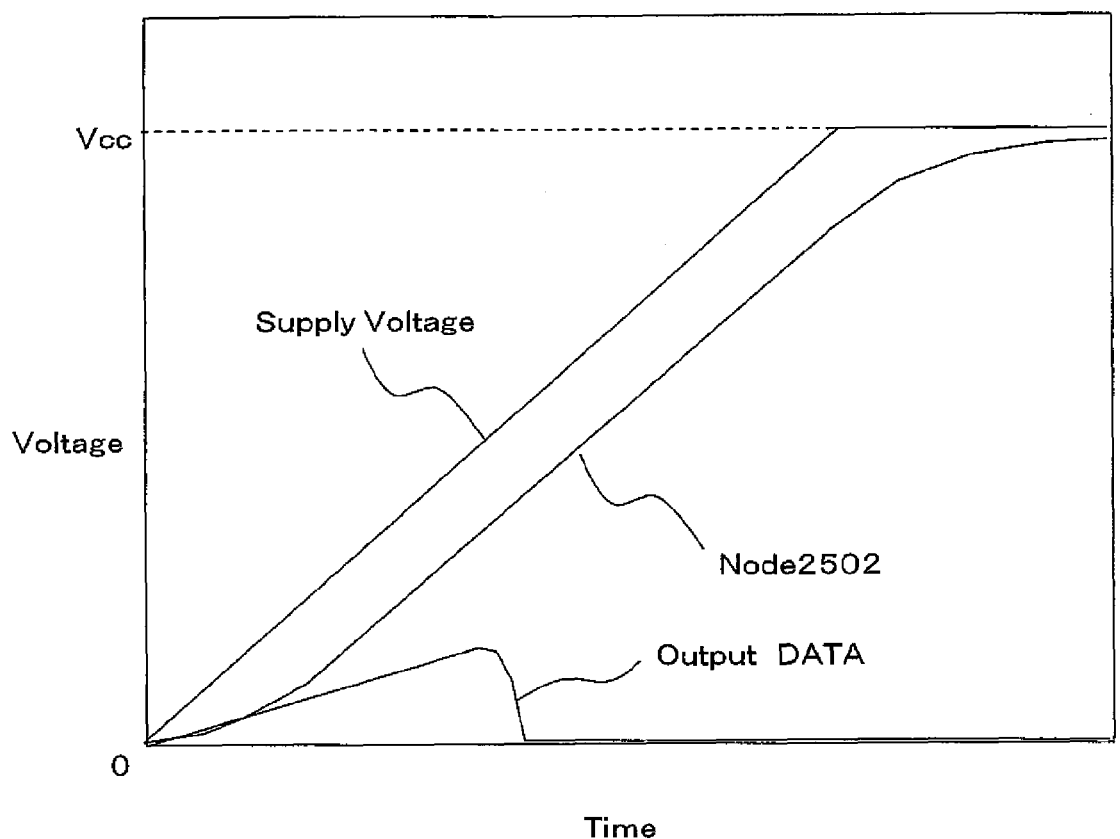
FIG. 20 is a view for explaining an operation of the semiconductor storage device when the memory cells are in an erase state.

For example, in the case where data of the memory cell group 2500 is 0, as shown in FIG. 20, when the power supply is started up, a current flows through the memory cells, so that the voltage of the node 2502 increases with increasing supply voltage. Soon, the output DATA of the inverter 2503 turns into Low, so that data 0 is read out.

Figure 21:
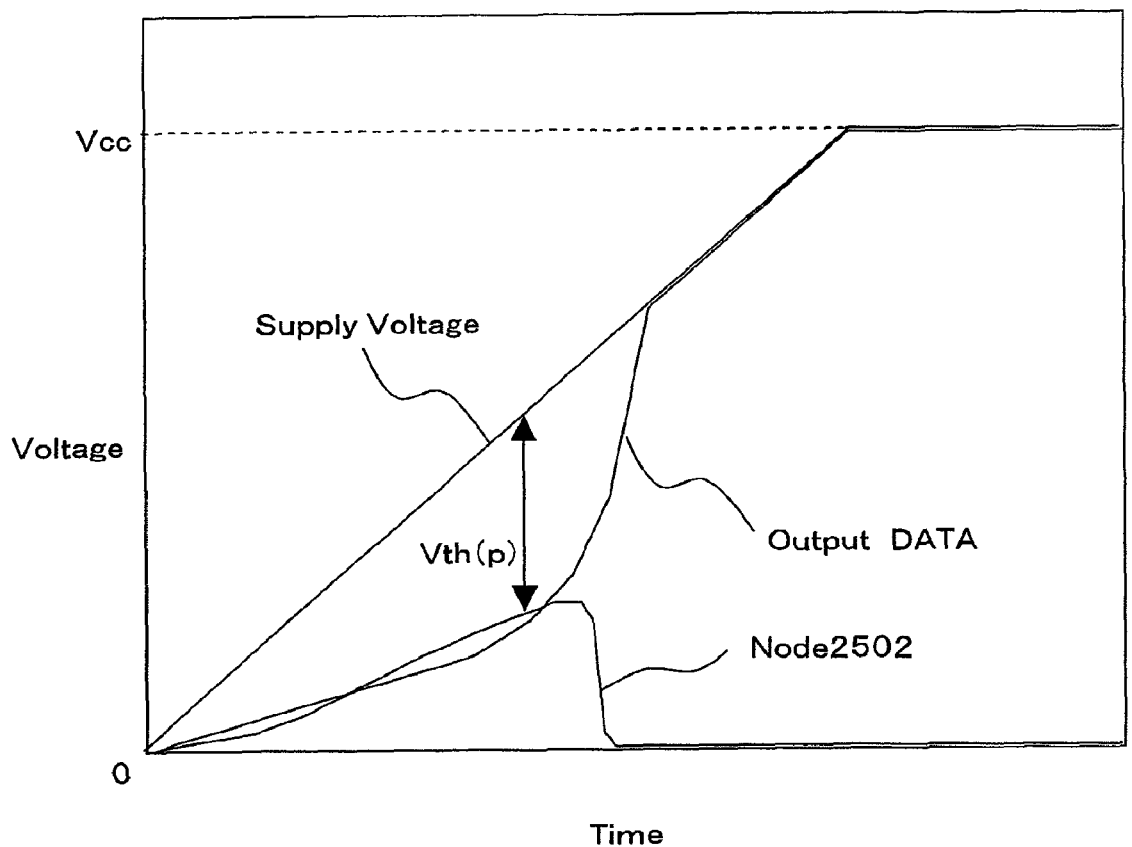
FIG. 21 is a view for explaining an operation of the semiconductor storage device when the memory cells are in a write state.

On the other hand, in the other case where the data of the memory cell group 2500 is 1, as shown in FIG. 21, even if the power supply is started up, no current flows through the memory cells, so that the voltage of the node 2502 does not increase so much (the voltage actually increases to a slight extent due to coupling of parasitic capacitance or the like as shown in the figure). Then, when the potential difference between the supply voltage and the node 2502 increases above a threshold value Vth(p) of the P-type transistor constituting the inverter, the output DATA of the inverter 2503 turns into High, so that data 1 is read out. In this way, 1-bit data stored in the memory cell group is accurately read out with a high yield (=1−ϵ1e or 1−ϵ1p) stated in the ninth embodiment.

In brief, this semiconductor storage device has the transistor 2501 and the inverter 2503, wherein one of input/output terminals of the transistor 2501 is connected to one end of the memory cell group 2500, and wherein an input terminal of the inverter 2503 is connected to the one end of the memory cell group 2500. The other end of the memory cell group 2500 is connected to a first power supply, while the other end of the transistor 2501 is connected to a ground (as an example of second power supply). The output terminal of the inverter 2503 is connected to the control gate of the transistor 2501.

As stated above, the semiconductor storage device has the transistor 2501 connected to the memory cell group 2500 and the inverter 2503 connected to the memory cell group 2500. This makes it possible to easily read out 1-bit data stored in the memory cell group 2500 with a high yield by using the one transistor 2501 and the one inverter 2503 only. Also, without any need for using any timing signal, the data can be outputted only by starting up the power supplies.

Thirteenth Embodiment

Figure 22:
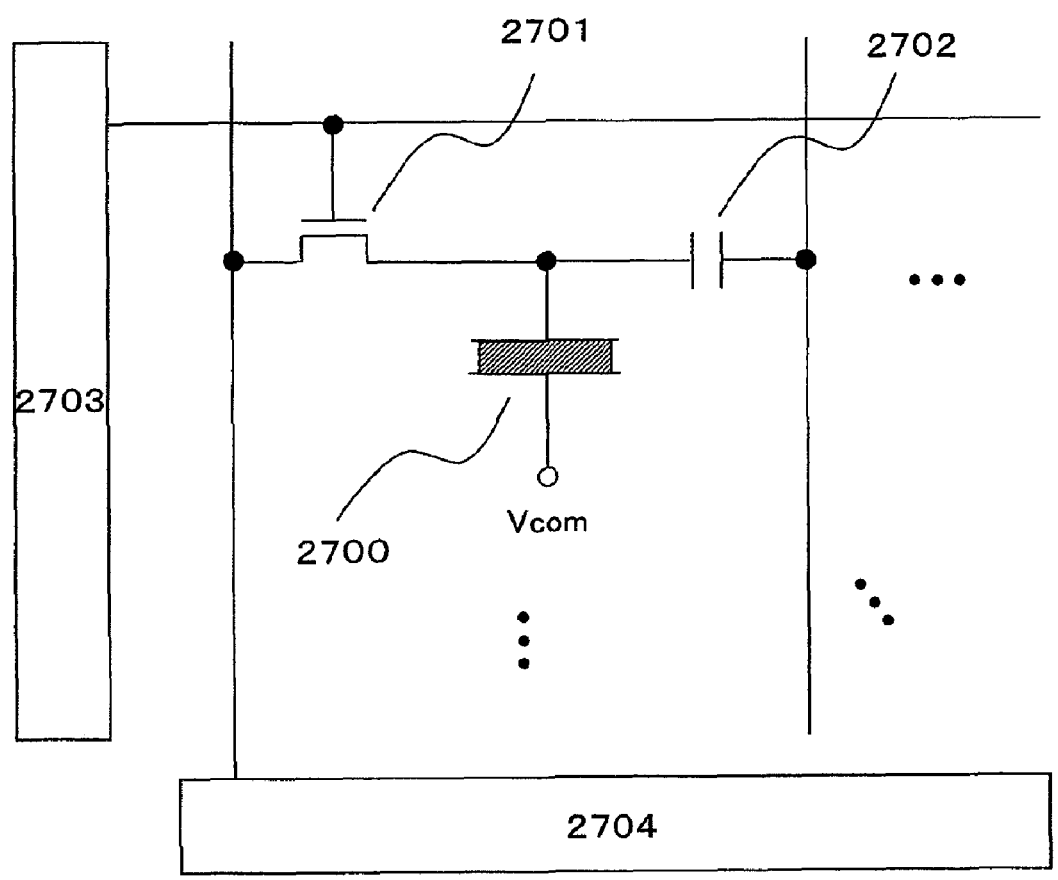
FIG. 22 shows a block diagram of a liquid crystal panel served as electronic equipment according to a thirteenth embodiment of the invention.
Figure 23:
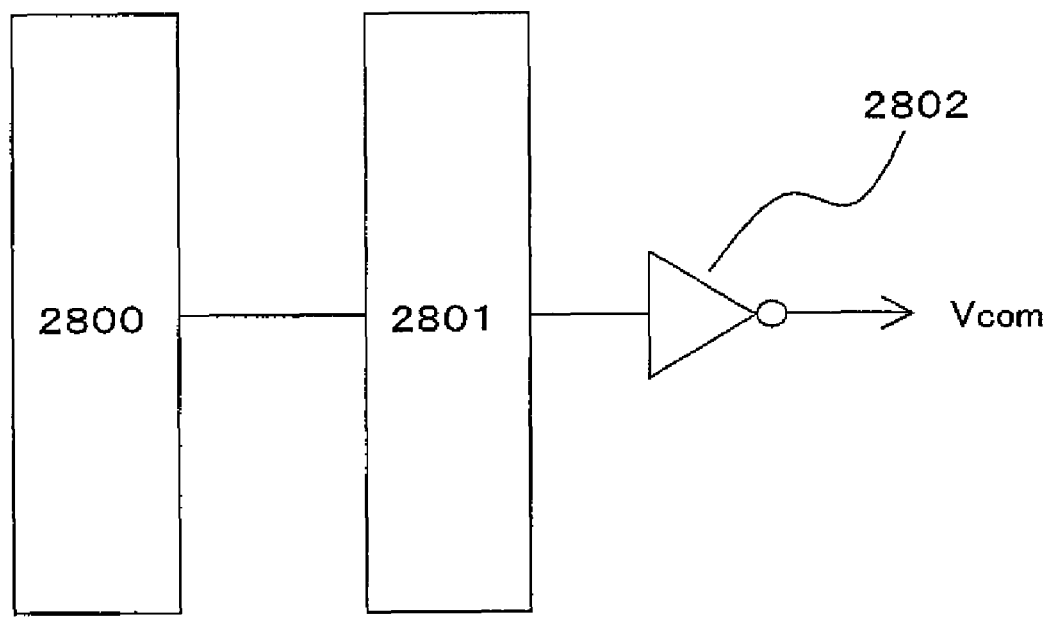
FIG. 23 shows a block diagram of a Vcom voltage generator section used in the liquid crystal panel.

FIG. 22 shows a block diagram of a liquid crystal panel served as electronic equipment according to a thirteenth embodiment of the invention. FIG. 23 shows a block diagram of a Vcom voltage generator section used in the liquid crystal panel. This liquid crystal panel is provided with a nonvolatile memory as a semiconductor storage device of the invention. Digital data for Vcom adjustment is stored in the nonvolatile memory.

As shown in FIG. 22, the liquid crystal panel has a liquid crystal pixel 2700, a TFT (Thin Film Transistor) 2701, and an additional capacitance 2702, which are arranged in an array form. Further, the liquid crystal panel has a gate driver 2703 for driving the gate of the TFT 2701, and a source driver 2704 connected to the source of the TFT 2701.

When the TFT 2701 selected by the gate driver 2703 turns on, data is temporarily stored in the additional capacitance 2702 from the source driver 2704 via the TFT 2701. To prevent deterioration of the liquid crystal pixel 2700, data of a high voltage VH is given in a first half (positive field) of one frame, and data of a low voltage VL is given in a second half (negative field) of the one frame. To prevent screen flicker, a voltage of (VH+VL)/2, as a reference voltage, is given to Vcom. However, Vcom needs to be set for each liquid crystal panel because of manufacturing variations in the parasitic capacitance between gate and source of the TFT and the like.

Thus, as shown in FIG. 23, the Vcom voltage generator section allows an adjustment value to be stored in a memory section 2800 as a nonvolatile memory, so as to be outputted as Vcom via a D/A converter (digital/analog converter) 2801 and a Vcom driver 2802. The memory section 2800 is required to retain the Vcom adjustment value for a long period and therefore needs to have high-grade reliability.

In this embodiment, the nonvolatile memory adopts a technique of storing 1-bit data in the memory cell group in which respective memory cells are arrayed in series or in parallel. Therefore, even if the respective memory cells are high in failure rate or even if the characteristics of the respective memory cells are changed after the shipping of products, it is possible to suppress the failure rate of the memory section 2800 to a low one, to increase the yield at the time of shipping, and to maintain accurate information read from memory cells for prolonged time after the shipping of products.

Therefore, electronic equipment including any one of the semiconductor storage devices according to the ninth to twelfth embodiments can achieve high reliability. In addition, the semiconductor storage device may also be applied to every type of electronic equipment including digital cameras and portable telephones, digital audio recorders and music recording/reproducing equipment, and the like without being limited to liquid crystal panels.

Fourteenth Embodiment

Figure 24:
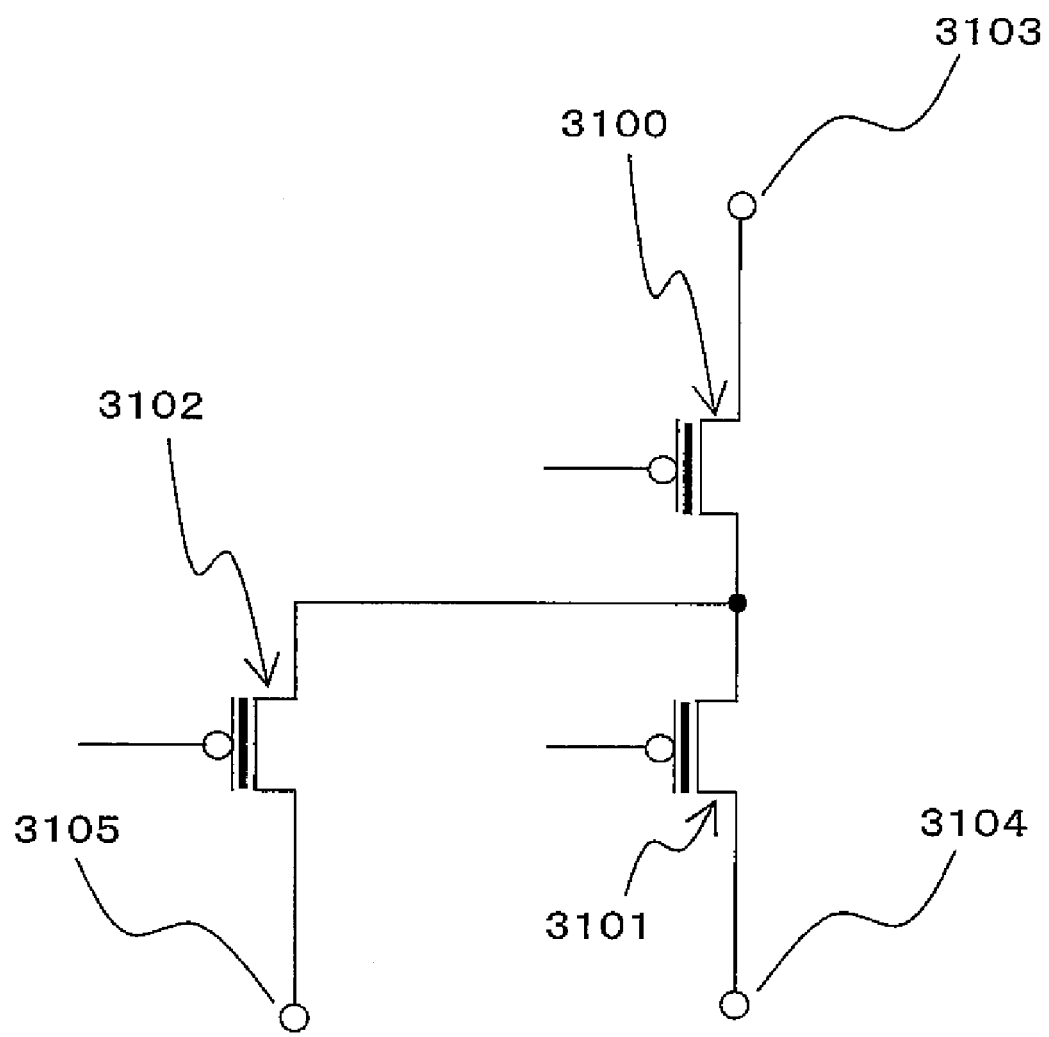
FIG. 24 shows a circuit diagram of a semiconductor storage device according to a fourteenth embodiment of the invention.

FIG. 24 shows a circuit diagram of a semiconductor storage device according to a fourteenth embodiment of the invention. This semiconductor storage device includes a first memory cell 3100 as a first memory cell section, a second memory cell 3101 as a second memory cell section, and a third memory cell 3102 as a third memory cell section. The first memory cell 3100 and the second memory cell 3101 are connected in series to each other between a first node 3103 and a second node 3104. That is, one end of the first memory cell 3100 is connected to the first node 3103, while the other end of the first memory cell 3100 is connected to one end of the second memory cell 3101. The other end of the second memory cell 3101 is connected to the second node 3104. Also, one end of the third memory cell 3102 is connected to a connecting point between the other-end drain of the first memory cell 3100 and the one end of the second memory cell 3101, while the other end of the third memory cell 3102 is connected to a third node 3105.

The first node 3103 is connected to a first power supply (not shown) from which a supply voltage Vcc (e.g., 3 V) is applied. The second node 3104 is connected to a later-described readout circuit. The third node 3105 is connected to a second power supply (not shown) from which a ground potential (e.g., 0 V) is given.

In this embodiment, 1-bit information is to be stored in a memory cell block constituted of the first to third memory cells 3100 to 3102. It is noted that each of the memory cells 3100, 3101, 3102 is formed by a nonvolatile memory.

In this embodiment, for example, in the case where information stored in the memory cell block is data 0, the first memory cell 3100 and the second memory cell 3101 are in the erase state while the third memory cell 3102 is in the write state. In this case of data 0, currents flowing through the first and second memory cells 3100, 3101 are larger than a current flowing through the third memory cell 3102. In the other case where the information to be stored in the memory cell block is data 1, the first memory cell 3100 and the second memory cell 3101 are in a write state while the third memory cell 3102 is in an erase state. In this case of data 1, currents flowing through the first and second memory cells 3100, 3101 are smaller than a current flowing through the third memory cell 3102.

In this embodiment, as described above, the second node 3104 is connected to the readout circuit so as to fulfill sensing of the current flowing through the second node 3104. In this embodiment, a current difference between erase-state and write-state current values in the memory cell block constituted of the three memory cells 3100, 3101, 3102 is set larger than current differences between erase-state and write-state current values in the respective memory cells 3100, 3101, 3102. This setting is aimed at making a margin of the readout circuit larger so as to lower the failure rate. A description in more detail will be given below.

In the fourteenth embodiment, a current I4 that flows through the second node 3104 is expressed by the following Equation (21):

$$I4 = I2/(I1+I3) \qquad (21)$$

where I1 is a current flowing with a supply voltage Vcc applied to the first memory cell 3100 alone, I2 is a current flowing with the supply voltage Vcc applied to the second memory cell 3101 alone, and I3 is a current flowing with the supply voltage Vcc applied to the third memory cell 3102 alone.

It is assumed that "Ie" is a current flowing through the first, second, third memory cells 3100, 3101, 3102 in the erase state. It is assumed that "Ip" is a current flowing therethrough in the write state. Then, in the case where information stored in the memory cell block is data 0, the first, second memory cells 3100, 3101 are in the erase state, and the third memory cell 3102 is in the write state. A current I4(0) flowing through the second node 3104 can be expressed by the following Equation (22):

$$I4(0) = Ie \cdot Ie/(Ie+Ip) \qquad (22)$$

On the other hand, in the other case where the information stored in the memory cell block is data 1, a current I4(1) that flows through the second node 3104 can be expressed by the following Equation (23):

$$I4(1) = Ip \cdot Ip/(Ip+Ie) \qquad (23)$$

In this equation, the following are given as typical values: a current Ie=40 μA that flows in the erase state, a current Ip=20 μA that flows in the write state, and an on/off ratio=Ie/Ip=2. In the case of data 0, the current I4(0) that flows through the second node 3104 is expressed by the following Equation (24) from the above Equation (22). In the case of data 1, on the other hand, the current I4(1) is expressed by the following Equation (25) from the above Equation (23).

$$I4(0) = 26.7 \, \mu A \qquad (24)$$

$$I4(1) = 6.7 \, \mu A \qquad (25)$$

Accordingly, the on/off ratio of a current flowing to the readout circuit through the second node 3104 is obtained from the above Equations (24) and (25) as shown by the following Equation (26):

$$I4(0)/I4(1) = 4 \qquad (26)$$

According to this embodiment, therefore, an on/off ratio is doubled in comparison with the ratio Ie/Ip=2 obtained in any one of the memory cells 3100, 3101, 3102. The greater the on/off ratio is, the larger the margin is in the readout circuit. In this case, the margin of the readout circuit is improved twofold.

Figure 26:
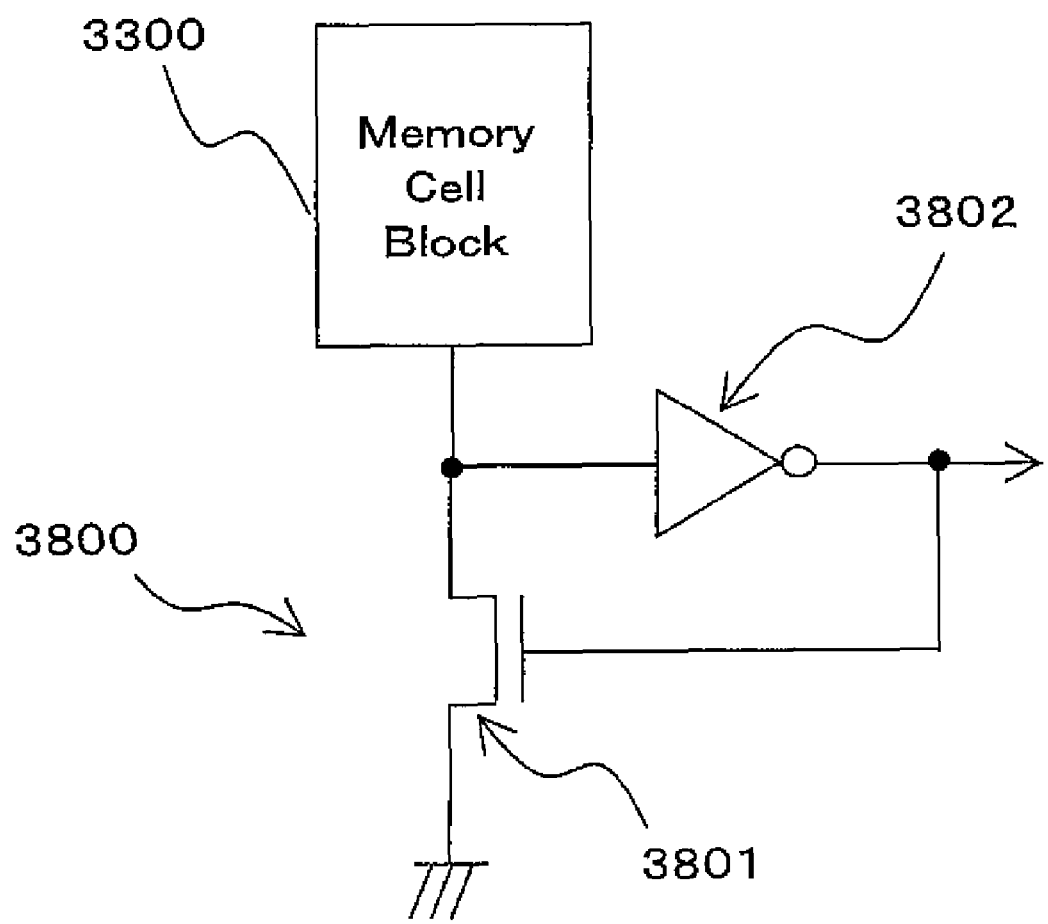
FIG. 26 shows a semiconductor storage device in which a one-side latch circuit as an example of the readout circuit is connected to a memory cell block according to the fourteenth embodiment of the invention.

The readout circuit may be a one-side latch circuit described below and shown in FIG. 26 or 34. The readout circuit may also be a current mirror circuit shown FIG. 27 or 28, which is often used in semiconductor memory. Also, the readout circuit may be a differential amplification circuit shown in FIG. 29 or 30. Further, the readout circuit is not particularly limited to one of them. The well-known circuits shown in FIGS. 27 and 29 allow the readout precision to be more easily enhanced. The circuits shown in FIGS. 28 and 30 allow the readout margin to be increased because of their complementary data reading, although the memory cells increase in total number.

Figure 27:
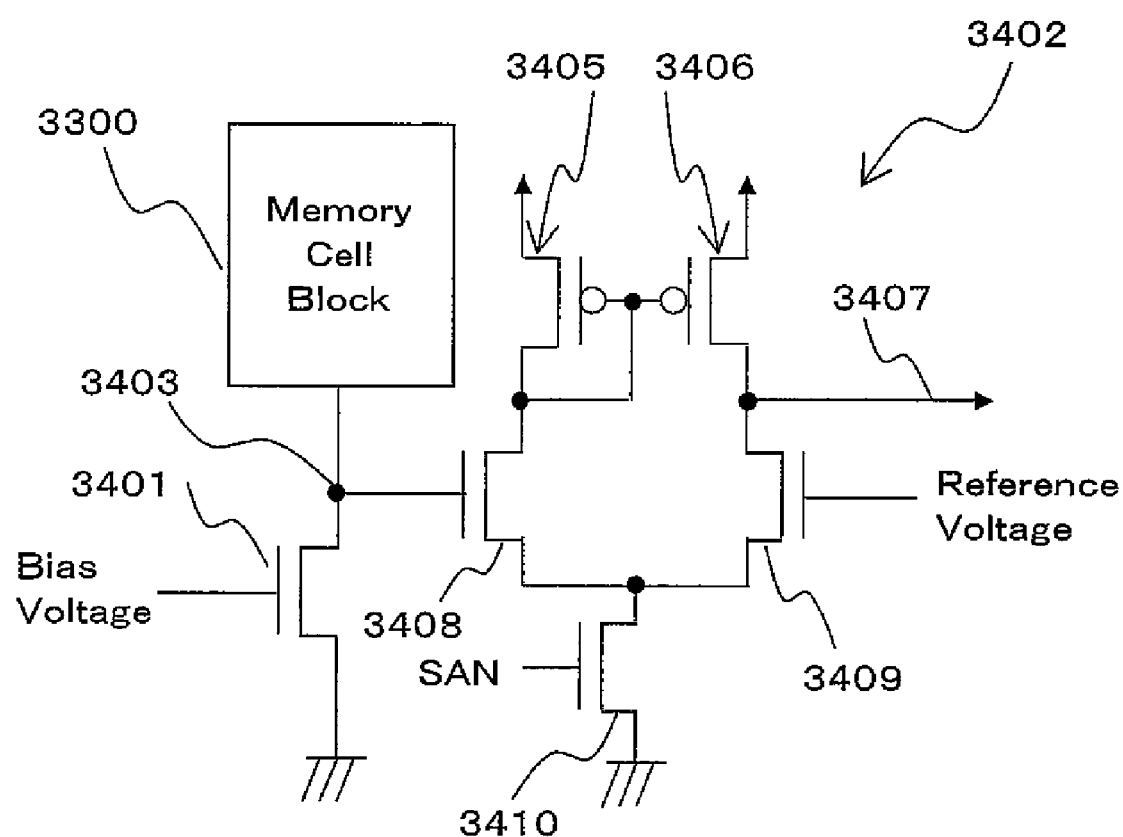
FIG. 27 shows a semiconductor storage device in which one memory cell block according to the fourteenth embodiment of the invention is connected to a current mirror circuit as an example of the readout circuit.

In a specific example of the readout circuit shown in FIG. 27, a transistor 3401 is connected to the second node 3104 (not shown in FIG. 27) of a memory cell block 3300 which is constituted of the three memory cells 3100, 3101, 3102 (not shown in FIG. 27). A bias voltage is applied to the gate of the transistor 3401. A connecting point 3403 between the second node 3104 (not shown in FIG. 27) and the transistor 3401 is connected directly to a transistor 3408 and indirectly to a current mirror circuit 3402 and a transistor 3409. This current mirror circuit 3402 allows a current responsive to the voltage of the connecting point 3403 to flow to transistors 3405, 3406. As a result, in the circuit shown in FIG. 27, current flows to an output line 3407 in response to a difference between the voltage of the connecting point 3403 inputted to the gate of the transistor 3408 and the reference voltage inputted to the gate of the transistor 3409. Thus, the voltage of the connecting point 3403 as well as the current flowing through the second node 3104 can be detected by the current flowing to the output line 3407. In addition, on/off operations of the readout circuit can be controlled by a signal SAN inputted to the gate of a transistor 3410.

Figure 29:
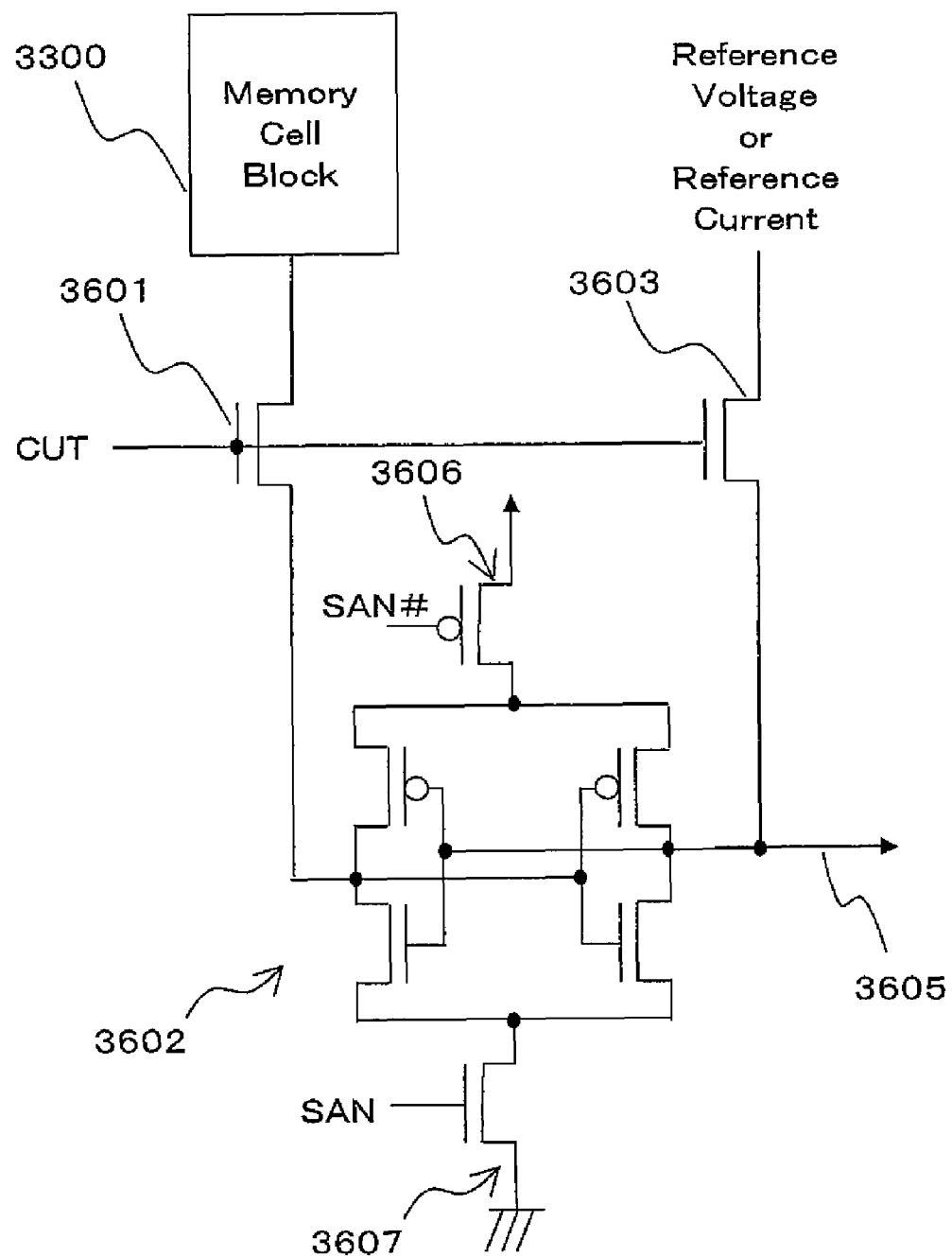
FIG. 29 shows a semiconductor storage device in which one memory cell block according to the fourteenth embodiment of the invention is connected to a differential amplification circuit as an example of the readout circuit.

In a specific example of the readout circuit shown in FIG. 29, a differential amplification circuit 3602 is connected, via a transistor 3601, to the second node 3104 of the memory cell block 3300 constituted of the three memory cells 3100, 3101, 3102. The differential amplification circuit 3602 amplifies a difference between a voltage inputted from the second node 3104 via the transistor 3601 and a voltage inputted from a transistor 3603 so as to output the resulting amplified voltage to an output line 3605. In addition, on/off operations of the readout circuit can be controlled by signals SAN#, SAN that are inputted to the gates of transistors 3606, 3607.

Figure 28:
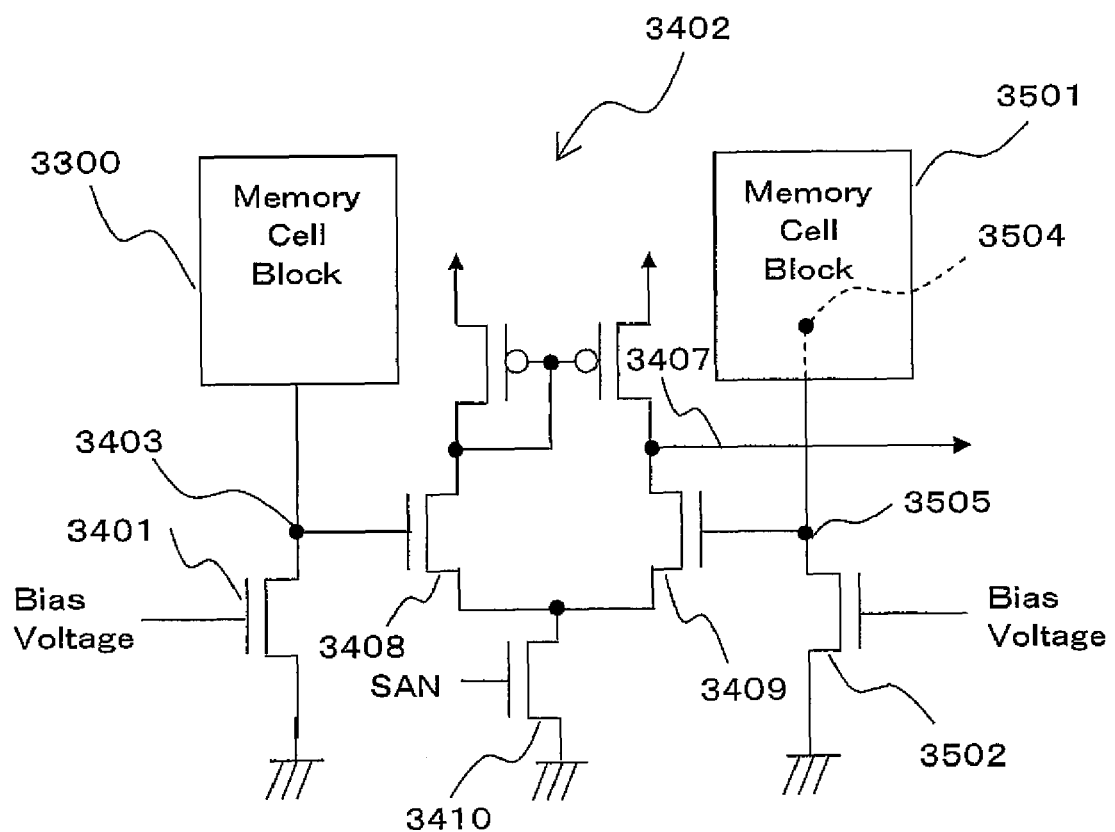
FIG. 28 shows a semiconductor storage device in which two memory cell blocks according to the fourteenth embodiment of the invention are connected to a current mirror circuit as an example of the readout circuit.

Also, a specific example of the readout circuit shown in FIG. 28 is one modification of the example shown in FIG. 27. This readout circuit differs from that of FIG. 27 in that a second node 3504 of a second memory cell block 3501 constituted of the three memory cells 3100, 3101, 3102 is connected to a transistor 3502, and in that the gate of the transistor 3409 is connected to a connecting point 3505 between the second node 3504 and the transistor 3502. In the readout circuit shown in FIG. 28, data 0 (or data 1) is stored in either one of the first and second memory cell blocks 3300, 3501, while data 1 (or data 0) is stored in the other of the two memory cell blocks. As a result, by the current mirror circuit 3402 constituting the readout circuit, data is read out complementarily from the first, second memory cell blocks 3300, 3501, thus allowing the readout margin to be increased.

Figure 30:
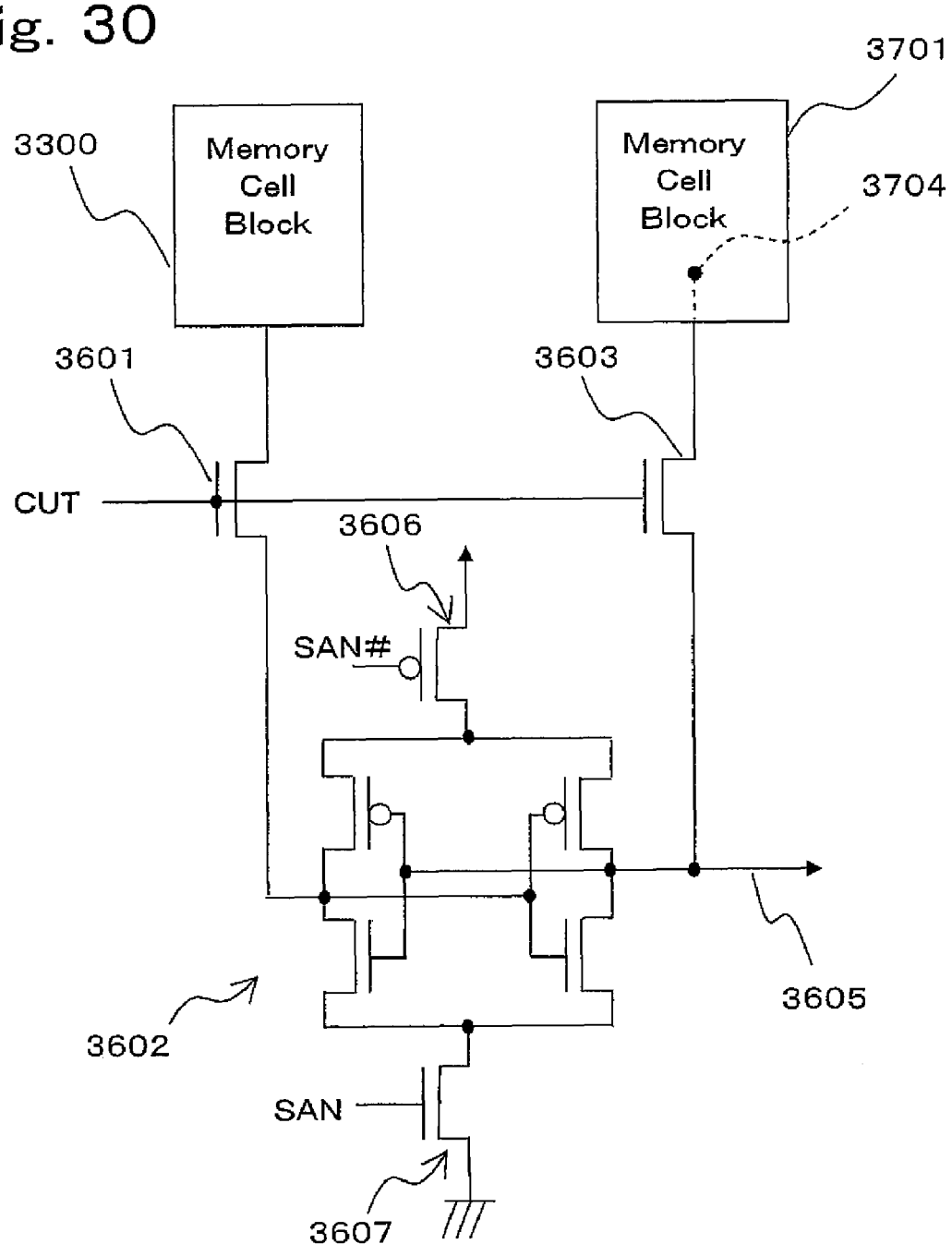
FIG. 30 shows a semiconductor storage device in which two memory cell blocks according to the fourteenth embodiment of the invention are connected to a differential amplification circuit as an example of the readout circuit.

Also, a specific example of the readout circuit shown in FIG. 30 is one modification of the example shown in FIG. 29. This readout circuit differs from that of FIG. 29 in that a second node 3704 of a second memory cell block 3701 constituted of the three memory cells 3100, 3101, 3102 is connected to a transistor 3603. In this readout circuit shown in FIG. 30, data 0 (or data 1) is stored in either one of the first and second memory cell blocks 3300, 3701, while data 1 (or data 0) is stored in the other of the two memory cell blocks. As a result, by the differential amplification circuit 3602 constituting the readout circuit, data is read out complementarily from the first, second memory cell blocks 3300, 3701, thus allowing the readout margin to be increased.

In this embodiment, the definition as to how the data 0 or 1 correspond to the erase state or the write state may be arbitrarily set as required, and this does not limit this invention. Further, the way how the large and small levels of currents flowing through the respective memory cells correspond to the erase state and the write state of the memory cells may also be arbitrarily set as required, and this does not limit this invention.

Fifteenth Embodiment

Figure 25:
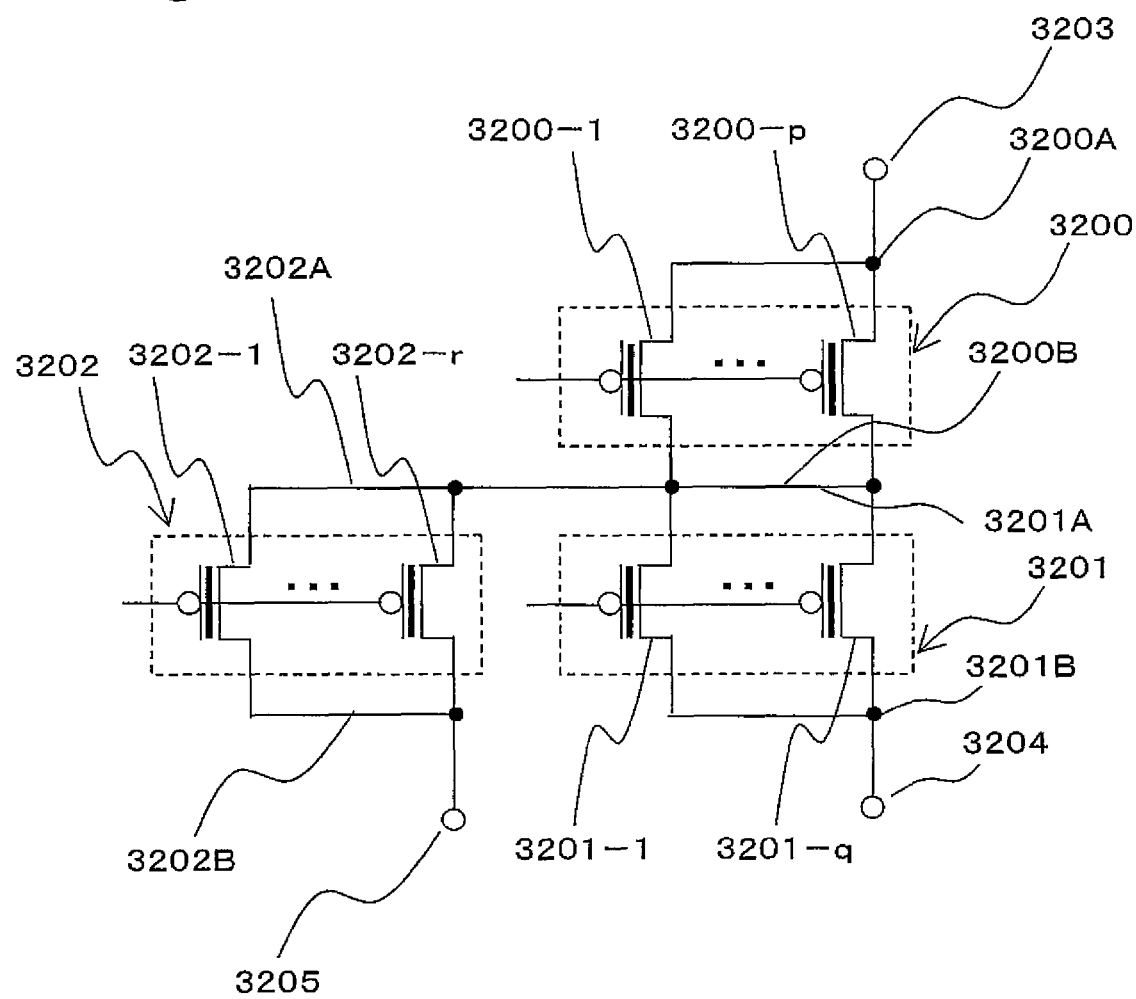
FIG. 25 shows a circuit diagram of a semiconductor storage device according to a fifteenth embodiment of the invention.

FIG. 25 is a circuit diagram showing a semiconductor storage device according to a fifteenth embodiment of the invention. This semiconductor storage device includes a first memory cell group 3200 as a first memory cell section, a second memory cell group 3201 as a second memory cell section, and a third memory cell group 3202 as a third memory cell section.

The first memory cell group 3200 is made up of parallel-connected p memory cells 3200-1 to 3200-$p$. The second memory cell group 3201 is made up of parallel-connected q memory cells 3201-1 to 3201-$q$. The third memory cell group 3202 is made up of parallel-connected r memory cells 3202-1 to 3202-$r$. It is noted that p, q, r are natural numbers, respectively.

The first memory cell group 3200 and the second memory cell group 3201 are connected in series to each other between a first node 3203 and a second node 3204. That is, one end 3200A of the first memory cell group 3200 is connected to the first node 3203, while the other end 3200B of the first memory cell group 3200 is connected to one end 3201A of the second memory cell group 3201. The other end 3201B of the second memory cell group 3201 is connected to the second node 3204. Also, one end 3202A of the third memory cell group 3202 is connected to a connecting point between the other end 3200B of the first memory cell group 3200 and the one end 3201A of the second memory cell group 3201. The other end 3202B of the third memory cell group 3202 is connected to a third node 3205.

The first node 3203 is connected to a first power supply (not shown) from which a supply voltage Vcc (e.g., 3 V) is applied. The second node 3204 is connected to such a readout circuit as described in the fourteenth embodiment. The third node 3205 is connected to a second power supply (not shown) from which a ground potential (e.g., 0 V) is given.

In this fifteenth embodiment, 1-bit information is to be stored in a memory cell block constituted of the first to third memory cells 3200 to 3202. The memory cells 3200-1 to 3200-$p$, 3201-1 to 3201-$q$, 3202-1 to 3202-$r$, which constitute the memory cell groups 3200, 3201, 3202, respectively, are formed by nonvolatile memories.

In this embodiment, in the case where information to be stored in the memory cell block is data 0 for example, all the memory cells 3200-1 to 3200-$p$ of the first memory cell group 3200 and all the memory cells 3201-1 to 3201-$q$ of the second memory cell group 3201 are in the erase state. Meanwhile, all the memory cells 3202-1 to 3202-$r$ of the third memory cell group 3202 are in the write state.

On the other hand, in the other case where the information to be stored in the memory cell block is data 1, all the memory cells 3200-1 to 3200-$p$ of the first memory cell group 3200 and all the memory cells 3201-1 to 3201-$q$ of the second memory cell group 3201 are in the write state. Meanwhile, all the memory cells 3202-1 to 3202-$r$ of the third memory cell group 3202 are in the erase state.

Then, currents that flow through the first, second memory cell groups 3200, 3201 in this case of data 0 are larger than currents that flow through the first, second memory cell groups 3200, 3201 in the case of data 1. Also, a current that flows through the third memory cell group 3202 in this case of data 0 is larger than a current that flows through the third memory cell group 3202 in the case of data 1.

In this embodiment, as described above, the second node 3204 is connected to the readout circuit so as to sense the current flowing through the second node 3204. In this embodiment, it is possible to adopt each of adopt circuits shown in FIGS. 27 to 30 which have been described as specific examples in the fourteenth embodiment, as the readout circuit.

Next, operations of the fifteenth embodiment will be described below.

First, it is assumed that a current that flows with a supply voltage Vcc applied to the first memory cell group 3200 alone is I5. It is assumed that a current that flows with the supply voltage Vcc applied to the second memory cell group 3201 alone is I6. It is assumed that a current that flows with the supply voltage Vcc applied to the third memory cell group 3202 alone is I7. Then, in this fifteenth embodiment, a current I8 that flows through the second node 3204 is expressed by the following Equation (27):

$$I8=I5 \cdot I6/(I5+I7) \tag{27}$$

With regard to the memory cells 3200-1 to 3200-$p$, 3201-1 to 3201-$q$, 3202-1 to 3202-$r$ constituting the first, second, third memory cell groups 3200, 3201, 3202, respectively, a current flowing therethrough in the erase state is assumed as Ie, and a current flowing therethrough in the write state is assumed as Ip. Then, the number of the memory cells 3200-1 to 3200-$p$ included in the first memory cell group 3200 is p, the number of the memory cells 3201-1 to 3201-$q$ included in the second memory cell group 3201 is q, and the number of the memory cells 3202-1 to 3202-$r$ included in the third memory cell group 3202 is r.

In the case where information to be stored in the memory cell block is data 0, the first, second memory cell groups 3200, 3201 are in the erase state while the third memory cell group 3202 is in the write state. Therefore, a current I8(0) that flows through the second node 3204 can be expressed by the following Equation (28):

$$I8(0)=p \cdot Ie \cdot q \cdot Ie/(p \cdot Ie+r \cdot Ip) \tag{28}$$

On the other hand, in the other case where the information to be stored in the memory cell block is data 1, a current I8(1) that flows through the second node 3204 can be expressed by the following Equation (29):

$$I8(1)=p \cdot Ip \cdot q \cdot Ip/(p \cdot Ip+r \cdot Ie) \tag{29}$$

In this equation, the following are given as typical values: a current Ie=40 (μA) that flows in the erase state, a current Ip=20 (μA) that flows in the write state, and an on/off ratio=Ie/Ip=2. In this example, a table of FIG. 31 shows the specific values concerning the current I8(0) that flows through the second node 3204 for data 0 and the current I8(1) that flows through the second node 3204 for data 1 in the unit of μA, and the on/off ratio I8(0)/I8(1), based on the above Equations (28), (29). More specifically, the table of FIG. 31 shows the current I8(0), the current I8(1), the on/off ratio I8(0)/I8(1), the on/off current difference I8(0)-I8(1), and the readout window W(e−p) against each one of combinations among p, q and r. As stated above, p is the number of the memory cells 3200-1 to 3200-$p$ included in the first memory cell group 3200, q is the number of the memory cells 3201-1 to 3201-$q$ included in the second memory cell group 3201, and r is the number of the memory cells 3202-1 to 3202-$r$ included in the third memory cell group 3202. It should be noted that the readout window W(e−p) represents a value calculated by the following Equation (30):

$$W(e-p)=\{I8(0)-I8(1)\}/\{I8(0)^{1/2}+I8(1)^{1/2}\} \tag{30}$$

In any case of the combinations shown in table of FIG. 31, the on/off ratio I8(0)/I8(1) is larger than 2 of the on/off ratio obtained in the single memory cell. Then, in comparison among the combinations of the same total numbers (p+q+r) of memory cells, the on/off ratio becomes a maximum under the following conditions.

In the case where the total number of memory cells is 4, the on/off ratio becomes a maximum value of 5 in the combination of p=1, q=1 and r=2. In the case where the total number of memory cells is 5, the on/off ratio becomes a maximum value of 5.6 in the combination of p=1, q=1 and r=3. In the case where the total number of memory cells is 6, the on/off ratio becomes a maximum value of 6 in the combination of p=1, q=1 and r=4. In the case where the total number of memory cells is 7, the on/off ratio becomes a maximum value of 6.28 in the combination of p=1, q=1 and r=5. Therefore, it can be seen as effective from the above that, the number r of memory cells of the third memory cell group 3202 should be set larger than the numbers p, q of memory cells of the first, second memory cell groups 3200, 3201 in order to increase the on/off ratio in the combinations of the same total numbers of memory cells.

In some cases, depending on characteristics of the readout circuit, the on/off current difference {I8(0)−I8(1)} is more effective than the on/off ratio for increase of the read margin.

Specifically, as compared with the combinations of the same total numbers of memory cells in the table of FIG. 31, the values of the on/off current difference {I8(0)−I8(1)} become largest under the following conditions. In the case where the total number of memory cells is 4, the on/off current difference becomes a maximum value of 40 WA in the combination of p=1, q=2 and r=1. In the case where the total number of memory cells is 5, the on/off current difference becomes a maximum value of 60 μA in the combination of p=1, q=3 μl and r=1. In the case where the total number of memory cells is 6, the on/off current difference becomes a maximum value of 80 μA in the combination of p=1, q=4 and r=1. In the case where the total number of memory cells is 7, the on/off current difference becomes a maximum value of 100 μA in the combination of p=1, q=5 and r=1. Thus, it can be understood as effective from the above that the number q of memory cells of the second memory cell group 3201 should be set larger than the numbers p, r of memory cells of the first, third memory cell groups 3200, 3202 in order to increase the on/off current difference {I8(0)−I8(1)} in the combinations of the same total numbers of memory cells.

In some cases, depending on characteristics of the readout circuit, it is important to separate slopes of variations of the on current I8(0) for data 0 from slopes of variations of the off current I8(1) for data 1 as much as possible. This is called 'readout window.' Generally, variations are proportional to the square root of an absolute value. For convenience' sake, the readout window W(e−p) is here defined by the following Equation (30):

$$W(e-p)=\{I8(0)-I8(1)\}/\{I8(0)^{1/2}+I8(1)^{1/2}\} \tag{30}$$

As can be seen from the table shown in FIG. 31, in comparison among the same total numbers of memory cells in the table, the readout window W(e−p) has the largest value 3.65 in the case of p=1, q=2, r=1 for the total number 4 of the memory cells. The readout window W(e−p) has the largest value 4.47 in the case of p=1, q=3, r=1 for the total number 5 of the memory cells. The readout window W(e−p) has the largest value 5.16 in the case of p=1, q=4, r=1 for the total number 6 of the memory cells. The readout window W(e−p) has the largest value 5.77 in the case of p=1, q−5, r=1 for the total number 7 of the memory cells.

Thus, as can be seen from the above, it is effective to set the number q of memory cells of the second memory cell group 3201 larger than the numbers p, r of memory cells of the first, third memory cell groups 3200, 3202 in order to increase the readout window W(e−p) in the combinations of the same total numbers of memory cells.

In this embodiment, it can be arbitrarily set to define how to correspond the data 0 or 1 to the erase state or the write state of the memory cells, which does not limit this invention. Further, it can also be arbitrarily set to correspond the large or small level of currents flowing through the respective memory cells to the erase state or the write state of the memory cells, which does not limit this invention.

Next, with reference to FIGS. 32A and 32B, operations will be described on a case (1) where one memory cell in an erase fail (current non-flowing fail) has occurred in any one memory cell group of the first to third three memory cell groups 3200, 3201, 3202 in the fifteenth embodiment. Subsequent to this, with reference to FIGS. 33A and 33B, operations will be described on a case (2) where one memory cell of a write fail (large-current, erase-state remaining fail) has occurred.

Even when a fail memory cell such as in the cases (1) or (2) has been found in a shipping test, if the semiconductor storage device can be supplied without rejecting it as a failed product, it is possible to improve the yield of products, as a whole, which are incorporated on the same board.

In this semiconductor storage device, the following description is made on a case where the first, second, third memory cell groups 3200, 3201, 3202 each have two or more memory cells. Also, the description is given on a preferred example of combinations of the numbers p, q, r of memory cells under a condition that only one memory cell of erase fail or write fail per bit is permitted as a conforming product.

FIGS. 32A and 32B show currents I8(0), I8(1) that flow through the second node 3204 upon occurrence of one memory cell of erase fail in any one of the first, second, third memory cell groups 3200, 3201, 3202. Specifically, the currents I8(0), which flow through the second node 3204 upon occurrence of one memory cell of erase fail in the first, second and third memory cell groups 3200, 3201 and 3202, are shown in the columns '3200 fail', '3201 fail' and '3202 fail' for I8(0), respectively. Also, the currents I8(1), which flow through the second node 3204 upon occurrence of one memory cell of erase fail in the first, second and third memory cell groups 3200, 3201 and 3202, are shown in the columns, '3200 fail', '3201 fail' and '3202 fail' for 18(1), respectively.

The on/off ratio I8(0)/I8(1) column in FIGS. 32A and 32B shows values obtained by a calculation that a minimum value out of the currents I8(0) is divided by a maximum value out of the currents I8(1) in the three cases of fail occurrence in each one of the combinations of the numbers p, q, r of memory cells of the respective memory cell groups 3200 to 3202. The on/off current difference {I8(0)−I8(1)} column in FIGS. 32A and 32B shows values obtained by subtracting the maximum value of I8(1) from the minimum value of I8(0). The readout window W(e−p) column in FIGS. 32A and 32B shows values obtained by a calculation that the value obtained by subtracting the maximum value of I8(1) from the minimum value of I8(0) is divided by a sum of the square root of the minimum value of I8(0) and the square root of the maximum value of I8(1).

In comparison among the combinations of the same total numbers (p+q+r) of memory cells, the on/off ratio becomes a maximum under the following conditions. In the case where the total number of memory cells is 7, the on/off ratio becomes a maximum value of 1.78 in the combination of p=2, q=3 and r=2. In the case where the total number of memory cells is 8, the on/off ratio becomes a maximum value of 2.29 in the combination of p=2, q=3 and r=3. In the case where the total number of memory cells is 9, the on/off ratio becomes a maximum value of 2.67 in the combination of p=2, q=3 and r=4. In the case where the total number of memory cells is 10, the on/off ratio becomes a maximum value of 2.86 in the combination of p=2, q=3 and r=5. In the case where the total number of memory cells is 11, the on/off ratio becomes a maximum value of 3 in the combination of p=2, q=3 and r=6. In the case where the total number of memory cells is 12, the on/off ratio becomes a maximum value of 3.11 in the combination of p=2, q=3 and r=7.

Thus, it can be understood that the number p of memory cells of the first memory cell group 3200 should be fixed to 2, and the number q of memory cells of the second memory cell group 3201 should be fixed to 3 while increasing the number of memory cells of the third memory cell group 3202, which is effective to maximize the on/off ratio.

In comparison among the combinations of the same total numbers (p+q+r) of memory cells, the on/off current difference {I8(0)−I8(1)} becomes a maximum under the following conditions. In the case where the total number of memory cells is 7, the on/off current difference becomes a maximum value of 23 μA in the combination of p=2, q=3 and r=2. In the case where the total number of memory cells is 8, the on/off current difference becomes a maximum value of 40 μA in the combination of p=2, q=4 and r=2. In the case where the total number of memory cells is 9, the on/off current difference becomes a maximum value of 50 μA in the combination of p=2, q=5 and r=2. In the case where the total number of memory cells is 10, the on/off current difference becomes a maximum value of 60 μA on combinations that p=2, q=6 and r=2 and that p=3, q=5 and r=2. In the case where the total number of memory cells is 11, the on/off current difference becomes a maximum value of 78 μW in the combination of p=3, q=6 and r=2. In the case where the total number of memory cells is 12, the on/off current difference becomes a maximum value of 96 μA in the combination of p=3, q=7 and r=2.

Thus, it can be understood that the number r of memory cells of the third memory cell group 3202 should be fixed to 2, and the number q of memory cells of the second memory cell group 3201 should be set larger than the number p of memory cells of the first memory cell group 3200, which is effective to maximize the on/off current difference {I8(0)−I8(1)}.

In comparison among the combinations of the same total numbers (p+q+r) of memory cells, the readout window W(e−p) becomes a maximum under the following conditions. In the case where the total number of memory cells is 7, the readout window becomes a maximum value of 1.83 in the combination of p=2, q=3 and r=2. In the case where the total number of memory cells is 8, the readout window becomes a maximum value of 2.62 in the combination of p=2, q=4 and r=2. In the case where the total number of memory cells is 9, the readout window becomes a maximum value of 2.93 in the combination of p=2, q=5 and r=2. In the case where the total number of memory cells is 10, the readout window becomes a maximum value of 3.21 on combinations that p=2, q=6 and r=2 and that p=3, q=5 and r=2. In the case where the total number of memory cells is 11, the readout window becomes a maximum value of 3.76 in the combination of p=3, q=6 and r=2. In the case where the total number of memory cells is 12, the readout window becomes a maximum value of 4.38 in the combination of p=3, q=6 and r=3.

Thus, it can be understood that up to the total number 11 of memory cells, the number r of memory cells of the third memory cell group 3202 should be fixed to 2 while the number q of memory cells of the second memory cell group 3201 should be set larger than the number p of memory cells of the first memory cell group 3200, as in the case of maximizing the on/off current difference, which is effective to maximize the readout window. On the other hand, it can also be understood that for the total number 12 of memory cells, the number r of memory cells of the third memory cell group 3202 should be preferably increased from 2 to 3.

Next, FIGS. 33A and 33B show currents I8(0), I8(1) that flow through the second node 3204 upon occurrence of one memory cell of write fail in any one of the first, second, third memory cell groups 3200, 3201, 3202. Specifically, the columns, '3200 fail', '3201 fail' and '3202 fail' of I8(0) in FIGS. 33A and 33B show currents I8(0) that flow through the second node 3204 upon occurrence of one memory cell of write fail in the first, second, third memory cell groups 3200, 3201, 3202, respectively. Also, the columns, '3200 fail', '3201 fail' and '3202 fail' of I8(1) in FIGS. 33A and 33B show currents I8(1) that flow through the second node 3204 upon occurrence of one memory cell of write fail in the first, second, third memory cell groups 3200, 3201, 3202, respectively.

The on/off ratio I8(0)/I8(1) column in FIGS. 33A and 33B shows values obtained by a calculation that a minimum value out of the currents I8(0) is divided by a maximum value out of the currents I8(1) in the three cases of fail occurrence in each one of the combinations of the numbers p, q, r of memory cells of the respective memory cell groups 3200 to 3202. The on/off current difference {I8(0)–I8(1)} column in FIGS. 33A and 33B shows values obtained by subtracting the maximum value of I8(1) from the minimum value of I8(0). The readout window W(e–p) column in FIGS. 33A and 33B shows values obtained by a calculation that the value obtained by subtracting the maximum value of I8(1) from the minimum value of I8(0) is divided by a sum of the square root of the minimum value of I8(0) and the square root of the maximum value of I8(1).

In comparison among the combinations of the same total numbers (p+q+r) of memory cells, the on/off ratio becomes a maximum under the following conditions.

In the case where the total number of memory cells is 7, the on/off ratio becomes a maximum value of 2.67 in the combination of p=2, q=2 and r=3. In the case where the total number of memory cells is 8, the on/off ratio becomes a maximum value of 3 in the combination of p=2, q=3 and r=3. In the case where the total number of memory cells is 9, the on/off ratio becomes a maximum value of 3.36 in the combination of p=2, q=3 and r=4. In the case where the total number of memory cells is 10, the on/off ratio becomes a maximum value of 3.47 in the combination of p=2, q=3 and r=5. In the case where the total number of memory cells is 11, the on/off ratio becomes a maximum value of 3.64 in the combination of p=2, q=3 and r=6. In the case where the total number of memory cells is 12, the on/off ratio becomes a maximum value of 3.78 in the combination of p=2, q=3 and r=7. Thus, it can be understood that in the case of one memory cell of write fail, for total numbers of memory cells other than 7, the number p and q of memory cells of the first and second memory cell groups 3200 and 3201 should be fixed to 2 and 3, respectively, as in the case of one memory cell of erase fail, which is effective to maximize the on/off ratio.

In comparison among the combinations of the same total numbers (p+q+r) of memory cells, the on/off current difference (I8(0)–I8(1)) becomes a maximum under the following conditions. In the case where the total number of memory cells is 7, the on/off current difference becomes a maximum value of 42 μA in the combination of p=2, q=3 and r=2. In the case where the total number of memory cells is 8, the on/off current difference becomes a maximum value of 57 μW in the combination of p=2, q=4 and r=2. In the case where the total number of memory cells is 9, the on/off current difference becomes a maximum value of 71 μA in the combination of p=2, q=5 and r=2. In the case where the total number of memory cells is 10, the on/off current difference becomes a maximum value of 86 μA in the combination of p=2, q=6 and r=2. In the case where the total number of memory cells is 11, the on/off current difference becomes a maximum value of 100 μA in the combination of p=2, q=7 and r=2 or p=3, q=6 and r=2. In the case where the total number of memory cells is 12, the on/off current difference becomes a maximum value of 117 AA in the combination of p=3, q=7 and r=2.

Thus, it can be understood that the number r of memory cells of the third memory cell group 3202 should be fixed to 2 while the number q of memory cells of the second memory cell group 3201 should be set larger than the number p of memory cells of the first memory cell group 3200, which is effective to maximize the on/off current difference (I8(0)–I8(1)).

In comparison among the combinations of the same total numbers (p+q+r) of memory cells, the readout window W(e–p) becomes a maximum value under the following conditions. In the case where the total number of memory cells is 7, the readout window becomes a maximum value of 3.12 in the combination of p=2, q=3 and r=2. In the case where the total number of memory cells is 8, the readout window becomes a maximum value of 3.71 in the combination of p=2, q=4 and r=2. In the case where the total number of memory cells is 9, the readout window becomes a maximum value of 4.14 in the combination of p=2, q=5 and r=2. In the case where the total number of memory cells is 10, the readout window becomes a maximum value of 4.54 in the combination of p=2, q=6 and r=2. In the case where the total number of memory cells is 11, the readout window becomes a maximum value of 4.90 in the combination of p=2, q=7 and r=2 or p=3, q=6 and r=2. In the case where the total number of memory cells is 12, the readout window becomes a maximum value of 5.30 in the combination of p=3, q=7 and r=2.

Thus, it can be understood that the combinations of p, q, r that maximize the readout window W(e–p) are the same as the combinations of p, q, r that maximize the on/off current difference (I8(0)–I8(1)).

In addition, the above example has been described on an assumption that the number of memory cells of erase fail or write fail is one per 1-bit memory block. However, if two or more failed memory cells are present, the least number of memory cells of each memory cell group may appropriately be increased to three or more.

Further, this embodiment has been described on a case where the current value is controlled by the number of memory cells while the memory cells are identical in sizes (gate length and width). However, it is obvious that effects similar to those of the above-described operations can also be obtained in cases where the current value is controlled by varying the size of the memory cells. For example, a memory cell group having k memory cells may be substituted with a memory cell group having 1 memory cell having a larger gate length k times.

Sixteenth Embodiment

Figure 34:
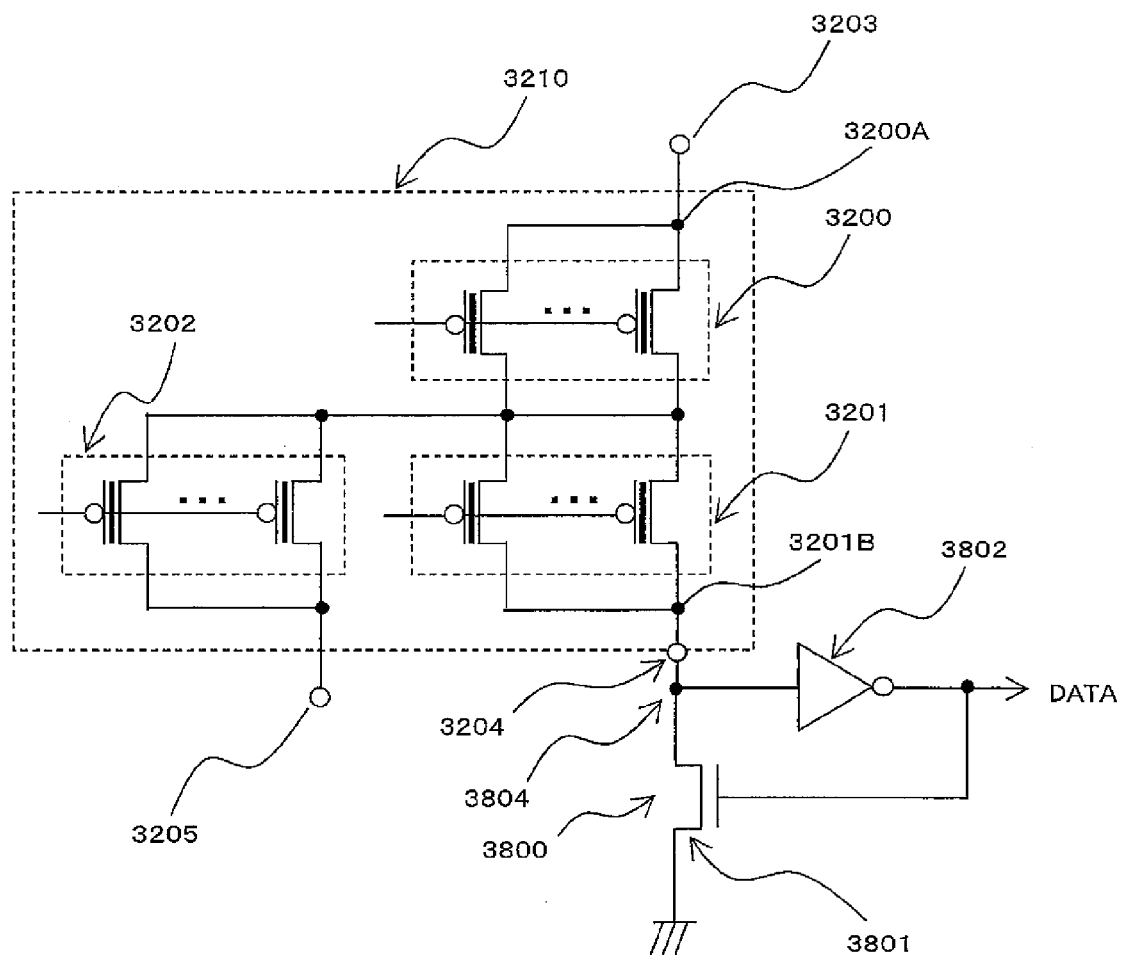
FIG. 34 shows a semiconductor storage device according to a sixteenth embodiment of the invention.

FIG. 34 shows a circuit diagram of a semiconductor storage device according to a sixteenth embodiment of the invention. This sixteenth embodiment differs from the fifteenth embodiment in that the semiconductor storage device includes a readout circuit 3800, which is connected to the second node 3204 of the fifteenth embodiment shown in FIG. 25. Therefore, in this sixteenth embodiment, difference from the foregoing fifteenth embodiment is mainly explained.

The readout circuit 3800 has a transistor 3801 connected between the second node 3204 and the ground, and an inverter 3802 connected between the second node 3204 and the gate of the transistor 3801. This readout circuit 3800 is formed by a one-side latch circuit.

In the sixteenth embodiment, upon start-up of the power supply, information stored in a memory cell block 3210, which is constituted of the first to third memory cell groups 3200 to 3202, is automatically read out and outputted as an output signal DATA from the readout circuit 3800.

Figure 35:
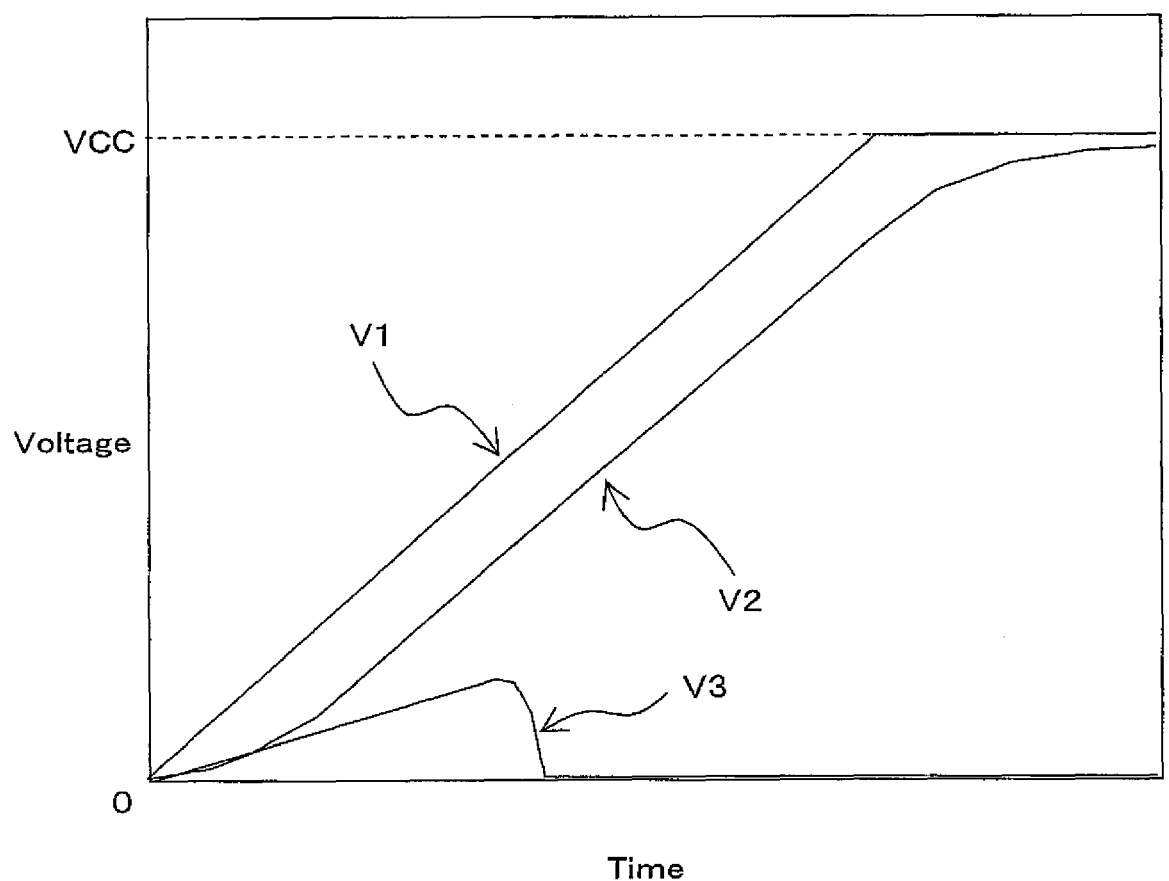
FIG. 35 shows voltage characteristics in a read operation for data 0 in the sixteenth embodiment.

FIG. 35 shows variations in voltage V1 of the first node 3203 of the memory cell block 3210, voltage V2 of an input terminal 3804 of the readout circuit 3800, and voltage V3 of the output signal DATA at the time of the read operation in the case where data 0 is stored in the memory cell block 3210. As shown in FIG. 35, when the power supply is started up, the voltage V2 of the input terminal 3804 increases with increasing voltage V1 of the first node 3203 since a large current flows into the input terminal 3804 of the readout circuit 3800. The output signal DATA, which is an output of the inverter 3802, soon turns into Low level, so that data 0 is read out.

Figure 36:
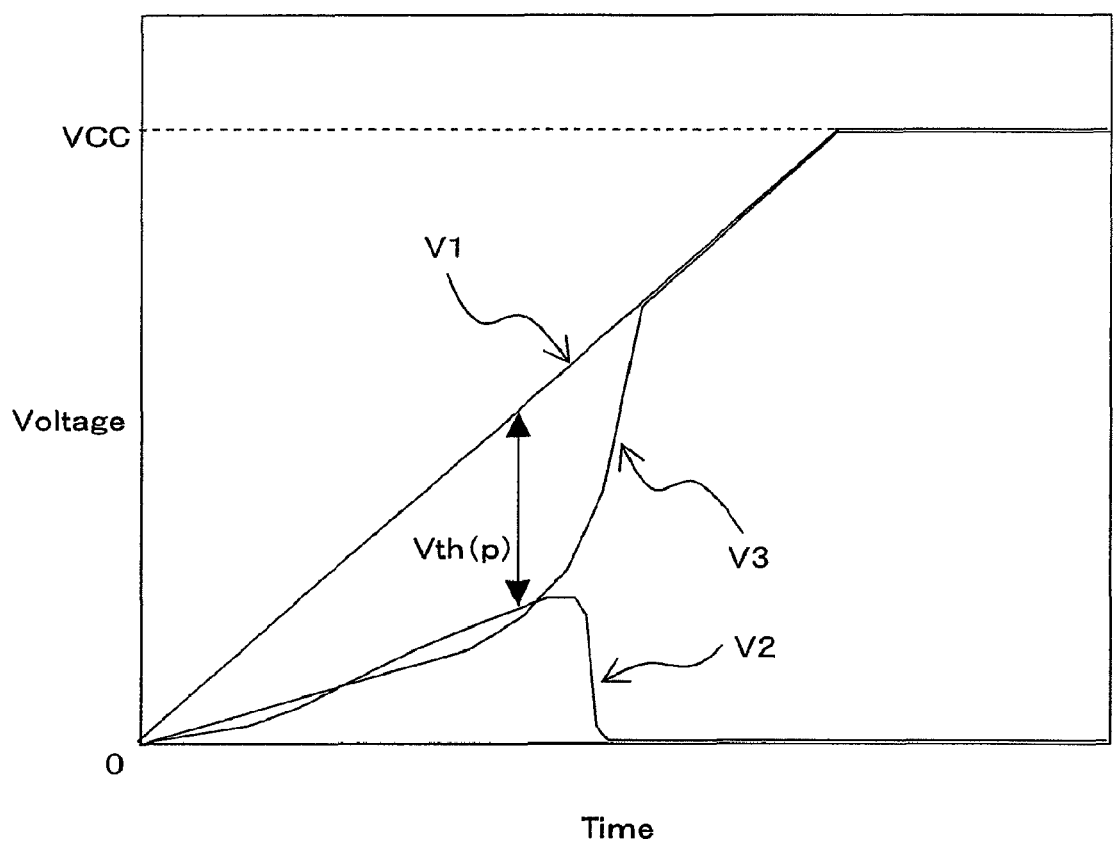
FIG. 36 shows voltage characteristics in a read operation for data 1 in the sixteenth embodiment.

FIG. 36 shows variations in the voltage V1 of the first node 3203 of the memory cell block 3210, the voltage V2 of the input terminal 3804 of the readout circuit 3800, and the voltage V3 of the output signal DATA at the time of the read operation in the other case where data 1 is stored in the memory cell block 3210. In the case where the stored data is 1, even if the power supply is started up, the voltage V2 of the input terminal 3804 does not increase so much, as shown in FIG. 36 (actually, the voltage increases to a slight extent due to coupling of parasitic capacitance or the like, as seen in FIG. 36) because the current that flows into the input terminal 3804 is small. When the potential difference between the voltage V1 of the first node 3203 and the voltage V2 of the input terminal 3804 increases above a threshold value Vth(p) of a P-channel transistor (not shown), which constitutes the inverter 3802, the output signal DATA of the inverter 3602 turns into High level, so that data 1 is read out.

In this way, 1-bit data stored in the memory cell block 3210 can be accurately read out with a high margin described in the foregoing fifteenth embodiment.

In this sixteenth embodiment, the memory cell block 3210 is formed by that of the fifteenth embodiment of FIG. 25. However, the memory cell block 3210 may be substituted with that of the fourteenth embodiment of FIG. 24. That is, as shown in FIG. 26, the readout circuit 3800 may be connected to the second node 3104 of the memory cell block 3300 which is constituted of the three memory cells 3100, 3101, 3102 of FIG. 24.

Seventeenth Embodiment

Figure 37:
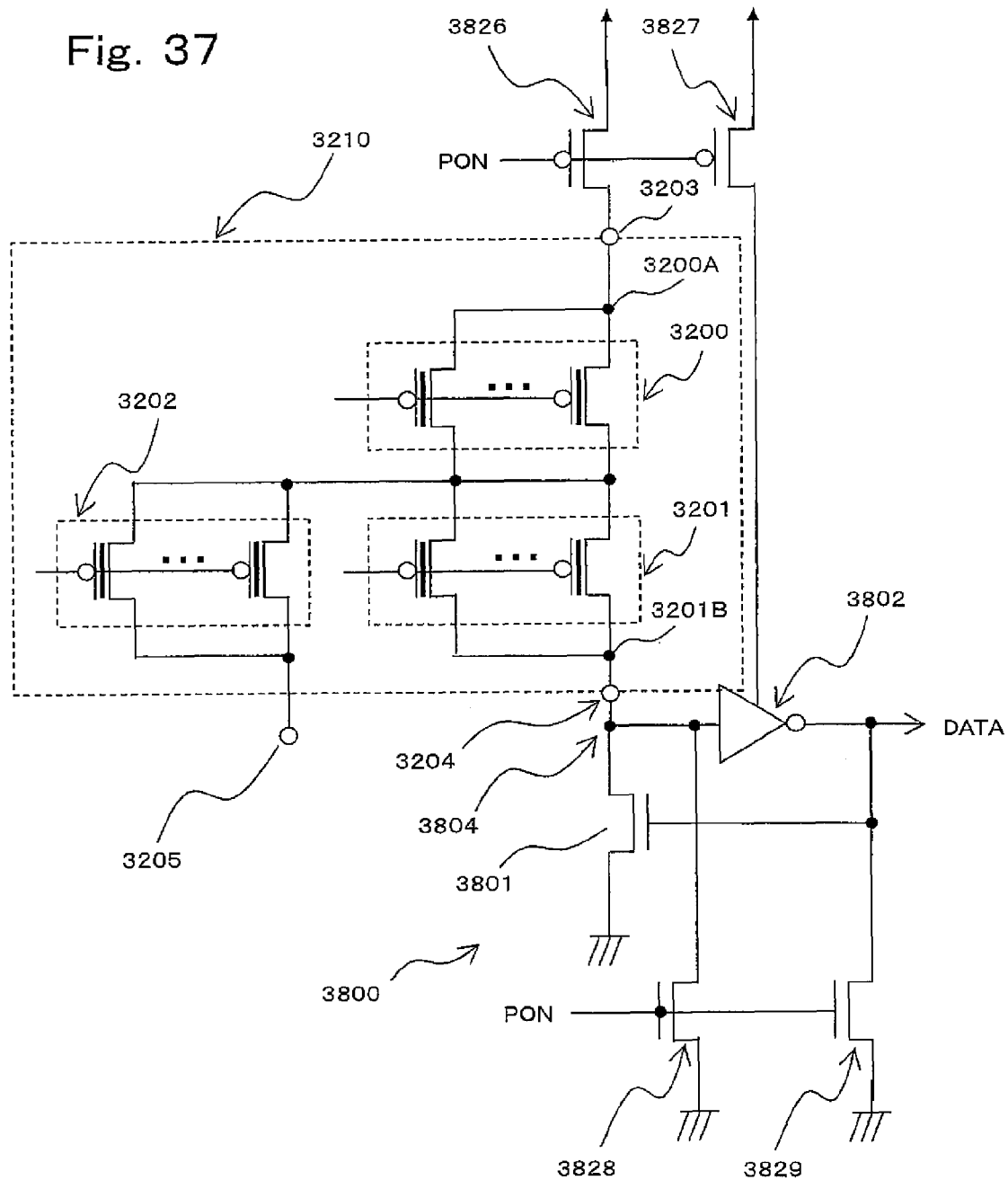
FIG. 37 shows a semiconductor storage device according to a seventeenth embodiment of the invention.

FIG. 37 shows a circuit diagram of a semiconductor storage device according to a seventeenth embodiment of the invention. This seventeenth embodiment differs from the foregoing sixteenth embodiment in the following points (1), (2).

(1) To have a P-channel transistor 3826 as a first transistor connected between one terminal 3200A of the first memory cell group 3200 and first power supply (not shown), and a P-channel transistor 3827 as a second transistor connected between a P-channel transistor (not shown) of the inverter 3802, which constitutes a one-side latch circuit as the readout circuit 3800, and the first power supply.

(2) To have N-channel transistors 3828, 3829 for resetting a voltage across a one-side latch circuit as the readout circuit 3800.

In this seventeenth embodiment, first, before the first power supply is started up, a control signal PON is set to High level so that the P-channel transistors 3826, 3827 are turned off while the N-channel transistors 3828, 3829 are turned on. Then, the first power supply is started up, and after the power supply is stabilized, the control signal PON is set to Low level so that the P-channel transistors 3826, 3827 are turned on while the N-channel transistors 3828, 3829 are turned off.

By these operations, after the power supply is started up, and after the power supply is stabilized, the control signal PON is set to Low level so that the power supply is connected to the memory cell block 3210 and the inverter 3802, which causes the readout circuit 3800 to be operated. Thereby, noise of the power supply at start-up can be cut off to prevent any false operations.

Subsequent to completion of the readout by the readout circuit 3800, after the output signal DATA is stored into another latch circuit (not shown), the control signal PON is started up so that the P-channel transistors 3826, 3827 are turned off. This makes it possible to minimize the time over which a current continues flowing through the respective memory cells of the memory cell block 3210. Thus, characteristic deteriorations of the memory cells due to read disturb can be prevented.

The input terminal 3804 of the readout circuit 3800 and the node to which the output signal DATA is outputted are reset to 0 V by the P-channel transistors 3826, 3827. Thereby, any floating node can be eliminated, and a more reliable circuit operation can be fulfilled.

Eighteenth Embodiment

A liquid crystal panel device for electronic equipment according to an eighteenth embodiment of the invention is explained with reference to the block diagrams of FIGS. 38 and 39. In this liquid crystal panel device, a memory section 31000 shown in FIG. 39 includes a plurality of the semiconductor storage devices according to any one of the fourteenth to seventeenth embodiments, as nonvolatile memory devices. Digital data for Vcom adjustment are to be stored in the nonvolatile memory devices.

Figure 38:
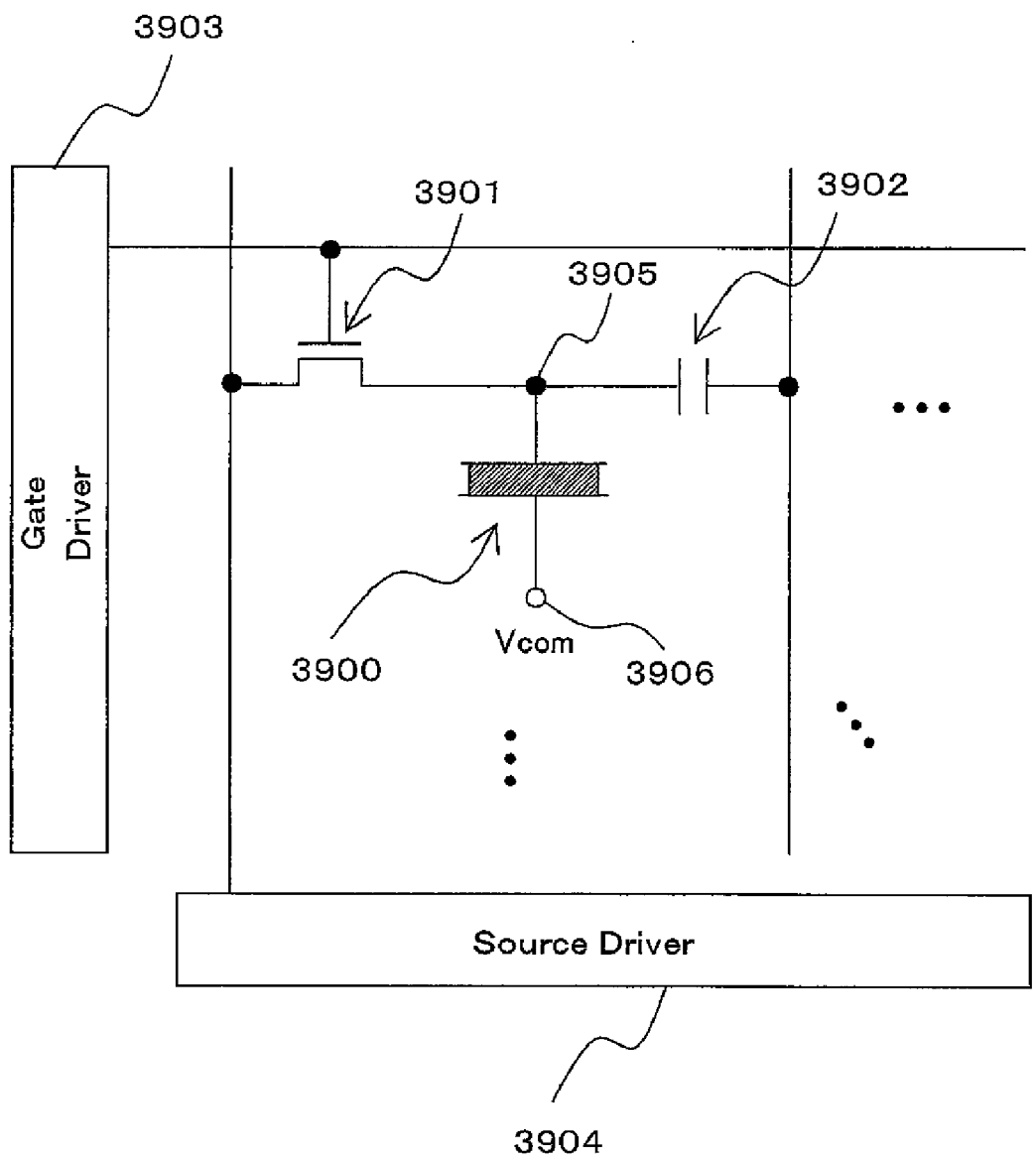
FIG. 38 shows a block diagram of a liquid crystal panel device served as electronic equipment according to an eighteenth embodiment of the invention.

In the liquid crystal panel device of the eighteenth embodiment, as shown in FIG. 38, a liquid-crystal pixel 3900, a TFT (Thin Film Transistor) 3901 and an additional capacitance 3902 are arranged plurally in an array form. The liquid crystal panel device includes a gate driver 3903, which drives the gate of the TFT 3901, and a source driver 3904, which is connected to the source of the TFT 3901. When the TFT 3901 selected by the gate driver 3903 turns on, data is temporarily stored in the additional capacitance 3902 from the source driver 3904 via the TFT 3901. Data of a high voltage VH is given to a node 3905 of the pixel 3900 in a first half (positive field) of 1 frame, while data of a low voltage VL is given to the node 3905 of the pixel 3900 in a second half (negative field) of 1 frame in order to prevent deterioration of the liquid-crystal pixel 3900. Then, a voltage Vcom of (VH+VL)/2, as a reference voltage, is given to a node 3906 of the pixel 3900 to prevent screen flicker.

The reference voltage Vcom needs to be set for each liquid crystal panel due to manufacturing variations in the parasitic capacitance between gate and source of each TFT 3901.

Figure 39:
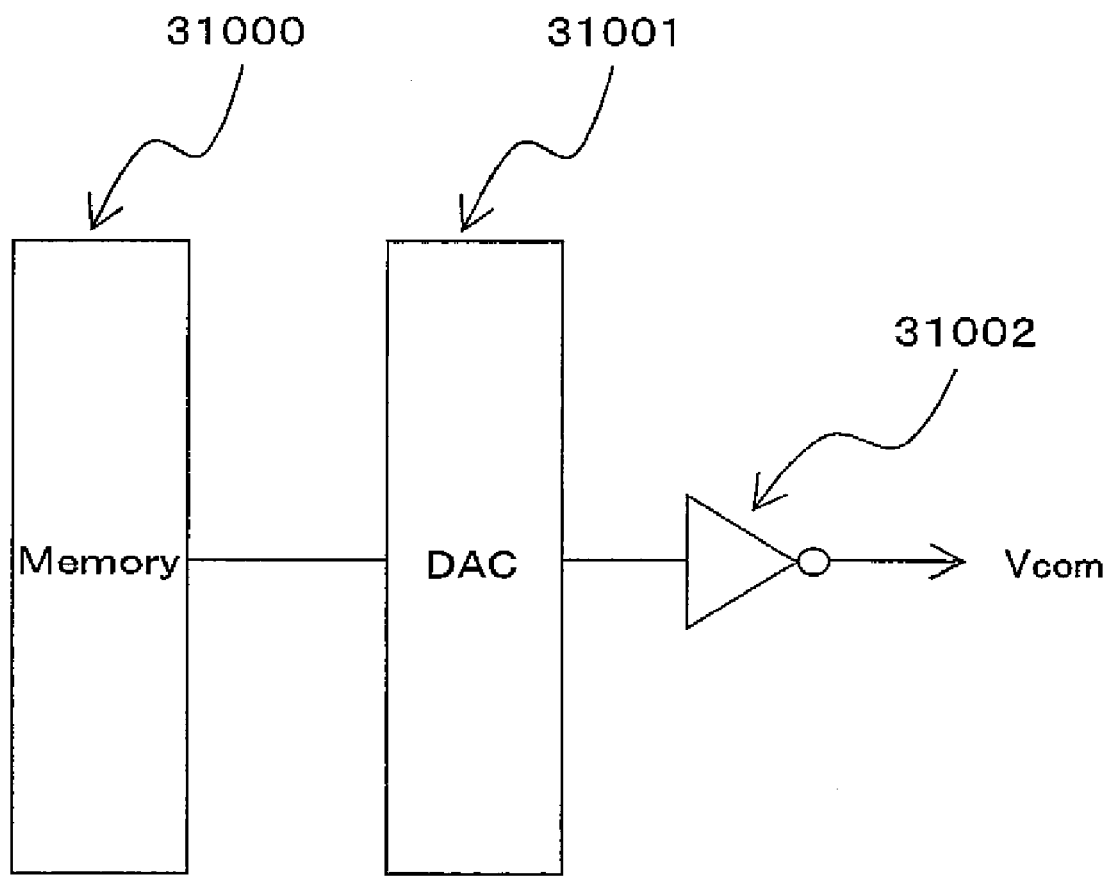
FIG. 39 shows a block diagram of a reference voltage generation section included in the liquid crystal panel device served as electronic equipment of the eighteenth embodiment.

In a reference voltage generator section that generates the reference voltage Vcom, as shown in FIG. 39, an adjustment value is stored in a memory section 31000, and then the reference voltage Vcom is outputted via a D/A converter (digital/analog converter) 31001 and a Vcom driver 31002. The memory section 31000 is required to retain the adjustment value for the reference voltage Vcom for a long period, and therefore needs to have high-grade reliability.

In the nonvolatile memory devices of the fourteenth to seventeenth embodiments, 1-bit data is stored in the memory cell block. This storing technique makes it possible to obtain a larger difference in the current flowing from the memory cell block between data 0 and data 1 even if the current difference is small between erase state and write state in the respective memory cells constituting the memory cell block, and even if there is any erase fail or write fail in a small number of the memory cells. Thus, information of the memory cells can accurately be read out from memory cells for a long time. Therefore, the electronic equipment including any of the semiconductor storage devices according to the fourteenth to seventeenth embodiments is with high reliability.

The electronic equipment is not necessarily limited to liquid crystal panel devices. The electronic equipment may be any types including digital cameras, portable telephones, digital audio recorders, music recording/reproducing equipment or the like.

Nineteenth Embodiment

Figure 40:
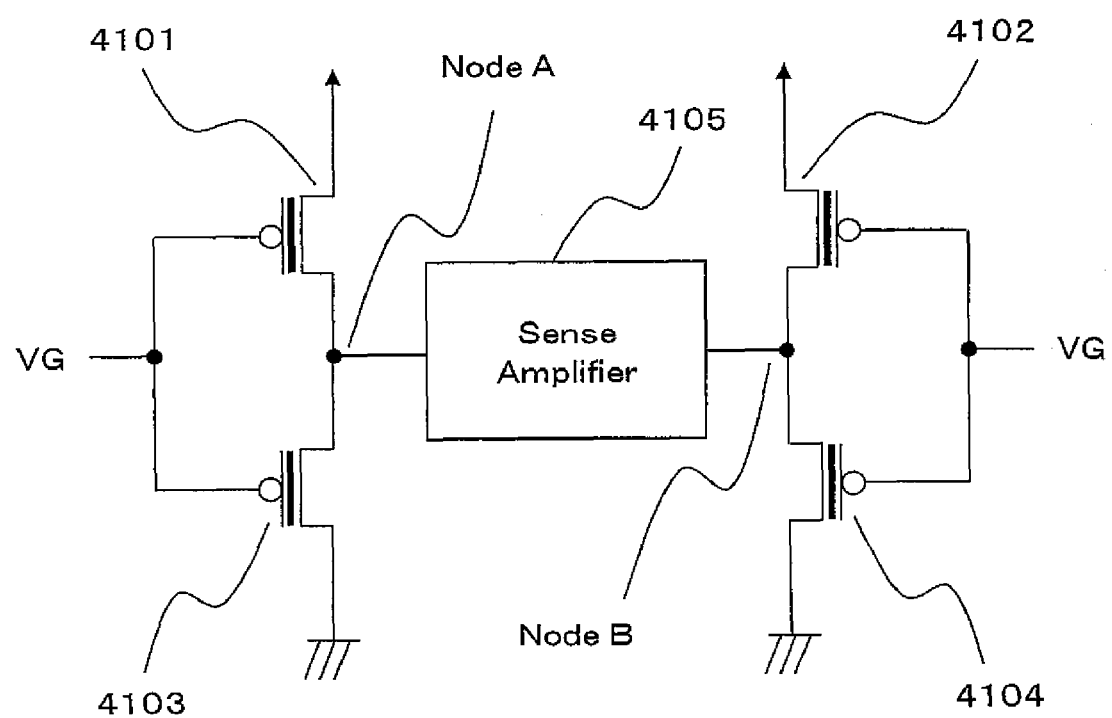
FIG. 40 shows a semiconductor storage device according to a nineteenth embodiment of the invention.

FIG. 40 shows a semiconductor storage device according to a nineteenth embodiment of the invention. First to fourth memory cells 4101 to 4104 are used in this semiconductor storage device.

In this semiconductor storage device, as shown in FIG. 40, a first memory cell 4101, as a first memory section, is connected in series with a third memory cell 4103, as a third memory section. A node "A" which is a connecting point between the first memory cell 4101 and the third memory cell 4103 is connected to one input of a sense amplifier 4105. A second memory cell 4102, as a second memory section, is connected in series with a fourth memory cell 4104, as a fourth memory section. A node "B" which is a connecting point between the second memory cell 4102 and the fourth memory cell 4104 is connected to the other input of the sense amplifier 4105. The other ends of the first, second memory cells 4101, 4102 are connected to power supply as the first power supply. The other ends of the third, fourth memory cells 4103, 4104 are connected to a ground as the second power supply. In this semiconductor storage device of the nineteenth embodiment, 1-bit information is to be stored in these four memory cells 4101 to 4104.

It is assumed that the first to fourth memory cells 4101 to 4104 are initially in the erase state of a large cell current. Hereinafter, a memory cell in this state will be referred to as "erase cell". The memory cells are put into the write state of a small cell current by a write operation. Hereinafter, a memory cell in this state will be referred to as "write cell". However, the definition of the current states is not necessarily limited to the above.

To store 1 bit in the construction of the semiconductor storage device of FIG. 40, for example, the first, fourth memory cells 4101, 4104 are set to erase cells, and the second, third memory cells 4102, 4103 are set to write cells, which is defined as data "0". The first, fourth memory cells 4101, 4104 are set to write cells, and the second, third memory cells 4102, 4103 are set to erase cells, which is defined as data "1". The definition of data "0" or "1" is not necessarily limited to the above.

The sense amplifier 4105 determines data of a memory cell on the basis of the positiveness or negativeness of a potential difference $\Delta V$ between node A and node B. In the case of data "1", the potential difference $\Delta V$ is expressed as follows:

$$\Delta V = (\text{voltage of node } B) - (\text{voltage of node } A) \quad (31)$$
$$= Vd \cdot [Ie - Ip] / [Ie + Ip]$$

where Vd is a supply voltage, Ie is an erase cell current of the second, third memory cells 4102, 4103, and Ip is a write cell current of the first, fourth memory cells 4101, 4104.

The memory cell currents Ie, Ip actually vary from memory cell to memory cell. In the worst case, therefore, a minimum value of the potential difference: $\Delta V(min)$ is expressed as follows:

$$\Delta V(min) = Vd \cdot [Ie(min) - Ip(max)] / [Ie(min) + Ip(max)] \quad (32)$$

where Ie(min) is a minimum value of Ie, and Ip(max) is a maximum value of Ip. The following inequality relationship maintains as far as a current distribution of the write cells and a current distribution of the erase cells do not overlap with each other, even if the cell currents are varied or even if the current values are changed due to time variations.

$$Ie(min) > Ip(max)$$

Therefore, the positiveness or negativeness of $\Delta V(min)$ remains unchanged. Thus, on condition that sensitivity of sense amplifier>$\Delta V(min)$, then memory cell data can be correctly read out. In the way adopting commonly used reference values, on the other hand, the positiveness or negativeness of $\Delta V$ is inverted when the cell currents are varied or when the current values are changed due to time variations, even if the current distribution of the write cells does not overlap with the current distribution of the erase cells. This causes erroneous data to be read out. The present invention prevents such erroneous cases from occurring.

Figure 41:
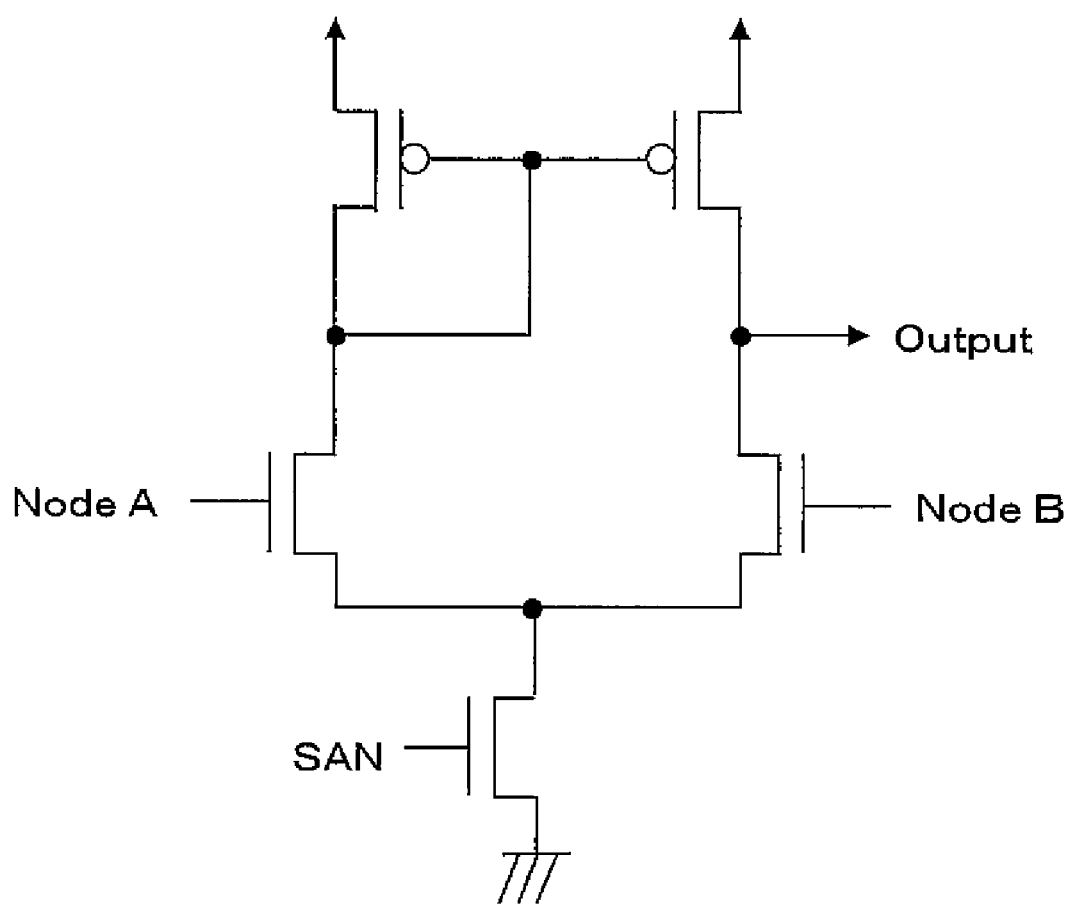
FIG. 41 shows an example of a sense amplifier in nineteenth to twenty-first embodiments of the invention.
Figure 42:
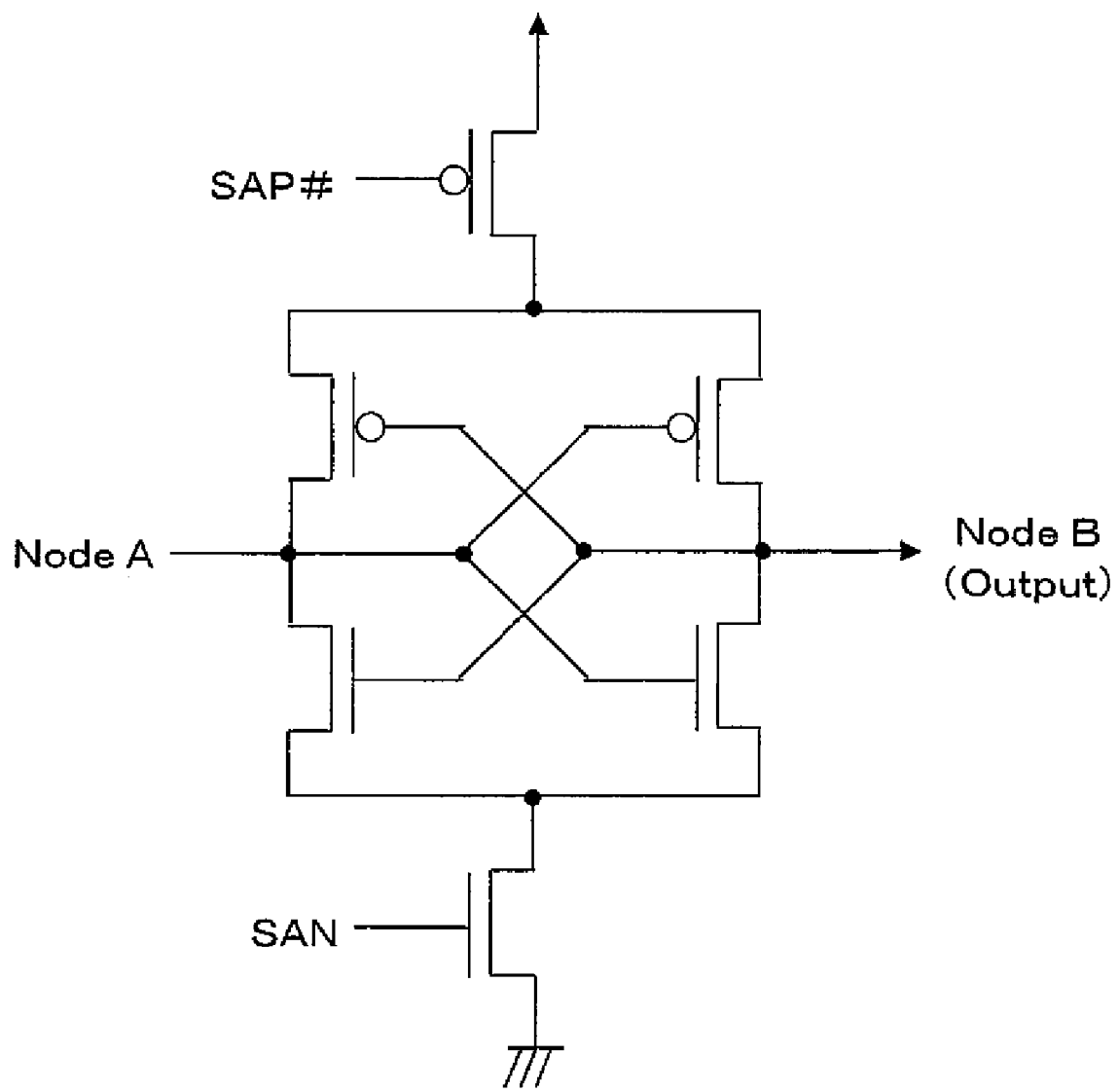
FIG. 42 shows another example of the sense amplifier in the nineteenth to twenty-first embodiments of the invention.

The sense amplifier 4105 is not limited as long as it allows the potential difference between node A and node B to be determined, such as the current-mirror type amplifier shown in FIG. 41 or the differential amplifier shown in FIG. 42.

According to the semiconductor storage device of the nineteenth embodiment, the first memory cell 4101 which is the first memory section is connected in series with the third memory cell 4103 which is the third memory section, to form a pair thereof. Also, the second memory cell 4102 which is the second memory section is connected in series with the fourth memory cell 4104 which is the fourth memory section, to form a pair thereof. In using these pairs, one of the first and third memory cells 4101, 4103 is assigned as a write cell and the other is assigned as an erase cell, while one of the second and fourth memory cells 4102, 4104 is assigned as an erase cell and the other is assigned as a write cell, so that 1-bit data can be stored in these memory cells. Thus, as compared with the conventional techniques where data is read out by comparison of information stored in one memory cell with the reference value, it is possible to more correctly read out data of memory cells as far as the current distribution of write cells and the current distribution of erase cells do not overlap with each other, even if the cell currents are varied or even if the current values are changed due to time variations.

Twentieth Embodiment

Figure 43:
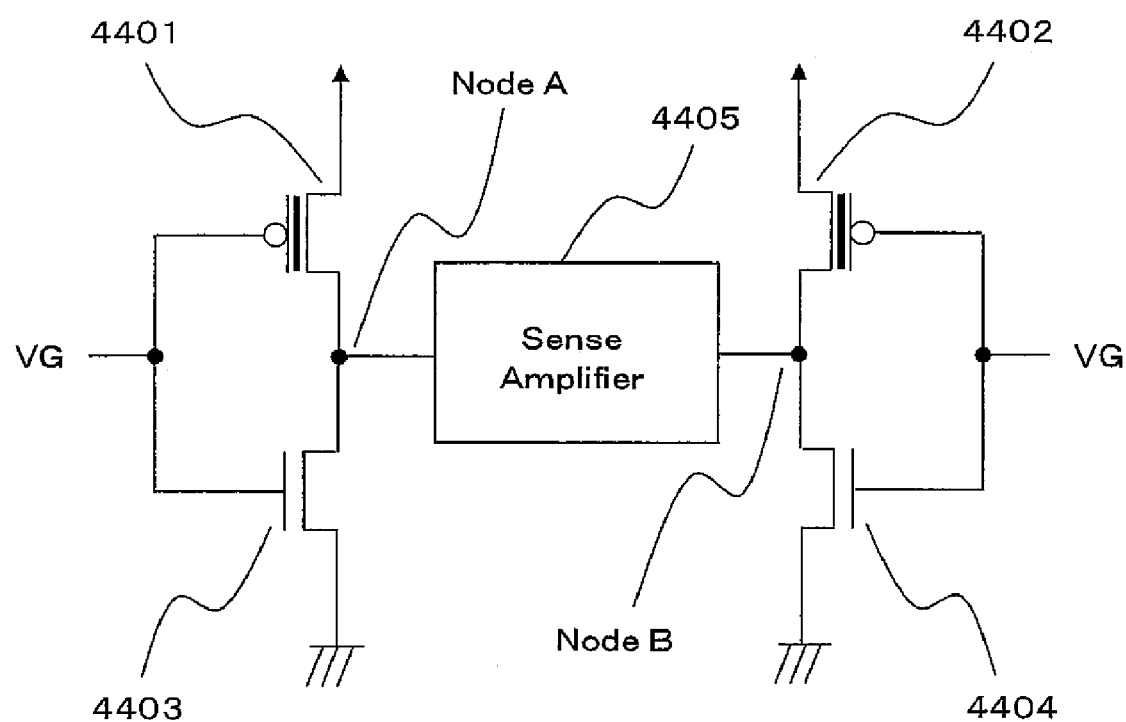
FIG. 43 shows a semiconductor storage device according to a twentieth embodiment of the invention.

FIG. 43 shows a semiconductor storage device according to a twentieth embodiment of the invention. Two first and second memory cells 4401, 4402 are used in this semiconductor storage device.

In this semiconductor storage device, as shown in FIG. 43, a first memory cell 4401, as the first memory section, is connected in series with a first transistor 4403. A node "A" which is a connecting point between the first memory cell 4401 and the first transistor 4403 is connected to one input of a sense amplifier 4405. A second memory cell 4402, as the second memory section, is connected in series with a second transistor 4404. A node "B" which is a connecting point between the second memory cell 4402 and the second transistor 4404 is connected to the other input of the sense amplifier 4405. The other ends of the first, second memory cells 4401, 4402 are connected to power supply as first power supply. The other ends of the first, second transistors 4403, 4404 are connected to a ground as second power supply. In the semiconductor storage device of this twentieth embodiment, 1-bit information is to be stored in these two memory cells.

As with the nineteenth embodiment, a state in which a large cell current flows through the first, second memory cells 4401, 4402 is defined as the erase state. The memory cell in the erase state is referred to as "erase cell". A state in which only a small current flows therethrough is defined as the write state. The memory cell in the write state is referred to as "write cell".

To store 1 bit in the construction of the semiconductor storage device of FIG. 43, for example, the first memory cell 4401 is set to an erase cell, and the second memory cell 4402 is set to a write cell, which is defined as data "0". The first memory cell 4401 is set to a write cell, and the second memory cell 4402 is set to an erase cell, which is defined as data "1". However, the definition of data "0" or "1" is not necessarily limited to the above.

As with the nineteenth embodiment, the sense amplifier 4405 determines data of a memory cell on the basis of the positiveness or negativeness of a potential difference $\Delta V$ between node A and node B. In the case of data "1", the potential difference $\Delta V$ is expressed as follows:

$$\Delta V = \text{(voltage of node } B) - \text{(voltage of node } A) \quad (33)$$
$$= Vd \cdot [Ie - Ip] \cdot It / [(It + Ie) \cdot (It + Ip)]$$

where Vd is a supply voltage, Ie is an erase cell current of the second memory cell 4402, Ip is a write cell current of the first memory cell 4401, and It is a current of the first, second transistors.

The memory cell currents Ie, Ip actually vary from memory cell to memory cell. In the worst case, therefore, a minimum value $\Delta V(min)$ of the potential difference is expressed as follows:

$$\Delta V(min) = Vd \cdot [Ie(min) - Ip(max)] \cdot It / [(It + Ie(min)) \cdot (It + Ip(max))] \quad (34)$$

where Ie(min) is a minimum value of Ie, and Ip(max) is a maximum value of Ip. The following inequality relationship maintains as far as a current distribution of the write cell and a current distribution of the erase cell do not overlap with each other, even if the cell currents are varied or even if the current values are changed due to time variations.

$$Ie(min) > Ip(max)$$

Therefore, the positiveness or negativeness of $\Delta V(min)$ remains unchanged. Thus, on condition that sensitivity of sense amplifier > $\Delta V(min)$, then memory cell data can be correctly read out. In the way adopting commonly used reference values, on the other hand, the positiveness or negativeness of $\Delta V$ is inverted when the cell currents are varied or when the current values are changed due to time variations, even if the current distribution of the write cells does not overlap with the current distribution of the erase cells. This causes erroneous data to be read out. The present invention prevents such erroneous cases from occurring.

In this twentieth embodiment, only two memory cells are used. Therefore, erase or write operations in the memory cells can be reduced, compared with the nineteenth embodiment using four memory cells.

According to the semiconductor storage device of the twentieth embodiment, the first memory cell 4401 which is the first memory section is connected in series with the first transistor 4403, to form a pair thereof. The second memory cell 4402 which is the second memory section is connected in series with the second transistor 4404, to form a pair thereof. In using these pairs, one of the first and second memory cells 4401, 4402 is assigned as a write cell and the other is assigned as an erase cell, so that 1-bit data can be stored in these memory cells. Thus, as compared with the conventional techniques where data is read out by comparison of information stored in one memory cell with the reference value, it is possible to more correctly read out data of memory cells as far as the current distribution of write cells and the current distribution of erase cells do not overlap with each other, even if the cell currents are varied or even if the current values are changed due to time variations.

Twenty-First Embodiment

Figure 44:
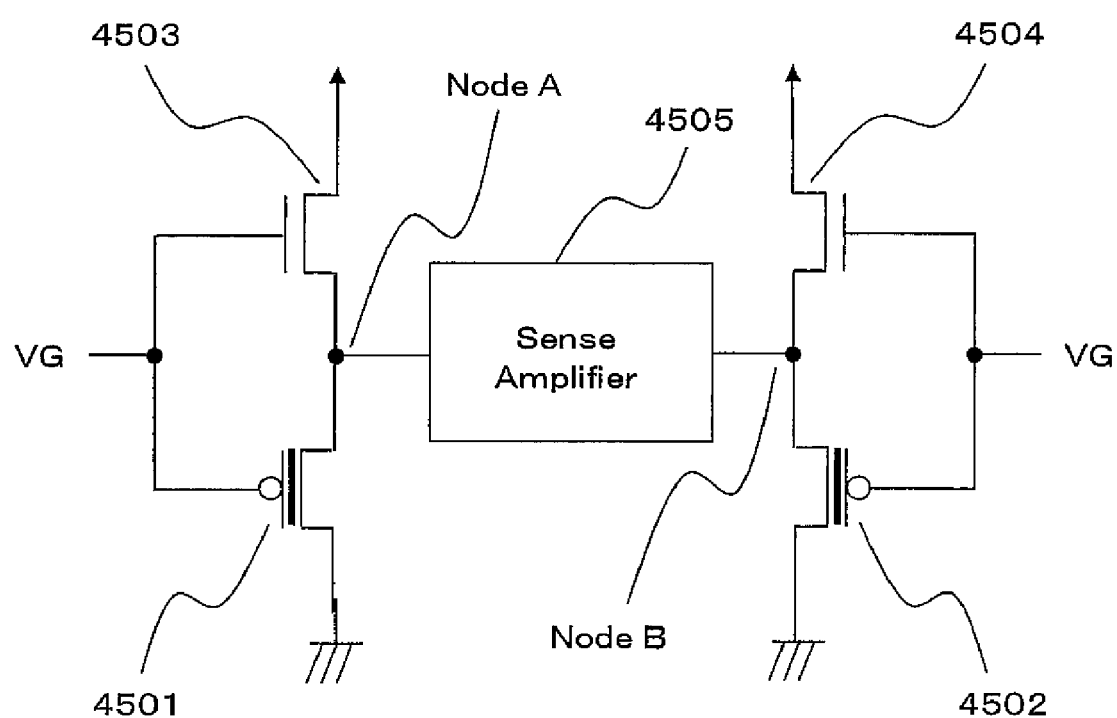
FIG. 44 shows a semiconductor storage device according to a twenty-first embodiment of the invention.

FIG. 44 shows a semiconductor storage device according to a twenty-first embodiment of the invention. First and second memory cells 4501, 4502 are used in this semiconductor storage device.

In this semiconductor storage device, as shown in FIG. 44, a first memory cell 4501, as a first memory section, is connected in series with a first transistor 4503. A node "A" which is a connecting point between the first memory cell 4501 and the first transistor 4503 is connected to one input of a sense amplifier 4505. A second memory cell 4502, as a second memory section, is connected in series with a second transistor 4504. A node "B" which is a connecting point between the second memory cell 4502 and the second transistor 4504 is connected to the other input of the sense amplifier 4505. The other ends of the first and second memory cells 4501, 4502 are connected to a ground as first power supply. The other ends of the first, second transistors 4503, 4504 are connected to power supply as second power supply. In the semiconductor storage device of this twenty-first embodiment, 1-bit information is to be stored in these two memory cells 4501, 4502.

As with the nineteenth embodiment, a state in which a large cell current flows through the first, second memory cells 4501, 4502 is defined as the erase state, which will be referred to as "erase cell". A state in which only a small current flows therethrough is defined as the write state, which will be referred to as "write cell".

To store 1 bit in the construction of the semiconductor storage device of FIG. 44, for example, the first memory cell 4501 is set to a write cell, and the second memory cell 4502 is set to an erase cell, which is defined as data "0". The first memory cell 4501 is set to an erase cell, and the second memory cell 4502 is set to a write cell, which is defined as data "1". However, the definition of data "0" or "1" is not necessarily limited to the above.

As with the nineteenth embodiment, the sense amplifier 4505 determines data of memory cells on the basis of the positiveness or negativeness of a potential difference ΔV between node A and node B. In the case of data "1", the potential difference ΔV is expressed by the same equation as the case of the twentieth embodiment as follows:

$$\Delta V = (\text{voltage of node } B) - (\text{voltage of node } A) \quad (35)$$
$$= Vd \cdot [Ie - Ip] \cdot It / [(It + Ie) \cdot (It + Ip)]$$

where Vd is a supply voltage, Ie is an erase cell current of the first memory cell 4501, Ip is a write cell current of the first transistor 4503, and It is a current of the first, second transistors.

The memory cell currents Ie, Ip actually vary from memory cell to memory cell. In the worst case, therefore, a minimum value ΔV(min) of the potential difference is expressed as follows:

$$\Delta V(\min) = Vd \cdot [Ie(\min) - Ip(\max)] \cdot It / [(It + Ie(\min)) \cdot (It + Ip(\max))] \quad (36)$$

where Ie(min) is a minimum value of Ie, and Ip(max) is a maximum value of Ip. The following inequality relationship maintains as far as a current distribution of the write cells and a current distribution of the erase cells do not overlap with each other, even if the cell currents are varied or even if the current values are changed due to time variations.

$$Ie(\min) > Ip(\max),$$

Therefore, the positiveness or negativeness of ΔV(min) remains unchanged. Thus, on condition that sensitivity of sense amplifier>ΔV(min), then memory cell data can be correctly read out. In the way adopting commonly used reference values, on the other hand, the positiveness or negativeness of ΔV is inverted when the cell currents are varied or when the current values are changed due to time variations, even if the current distribution of the write cells does not overlap with the current distribution of the erase cells. This causes erroneous data to be read out. The present invention prevents such erroneous cases from occurring.

According to the semiconductor storage device of the twenty-first embodiment, the first memory cell 4501 which is the first memory section is connected in series with the first transistor 4503, to form a pair thereof. Also, the second memory cell 4502 which is the second memory section is connected in series with the second transistor 4504, to form a pair thereof. In using these pairs, one of the first and second memory cells 4501, 4502 is assigned as a write cell while the other is assigned as an erase cell, so that 1-bit data can be stored there. Thus, as compared with the conventional techniques where data is read out by comparison of information stored in one memory cell with the reference value, it is possible to more correctly read out data of memory cells as far as the current distribution of write cells and the current distribution of erase cells do not overlap with each other, even if the cell currents are varied or even if the current values are changed due to time variations.

In this twenty-first embodiment, only two memory cells are used. Therefore, erase or write operations in the memory cells can be reduced, compared with the nineteenth embodiment using four memory cells.

In the above description, each of the memory cells is formed by one memory cell. However, each of those memory cells may be formed by a memory cell group as shown in FIGS. 45 to 49. These memory cell groups are used so as to be all written or all erased. Consequently, variation per memory cell can be reduced by half or so. Reduction by half in variation can generate a very effective result. For example, in the case of a normal distribution on failure, a failure rate of 1% for one memory cell can be reduced to a failure rate of 0.0001% for one memory cell group.

Figure 45:
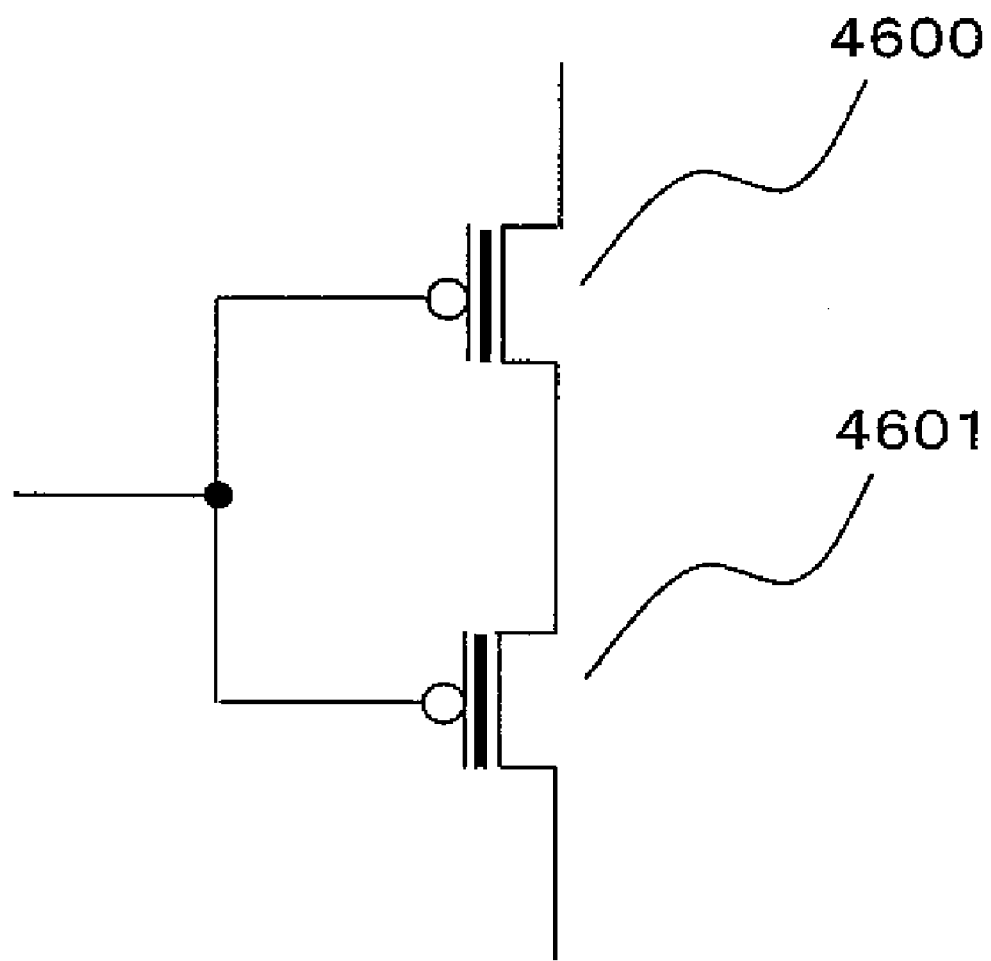
FIG. 45 shows an example of the memory cells in the nineteenth to twenty-first embodiments of the invention.

For the memory section of the semiconductor storage device of this invention, it is acceptable to use a memory cell group in which two memory cells 4600, 4601 are connected in series while gates of the memory cells 4600, 4601 are connected in common, as shown in FIG. 45.

By the series construction shown in FIG. 45, variations can be reduced about by half in the write state where only a small current flows through the memory cells.

Figure 46:
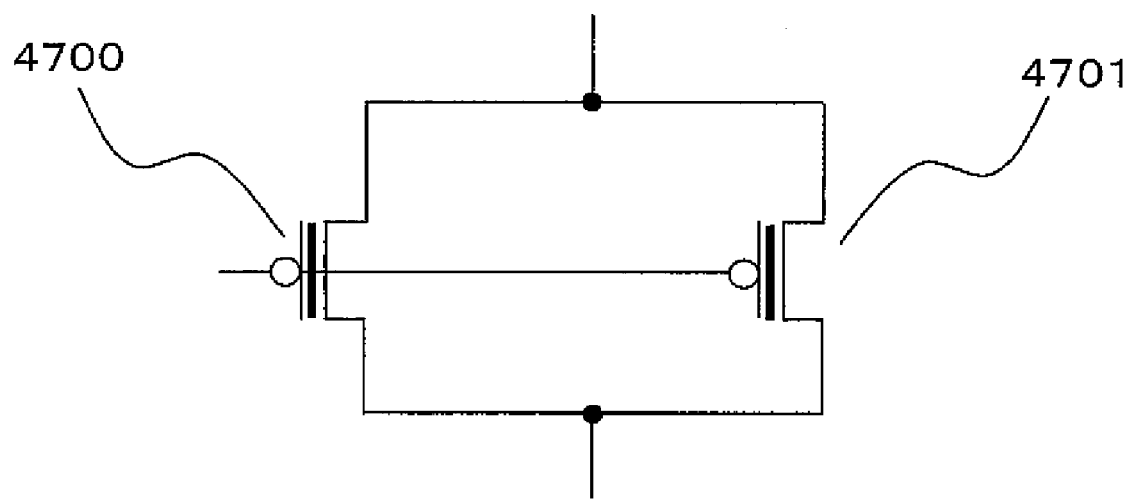
FIG. 46 shows another example of the memory cells used in the nineteenth to twenty-first embodiments of the invention.

Also, for the memory section of the semiconductor storage device of this invention, it is acceptable to use a memory cell group in which two memory cells 4700, 4701 are connected in parallel while gates of the memory cells 4700, 4701 are connected in common, as shown in FIG. 46.

By the parallel construction shown in FIG. 46, variations can be reduced about by half in the erase state where a large current flows through the memory cells.

Figure 47:
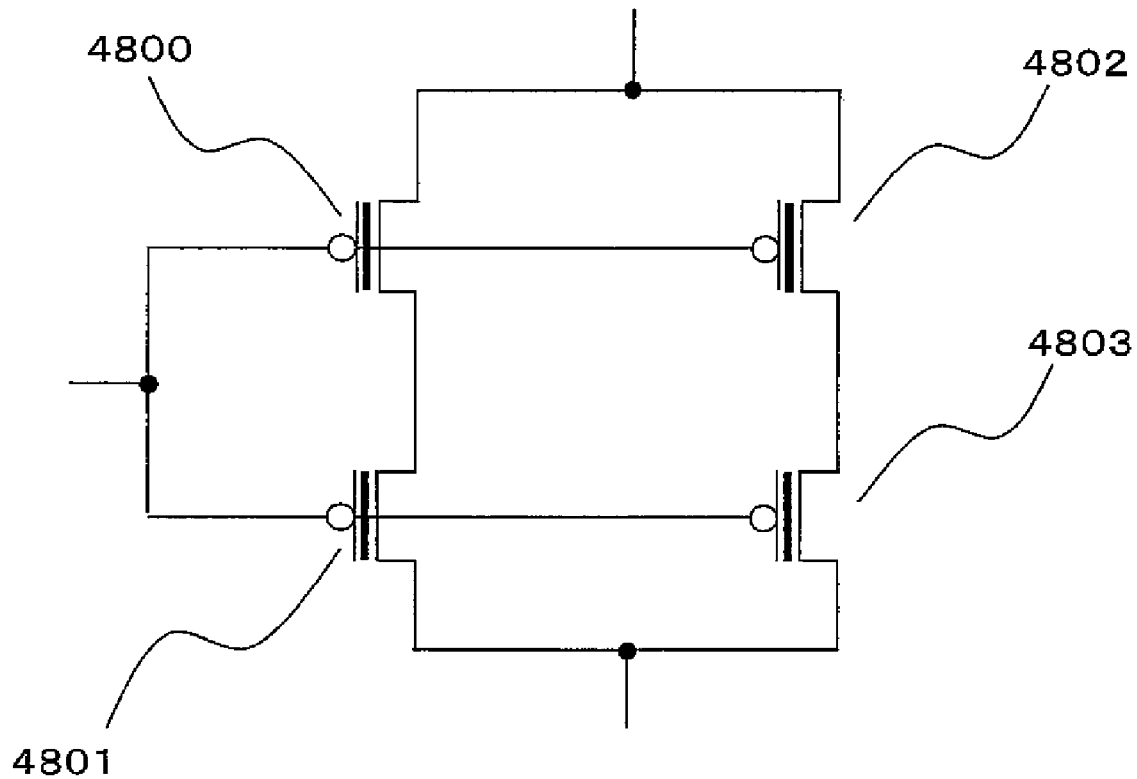
FIG. 47 shows another example of the memory cells in the nineteenth to twenty-first embodiments of the invention.

Further, for the memory section of the semiconductor storage device of this invention, it is acceptable to use a memory cell group in which a memory cell column is formed by two memory cells 4800, 4801 connected in series and another memory cell column is formed by two memory cells 4802, 4803 connected in series, and these memory cell columns are connected in parallel while gates of the memory cells 4800 to 4803 are connected in common, as shown in FIG. 47. Instead, the construction shown in FIG. 48 may be used. The memory cell group shown in FIG. 48, which has four memory cells 4900 to 4903, is substantially the same as the memory cell group shown in FIG. 47 except for intermediate nodes of the memory cell columns connected to each other. Also, the construction shown in FIG. 49 may also be used. The memory cell group shown in FIG. 49, which has four memory cells 41000 to 41003 and intermediate nodes of the memory cell columns, is substantially the same as the memory cell group shown in FIG. 47 except for a memory cell 41004 through which the intermediate nodes are connected to each other, and the gate of which is connected to the gates of the other memory cells 41000 to 41003.

Figure 48:
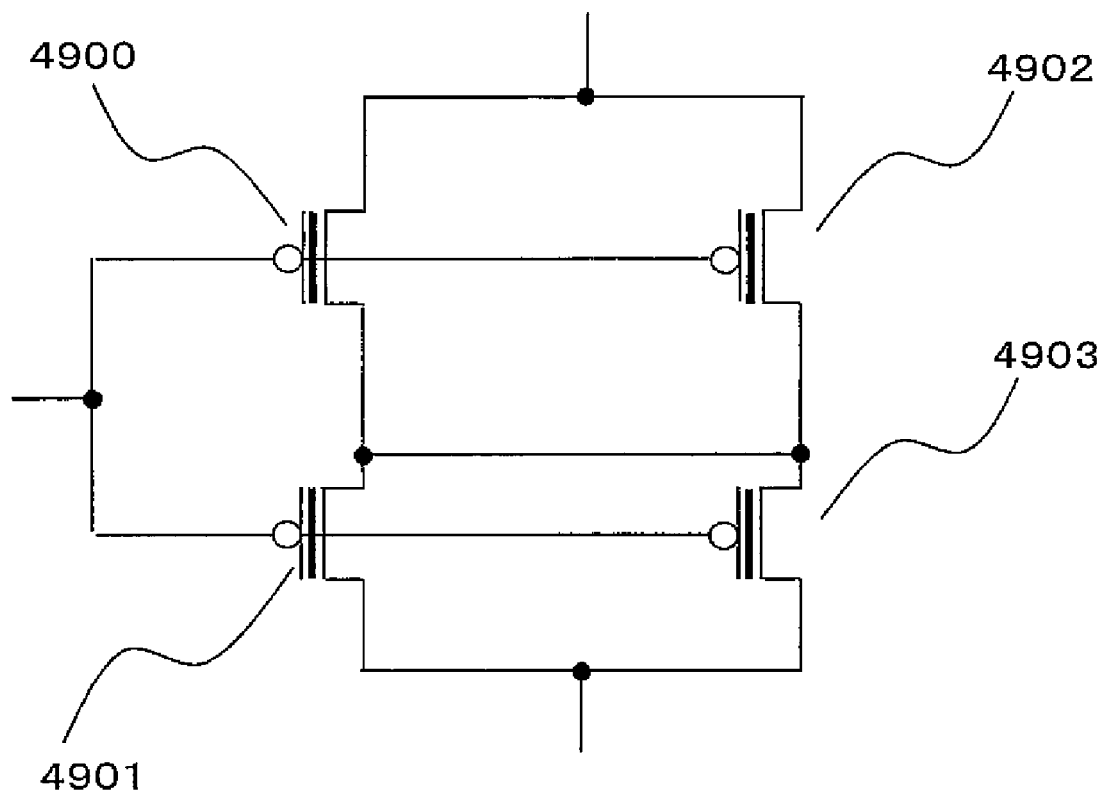
FIG. 48 shows another example of the memory cells in the nineteenth to twenty-first embodiments of the invention.
Figure 49:
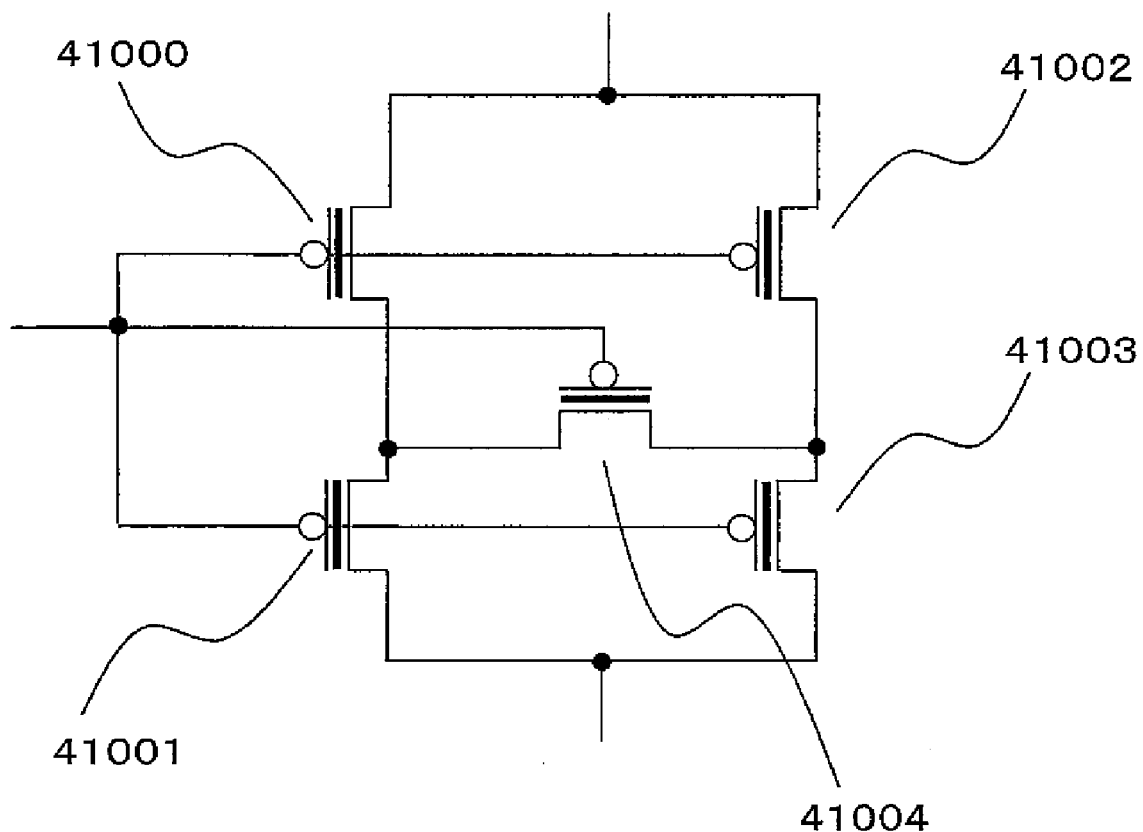
FIG. 49 shows another example of the memory cells in the nineteenth to twenty-first embodiments of the invention.

The semiconductor storage devices shown in FIGS. 47 to 49 allow variations to be reduced by half in both of the write state in which only a small current flows through the memory cells and the erase state in which a large current flows through the memory cells.

As shown above, the variation half-reduction effect is obtained for data "1" in the device of FIG. 45, for data "0" in the device of FIG. 46, and for both data "0" and data "1" in the devices of FIGS. 47 to 49 (the failure rate can be reduced from 1% to 0.0001% in the case of normal distribution). Therefore, readout margin in data of the memory cells can be increased.

In the semiconductor storage devices of FIGS. 45 and 46, two memory cells are connected in series or in parallel. However, three or more memory cell may be connected in series or in parallel. In the semiconductor storage devices of FIGS. 47 to 49, two memory cell columns, each of which has two memory cells connected in series, are connected in parallel. However, two or more memory cell columns, each of which has two or more memory cells connected in series, may be connected in parallel, wherein the number of memory cells in the memory cell columns may differ from each other.

In the case where there are a plurality of connecting points between intermediate nodes of the memory cell columns, at least one pair of connecting points may be connected via a memory cell or an interconnect line for connecting the intermediate nodes, like the semiconductor storage device of FIG. 48 or 49. In the case where two or more pairs of the connecting points are connected, at least one pair may be connected via a memory cell for connecting the intermediate nodes, while the other pairs may be connected by interconnect lines for connecting the intermediate nodes.

Twenty-Second Embodiment

Figure 50:
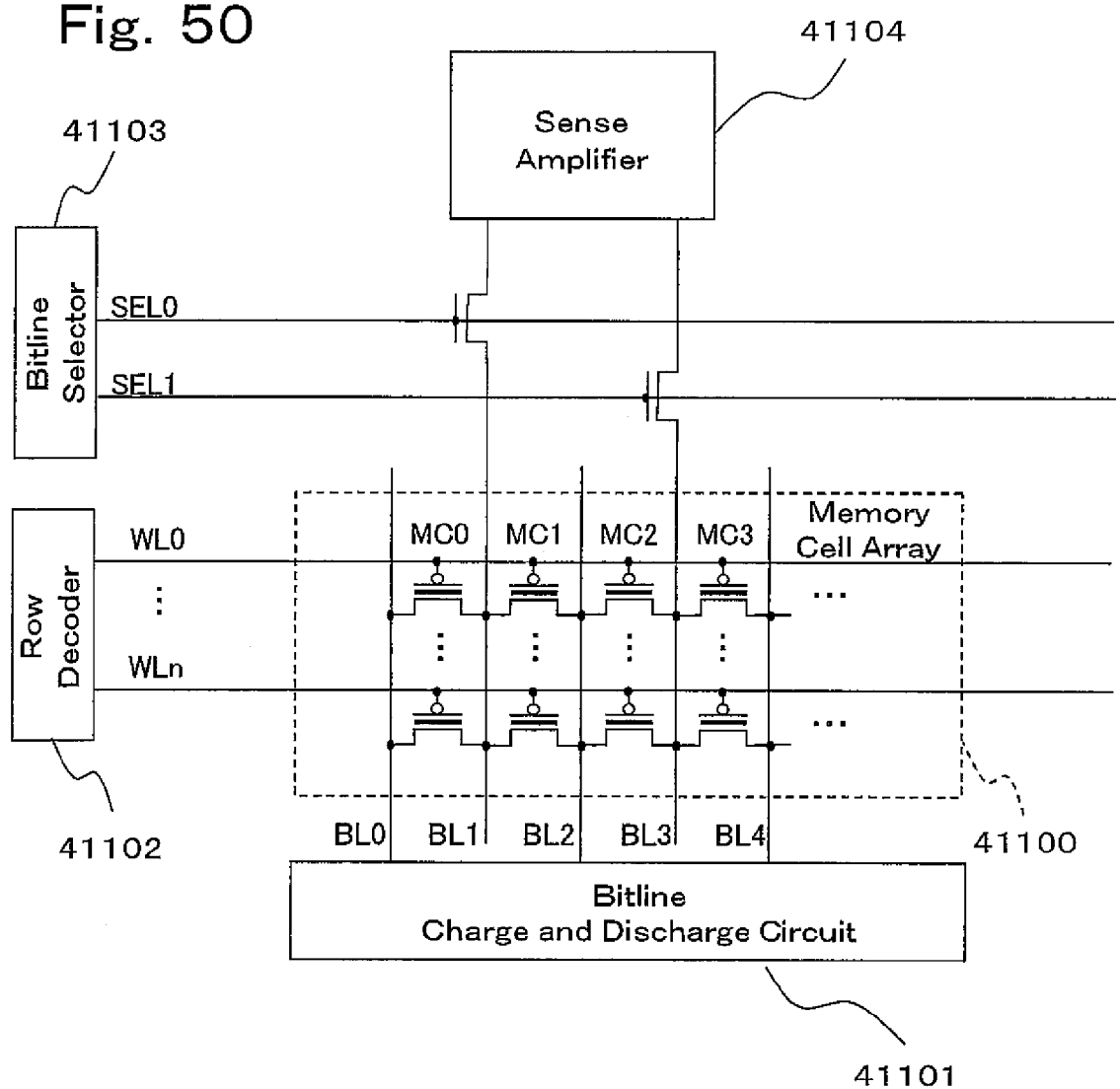
FIG. 50 shows a semiconductor storage device according to a twenty-second embodiment of the invention.

FIG. 50 shows a semiconductor storage device according to a twenty-second embodiment of the invention. In FIG. 50, a technique for enlarging capacity of the device is shown, where the memory cells of the nineteenth embodiment shown in FIG. 40 for example are arranged in a matrix form. The semiconductor storage device includes a memory cell array 41100 in which memory cells MC0, MC1, . . . are arranged in a matrix form. Word lines WL0 to WLn extend in the row direction of the memory cell array 41100. Each of the word lines WL0 to WLn is connected with control gates of memory cells arrayed in the same row. Bit lines BL0, BL1, BL2, BL3, . . . extend in the column direction of the memory cell array 41100. Each of the bit lines is connected with input terminals of the memory cells arrayed in the same row and output terminals thereof, that is to say, sources of the memory cells arrayed in the same row and drains thereof. The word line WL0 to WLn are connected to a row decoder 41102 for selecting arbitrary wire lines. The bit lines BL0, BL1, BL2, BL3, . . . are connected to a later-described sense amplifier 41104 via transistors. The transistors are selected by outputs SEL0, SELL of a bitline selector 41103.

Explanation is given to a case of reading out 1-bit data stored in the memory cells MC0 to MC3 connected to the word line WL0. The memory cells MC0, MC1, MC2, MC3 correspond to the memory cells 4101, 4103, 4104, 4102 shown in FIG. 40, respectively.

First, the word line WL0 is started up. Subsequently, the outputs SEL0 and SELL of the bitline selector 41103 are started up. As a result, the bit lines BL0 and BL1 are connected to the sense amplifier 41104. Subsequently, by using a bitline charge and discharge circuit 41101, the bit line BL2 is connected to the ground, and the bit lines BL0, BL4 are connected to the power supply. As a result, a voltage of the bit line BL1 (corresponding to the node A of FIG. 1) and a voltage of the bit line BL3 (corresponding to the node B of FIG. 40) are determined by cell currents of the memory cells MC0 to MC3, so that a potential difference $\Delta V$ is generated between the bit line BL1 and the bit line BL3. Thereafter, the sense amplifier 41104 is put into operation. Thereby, the positiveness or negativeness of the potential difference $\Delta V$ is determined, and data is outputted.

In the twenty-second embodiment, an array structure corresponding to FIG. 40 is adopted. However, other array structures corresponding to the semiconductor storage devices shown in FIGS. 43 and 44 may also be adopted.

Twenty-Third Embodiment

Figure 51:
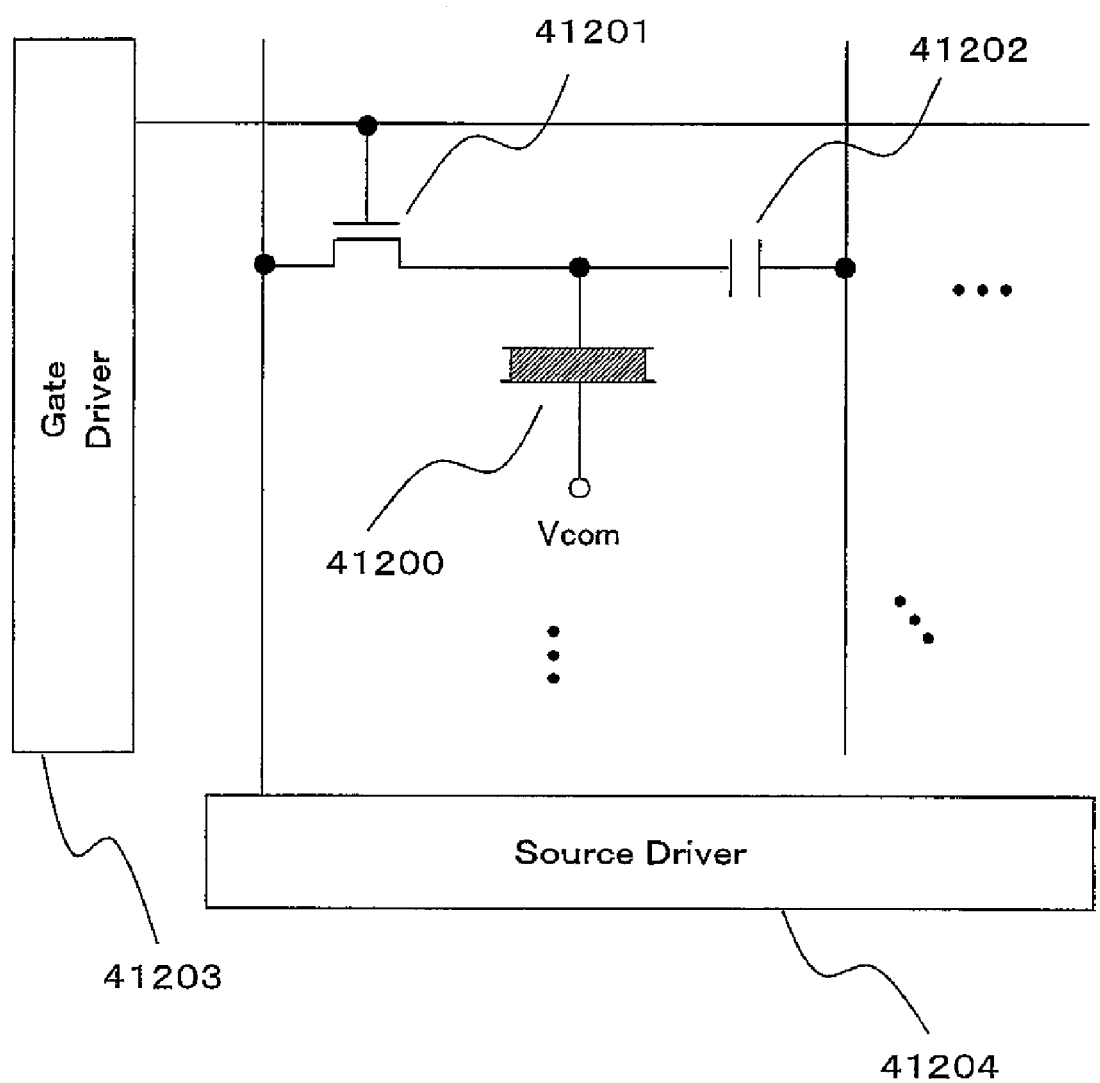
FIG. 51 shows a block diagram of a liquid crystal panel served as electronic equipment according to a twenty-third embodiment of the invention.
Figure 52:
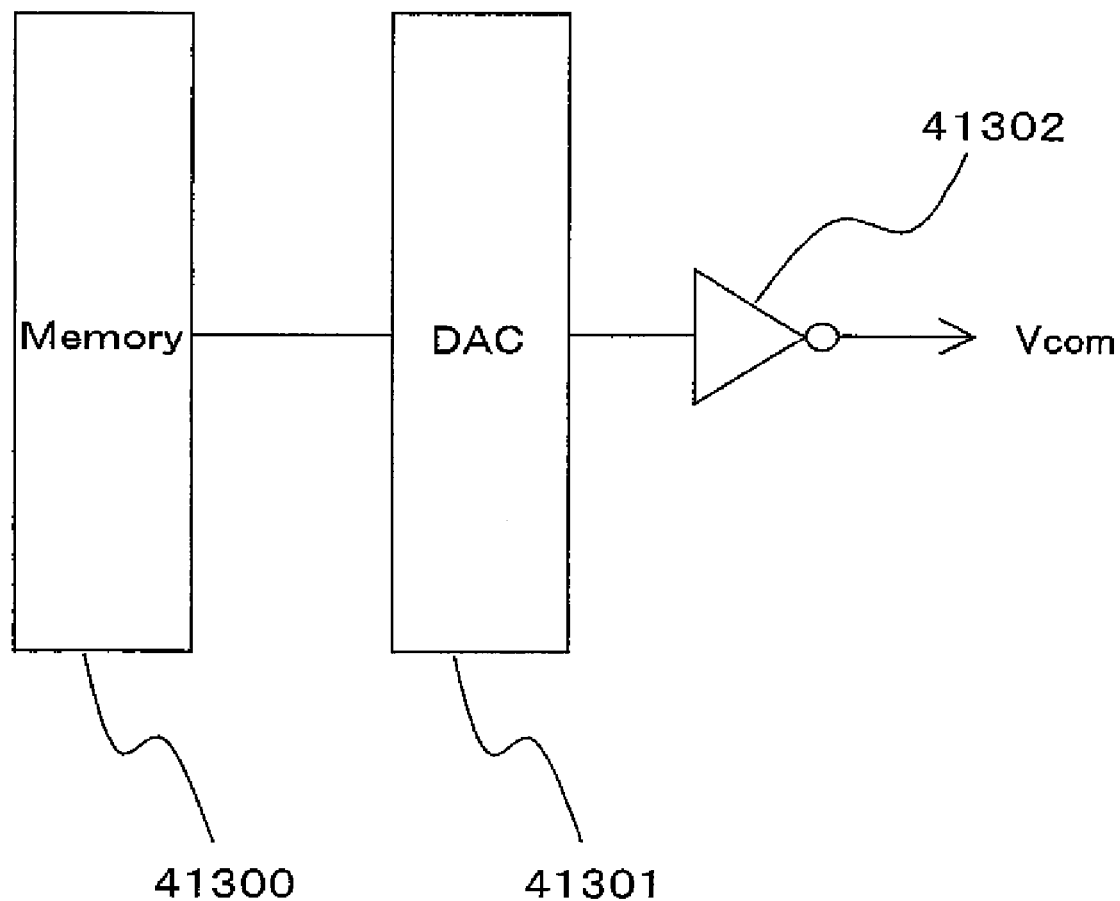
FIG. 52 shows a block diagram of a Vcom voltage generator section used in the liquid crystal panel.

FIGS. 51 and 52 show block diagrams of a liquid crystal panel served as electronic equipment according to a twenty-third embodiment of the invention. This liquid crystal panel has any one of the semiconductor storage devices of the nineteenth to twenty-first embodiments as nonvolatile memory, in which digital data for Vcom adjustment are stored.

In the liquid crystal panel, as shown in FIG. 51, a liquid-crystal pixel 41200, a TFT (Thin Film Transistor) 41201, and an additional capacitance 41202 are arranged in an array form. The liquid crystal panel device also has a gate driver 41203 for driving the gate of the TFT 41201, and a source driver 41204 connected to the source of the TFT 41201. When the TFT 41201 is selected to turn on by the gate driver 41203, data from the source driver 41204 is temporarily stored in the additional capacitance 41202 via the TFT 41201. Data of a high voltage VH is given in a first half (positive field) of 1 frame, and data of a low voltage VL is given in a second half (negative field) of 1 frame in order to prevent deterioration of the liquid crystal pixel 41200. A voltage of (VH+VL)/2, as a reference voltage, is given to the common potential Vcom so as to prevent screen flicker. However, there are manufacturing variations in, for example, the parasitic capacitance between gate and source of the TFT. Thus, the common potential Vcom needs to be set in each of liquid crystal panels.

By using the Vcom voltage generator section, an adjustment value is stored in a memory section 41300. Then, as shown in FIG. 52, the adjustment value is outputted as the common potential Vcom via a D/A converter (digital/analog converter) 41301 and a Vcom driver 41302. The memory section 41300 is required to retain the Vcom adjustment value for a long period and therefore needs to have high-grade reliability.

The nonvolatile memory of this twenty-third embodiment can accurately read out information of the memory cells even if the respective memory cells have large variations in characteristics and even if the respective memory cells are changed in characteristics after the shipping of products, because of adoption of such a technique as to store 1-bit data in the pair of a write cell and an erase cell. Thus, it is possible to obtain high reliability in the electronic equipment having the semiconductor storage device according to this invention.

The electronic equipment can be applied to any types of electronic equipment including digital cameras, portable telephones, digital audio recorders and music recording/reproducing equipment and so on, without being limited to liquid crystal panels.

Specific embodiments of the invention have been described hereinabove. However, the invention is not limited to the above-described embodiments, and may be changed and carried out in various ways without departing the scope of this invention.

What is claimed is:

1. A semiconductor storage device comprising:
  an integer number n (n>1) of memory cells connected in series to form a memory cell column;
  an integer number m (m>1) of memory cell columns that each have the integer number n (n>1) of series connected memory cells, the integer number m (m>1) of memory cell columns being connected in parallel to form a memory cell group, wherein
  1-bit information is to be stored in the memory cell group; and
  a readout arrangement configured to read out the 1-bit information stored in the memory cell group, the readout arrangement including:
    a transistor having input/output terminals, one of which is connected to one end of the memory cell group, wherein an other end of the memory cell group is connected to a first power supply, and
an other end of the transistor is connected to a second power supply.

2. The semiconductor storage device as set forth in claim 1, wherein
said memory cell group comprises a first memory cell group and a second memory cell group;
said transistor comprises a first transistor having input/output terminals, one of which is connected to one end of the first memory cell group, and a second transistor having input/output terminals, one of which is connected to one end of the second memory cell group,
an other end of the first memory cell group and an other end of the second memory cell group are connected to the first power supply,
an other end of the first transistor and an other end of the second transistor are connected to the second power supply,
one end of the first transistor is connected to gates of respective memory cells of the second memory cell group and to a gate of the second transistor, and
one end of the second transistor is connected to gates of respective memory cells of the first memory cell group and to a gate of the first transistor.

3. Electronic equipment comprising the semiconductor storage device as set forth in claim 1.

4. A semiconductor storage device comprising:
an integer number m (m>1) of memory cells connected in parallel to form a memory cell column; and
an integer number n (n>1) of memory cell columns that each have the integer number m (m>1) of parallel connected memory cells, the integer number n (n>1) of memory cell columns being connected in series to form a memory cell group, wherein
1-bit information is to be stored in the memory cell group.

5. The semiconductor storage device as set forth in claim 4, further comprising:
a readout arrangement configured to read out the 1-bit information stored in the memory cell group, the readout arrangement including:
a transistor having input/output terminals, one of which is connected to one end of the memory cell group, wherein
an other end of the memory cell group is connected to a first power supply, and
an other end of the transistor is connected to a second power supply.

6. The semiconductor storage device as set forth in claim 4, wherein said memory cell group comprises a first memory cell group and a second memory cell group, and the semiconductor storage device further comprises a readout arrangement configured to read out the 1-bit information stored in each memory cell group, the readout arrangement including:
a first transistor having input/output terminals, one of which is connected to one end of the first memory cell group; and
a second transistor having input/output terminals, one of which is connected to one end of the second memory cell group, wherein
an other end of the first memory cell group and an other end of the second memory cell group are connected to a first power supply,
an other end of the first transistor and an other end of the second transistor are connected to a second power supply,
one end of the first transistor is connected to gates of respective memory cells of the second memory cell group and to a gate of the second transistor, and
one end of the second transistor is connected to gates of respective memory cells of the first memory cell group and to a gate of the first transistor.

7. The semiconductor storage device as set forth in claim 4, further comprising:
a transistor having input/output terminals, one of which is connected to one end of the memory cell group; and
an inverter having an input terminal connected to one end of the memory cell group, wherein
an other end of the memory cell group is connected to a first power supply,
an other end of the transistor is connected to a second power supply, and
an output terminal of the inverter is connected to a gate of the transistor.

8. The semiconductor storage device as set forth in claim 4, wherein the memory cell group comprises a first memory cell group and a second memory cell group, the semiconductor storage device further comprising:
a first inverter and a second inverter which have output-ends and input-ends connected to form a latch circuit, wherein
one end of the first memory cell group and one end of the second memory cell group are connected to a first power supply,
an other end of the first memory cell group is connected to an input end of the first inverter, and
an other end of the second memory cell group is connected to an input end of the second inverter.

9. The semiconductor storage device as set forth in claim 4, wherein said memory cell group comprises a first memory cell group and a second memory cell group which are associated to store the 1-bit information, and the semiconductor storage device further comprises:
a readout arrangement configured to read out the 1-bit information stored in the first and second memory cell groups, wherein
one end of the first memory cell group is connected to a first power supply,
one end of the second memory cell group is connected to a second power supply different from the first power supply, and
an other end of the first memory cell group and an other end of the second memory cell group are connected to each other to output the 1-bit information.

10. Electronic equipment comprising the semiconductor storage device as set forth in claim 4.

11. A semiconductor storage device comprising:
an integer number n (n>1) of memory cells connected in series to form a memory cell column;
an integer number m (m>1) of memory cell columns connected in parallel to form a memory cell group;
a transistor having input/output terminals, one of which is connected to one end of the memory cell group; and
an inverter having an input terminal connected to one end of the memory cell group, wherein
an other end of the memory cell group is connected to a first power supply,
an other end of the transistor is connected to a second power supply, and
an output terminal of the inverter is connected to a gate of the transistor, wherein
1-bit information is to be stored in the memory cell group.

12. A semiconductor storage device comprising:
an integer number n (n>1) of memory cells connected in series to form a memory cell column;
an integer number m (m>1) of memory cell columns connected in parallel to form a memory cell group;
said memory cell group comprising a first memory cell group and a second memory cell group;
a first inverter and a second inverter which have output-ends and input-ends connected to form a latch circuit, wherein
one end of the first memory cell group and one end of the second memory cell group are connected to a first power supply,
an other end of the first memory cell group is connected to an input end of the first inverter, and
an other end of the second memory cell group is connected to an input end of the second inverter, wherein 1-bit information is to be stored in the memory cell group.

13. A semiconductor storage device comprising:
a first memory cell group in which an integer number n (n>1) of memory cells are connected in series to form a memory cell column array and an integer number m (m>1) of memory cell columns that each have the integer number n (n>1) of series connected memory cells are connected in parallel; and
a second memory cell group in which an integer number n (n>1) of memory cells are connected in series to form a memory cell column array and an integer number m (m>1) of memory cell columns that each have the integer number n (n>1) of series connected memory cells are connected in parallel,
said first and second memory cell groups are associated to store 1-bit information; and
a readout arrangement configured to read out the 1-bit information stored in said first and second memory cell groups, wherein
one end of the first memory cell group is connected to a first power supply,
one end of the second memory cell group is connected to a second power supply different from the first power supply, and
an other end of the first memory cell group and an other end of the second memory cell group are connected to each other to output the 1-bit information.

14. A semiconductor storage device comprising:
an integer number n (n>1) of memory cells connected in series to form a memory cell column;
an integer number m (m>1) of memory cell columns connected in parallel; and
other memory cells connecting intermediate nodes each formed between neighboring memory cells located at a same position measured from one end of the memory cell column in respectively neighboring memory cell columns, wherein
a memory cell group is formed by all of the memory cells.

15. The semiconductor storage device as set forth in claim 14, wherein
each of n and m is an integer two,
two memory cells are respectively connected in series to form a first memory cell column and a second memory cell column,
the first memory cell column and the second memory cell column are connected in parallel,
an intermediate node in the first memory cell column and an intermediate node in the second memory cell column are connected via an other memory cell, and
the memory cell group is formed by all of the memory cells.

16. The semiconductor storage device as set forth in claim 14, wherein
each of n and m is an integer three,
three memory cells are respectfully connected in series to form a first memory cell column, a second memory cell column and a third memory cell column,
the first memory cell column, the second memory cell column and the third memory cell column are connected in parallel sequentially,
the other memory cells connect:
between a first intermediate node located at a first position in the first memory cell column and a first intermediate node located at the first position in the second memory cell column,
between a second intermediate node located at a second position in the first memory cell column and a second intermediate node located at the second position in the second memory cell column,
between the first intermediate node located at the first position in the second memory cell column and a first intermediate node located at a first position in the third memory cell column, and
between the second intermediate node located at the second position of the second memory cell column and a second intermediate node located at a second position of the third memory cell column, and
a memory cell group is formed by all of the memory cells.

17. The semiconductor storage device as set forth in claim 14, further comprising:
a transistor having input/output terminals, one of which is connected to one end of the memory cell group; and
an inverter having an input terminal connected to one end of the memory cell group, wherein
an other end of the memory cell group is connected to a first power supply,
an other end of the transistor is connected to a second power supply, and
an output terminal of the inverter is connected to a control gate of the transistor.

18. Electronic equipment comprising the semiconductor storage device as set forth in claim 14.

* * * * *